United States Patent
Sandhu

(10) Patent No.: US 10,515,801 B2
(45) Date of Patent: *Dec. 24, 2019

(54) PITCH MULTIPLICATION USING SELF-ASSEMBLING MATERIALS

(75) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 333 days.

This patent is subject to a terminal disclaimer.

(21) Appl. No.: 12/908,206

(22) Filed: Oct. 20, 2010

(65) Prior Publication Data

US 2011/0033786 A1 Feb. 10, 2011

Related U.S. Application Data

(63) Continuation of application No. 11/757,846, filed on Jun. 4, 2007, now Pat. No. 7,923,373.

(51) Int. Cl.
*H01L 21/033* (2006.01)
*H01L 21/308* (2006.01)
(Continued)

(52) U.S. Cl.
CPC ...... *H01L 21/0337* (2013.01); *H01L 21/0332* (2013.01); *H01L 21/0338* (2013.01);
(Continued)

(58) Field of Classification Search
CPC ............. H01L 21/0337; H01L 21/0338; H01L 21/3081; H01L 21/3088; H01L 21/32139;
(Continued)

(56) References Cited

U.S. PATENT DOCUMENTS 3,731,287 A 5/1973 Seely et al.
3,732,287 A 5/1973 Himmele et al.
(Continued)

FOREIGN PATENT DOCUMENTS

CN 1450647 10/2003
CN 1518771 8/2004
(Continued)

OTHER PUBLICATIONS

Black et al, Nanometer-Scale Pattern Registration and Alignment by Directed Diblock Copolymer Self-Assembly, Sep. 2004, IEEE Transactions on Nanotechnology, vol. 3, No. 3, pp. 412-415.*
(Continued)

*Primary Examiner* — Monique R Jackson
(74) *Attorney, Agent, or Firm* — Wells St. John P.S.

(57) ABSTRACT

Self-assembling materials, such as block copolymers, are used as mandrels for pitch multiplication. The copolymers are deposited over a substrate and directed to self-assemble into a desired pattern. One of the blocks forming the block copolymers is selectively removed. The remaining blocks are used as mandrels for pitch multiplication. Spacer material is blanket deposited over the blocks. The spacer material is subjected to a spacer etch to form spacers on sidewalls of the mandrels. The mandrels are selectively removed to leave free-standing spacers. The spacers may be used as pitch-multiplied mask features to define a pattern in an underlying substrate.

12 Claims, 12 Drawing Sheets

(51) Int. Cl.
*H01L 21/311* (2006.01)
*H01L 21/3213* (2006.01)

(52) U.S. Cl.
CPC ...... *H01L 21/3081* (2013.01); *H01L 21/3086* (2013.01); *H01L 21/3088* (2013.01); *H01L 21/31116* (2013.01); *H01L 21/31144* (2013.01); *H01L 21/32139* (2013.01); *Y10S 438/947* (2013.01); *Y10S 438/95* (2013.01)

(58) Field of Classification Search
CPC ............. H01L 21/0332; H01L 21/3086; H01L 21/31116; H01L 21/31144; Y10S 438/95; Y10S 438/947
See application file for complete search history.

(56) References Cited

U.S. PATENT DOCUMENTS

| | | |
|---|---|---|
| 3,941,629 A | 3/1976 | Jaffe |
| 4,139,442 A | 2/1979 | Bondur et al. |
| 4,234,362 A | 11/1980 | Riseman |
| 4,333,964 A | 6/1982 | Ghezzo |
| 4,419,809 A | 12/1983 | Riseman et al. |
| 4,422,885 A | 12/1983 | Browe et al. |
| 4,432,132 A | 2/1984 | Kinsbron et al. |
| 4,455,740 A | 6/1984 | Iwai |
| 4,472,459 A | 9/1984 | Fisher |
| 4,502,914 A | 3/1985 | Trumpp et al. |
| 4,508,579 A | 4/1985 | Goth et al. |
| 4,508,757 A | 4/1985 | Fabricius et al. |
| 4,517,729 A | 5/1985 | Batra |
| 4,523,213 A | 6/1985 | Konaka et al. |
| 4,530,149 A | 7/1985 | Jastrzebski et al. |
| 4,549,927 A | 10/1985 | Goth et al. |
| 4,551,910 A | 11/1985 | Patterson |
| 4,569,032 A | 2/1986 | Lee |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |
| 4,675,984 A | 6/1987 | Hsu |
| 4,716,131 A | 12/1987 | Okazawa et al. |
| 4,722,910 A | 2/1988 | Yasaitis |
| 4,746,630 A | 5/1988 | Hui et al. |
| 4,757,026 A | 7/1988 | Woo et al. |
| 4,776,922 A | 10/1988 | Bhattascharyya et al. |
| 4,789,560 A | 12/1988 | Yan |
| 4,803,181 A | 2/1989 | Buchmann et al. |
| 4,818,714 A | 4/1989 | Haskell |
| 4,829,018 A | 5/1989 | Wahlstrom |
| 4,835,741 A | 5/1989 | Baglee |
| 4,838,991 A | 6/1989 | Cote et al. |
| 4,849,371 A | 7/1989 | Hansen et al. |
| 4,871,688 A | 10/1989 | Lowrey |
| 4,903,344 A | 2/1990 | Inoue |
| 4,920,389 A | 4/1990 | Itoh |
| 4,922,460 A | 5/1990 | Furutani et al. |
| 4,924,279 A | 5/1990 | Shimbo |
| 4,931,409 A | 6/1990 | Nakajima et al. |
| 4,937,641 A | 6/1990 | Sunami et al. |
| 4,939,100 A | 7/1990 | Jeuch et al. |
| 4,939,793 A | 7/1990 | Stewart |
| 4,959,325 A | 9/1990 | Lee et al. |
| 4,965,221 A | 10/1990 | Dennison et al. |
| 4,972,244 A | 11/1990 | Buffet et al. |
| 4,979,004 A | 12/1990 | Esquivel et al. |
| 4,983,544 A | 1/1991 | Lu et al. |
| 4,984,039 A | 1/1991 | Douglas |
| 4,992,838 A | 2/1991 | Mori |
| 5,001,526 A | 3/1991 | Gotou |
| 5,012,309 A | 4/1991 | Nakayama |
| 5,013,680 A | 5/1991 | Lowrey et al. |
| 5,014,110 A | 5/1991 | Satoh |
| 5,015,595 A | 5/1991 | Wollesen |
| 5,021,355 A | 6/1991 | Dhong et al. |
| 5,024,959 A | 8/1991 | Pfiester |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,057,888 A | 10/1991 | Fazan et al. |
| 5,064,683 A | 11/1991 | Poon et al. |
| 5,071,782 A | 12/1991 | Mori |
| 5,087,586 A | 2/1992 | Chan et al. |
| 5,107,459 A | 4/1992 | Chu et al. |
| 5,108,938 A | 4/1992 | Solomon |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,160,491 A | 11/1992 | Mori |
| 5,177,027 A | 1/1993 | Lowrey et al. |
| 5,181,089 A | 1/1993 | Matsuo et al. |
| 5,210,046 A | 5/1993 | Crotti |
| 5,236,860 A | 8/1993 | Fazan et al. |
| 5,244,824 A | 9/1993 | Sivan |
| 5,250,450 A | 10/1993 | Lee et al. |
| 5,252,504 A | 10/1993 | Lowrey et al. |
| 5,252,517 A | 10/1993 | Blalock et al. |
| 5,252,845 A | 10/1993 | Kim et al. |
| 5,254,218 A | 10/1993 | Roberts et al. |
| 5,260,229 A | 11/1993 | Hodges et al. |
| 5,278,438 A | 1/1994 | Kim et al. |
| 5,281,548 A | 1/1994 | Prall |
| 5,295,092 A | 3/1994 | Hotta |
| 5,296,401 A | 3/1994 | Mitsui et al. |
| 5,302,541 A | 4/1994 | Akazawa |
| 5,305,252 A | 4/1994 | Takanori |
| 5,308,782 A | 5/1994 | Mazure et al. |
| 5,308,785 A | 5/1994 | Comfort et al. |
| 5,312,782 A | 5/1994 | Miyazawa |
| 5,315,142 A | 5/1994 | Acovic et al. |
| 5,316,962 A | 5/1994 | Matsuo et al. |
| 5,316,966 A | 5/1994 | Van Der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,340,754 A | 8/1994 | Witek et al. |
| 5,340,763 A | 8/1994 | Dennison et al. |
| 5,346,834 A | 9/1994 | Hisamoto et al. |
| 5,356,513 A | 10/1994 | Burke et al. |
| 5,358,879 A | 10/1994 | Brady et al. |
| 5,358,894 A | 10/1994 | Fazan et al. |
| 5,362,665 A | 11/1994 | Lu |
| 5,371,024 A | 12/1994 | Hieda et al. |
| 5,376,575 A | 12/1994 | Kim et al. |
| 5,391,901 A | 2/1995 | Tanabe |
| 5,392,237 A | 2/1995 | Iida |
| 5,396,093 A | 3/1995 | Lu |
| 5,398,205 A | 3/1995 | Yamaguchi |
| 5,401,681 A | 3/1995 | Dennison |
| 5,405,791 A | 4/1995 | Ahmad et al. |
| 5,405,794 A | 4/1995 | Kim |
| 5,408,116 A | 4/1995 | Tanaka et al. |
| 5,409,563 A | 4/1995 | Cathey |
| 5,413,949 A | 5/1995 | Hong |
| 5,414,287 A | 5/1995 | Hong |
| 5,416,350 A | 5/1995 | Watanabe |
| 5,438,016 A | 8/1995 | Figura et al. |
| 5,446,299 A | 8/1995 | Acovic et al. |
| 5,451,800 A | 9/1995 | Mohammad |
| 5,457,067 A | 10/1995 | Han |
| 5,458,999 A | 10/1995 | Szabo et al. |
| 5,460,993 A | 10/1995 | Hsu et al. |
| 5,466,632 A | 11/1995 | Lur et al. |
| 5,466,961 A | 11/1995 | Kikuchi et al. |
| 5,467,305 A | 11/1995 | Bertin et al. |
| 5,468,675 A | 11/1995 | Kaigawa |
| 5,469,208 A | 11/1995 | Dea |
| 5,470,661 A | 11/1995 | Bailey et al. |
| 5,472,893 A | 12/1995 | Iida |
| 5,480,838 A | 1/1996 | Mitsui |
| 5,481,126 A | 1/1996 | Subramanian et al. |

(56) References Cited

U.S. PATENT DOCUMENTS

| | | |
|---|---|---|
| 5,495,441 A | 2/1996 | Hong |
| 5,497,017 A | 3/1996 | Gonzalez |
| 5,498,562 A | 3/1996 | Dennison et al. |
| 5,502,320 A | 3/1996 | Yamada et al. |
| 5,504,357 A | 4/1996 | Kim et al. |
| 5,512,517 A | 4/1996 | Bryant |
| 5,512,770 A | 4/1996 | Hong |
| 5,512,771 A | 4/1996 | Hiroki et al. |
| 5,514,604 A | 5/1996 | Brown |
| 5,514,885 A | 5/1996 | Myrick |
| 5,532,089 A | 7/1996 | Adair et al. |
| 5,539,229 A | 7/1996 | Noble et al. |
| 5,554,570 A | 9/1996 | Maeda et al. |
| 5,561,307 A | 10/1996 | Mihara et al. |
| 5,563,012 A | 10/1996 | Neisser |
| 5,567,634 A | 10/1996 | Hebert |
| 5,569,620 A | 10/1996 | Linn et al. |
| 5,573,837 A | 11/1996 | Roberts et al. |
| 5,574,299 A | 11/1996 | Kim et al. |
| 5,574,621 A | 11/1996 | Sakamoto et al. |
| 5,576,567 A | 11/1996 | Mori |
| 5,578,850 A | 11/1996 | Fitch |
| 5,581,101 A | 12/1996 | Ning et al. |
| 5,583,065 A | 12/1996 | Miwa |
| 5,593,813 A | 1/1997 | Kim |
| 5,596,759 A | 1/1997 | Miller et al. |
| 5,604,159 A | 2/1997 | Cooper et al. |
| 5,604,370 A | 2/1997 | Mehta et al. |
| 5,604,696 A | 2/1997 | Takaishi |
| 5,605,857 A | 2/1997 | Jost et al. |
| 5,607,874 A | 3/1997 | Wang et al. |
| 5,612,559 A | 3/1997 | Park et al. |
| 5,619,057 A | 4/1997 | Komatsu |
| 5,627,097 A | 5/1997 | Venkatesan et al. |
| 5,628,917 A | 5/1997 | MacDonald et al. |
| 5,638,318 A | 6/1997 | Seyyedy |
| 5,645,887 A | 7/1997 | Byun |
| 5,647,760 A | 7/1997 | Drach et al. |
| 5,652,164 A | 7/1997 | Dennison et al. |
| 5,654,222 A | 8/1997 | Sandhu et al. |
| 5,659,189 A | 8/1997 | Pasch |
| 5,670,794 A | 9/1997 | Manning |
| 5,672,534 A | 9/1997 | Huang |
| 5,674,760 A | 10/1997 | Hong |
| 5,677,210 A | 10/1997 | Park et al. |
| 5,677,217 A | 10/1997 | Tseng |
| 5,677,227 A | 10/1997 | Yang et al. |
| 5,677,865 A | 10/1997 | Seyyedy |
| 5,679,591 A | 10/1997 | Lin et al. |
| 5,680,344 A | 10/1997 | Seyyedy |
| 5,682,048 A | 10/1997 | Shinohara et al. |
| 5,686,747 A | 11/1997 | Jost et al. |
| 5,687,119 A | 11/1997 | Park |
| 5,693,549 A | 12/1997 | Kim |
| 5,700,733 A | 12/1997 | Manning |
| 5,702,990 A | 12/1997 | Jost et al. |
| 5,705,838 A | 1/1998 | Jost et al. |
| 5,712,173 A | 1/1998 | Liu et al. |
| 5,714,412 A | 2/1998 | Liang et al. |
| 5,714,777 A | 2/1998 | Ismail et al. |
| 5,714,786 A | 2/1998 | Gonzalez |
| 5,721,172 A | 2/1998 | Jang et al. |
| 5,728,621 A | 3/1998 | Zheng et al. |
| 5,736,435 A | 4/1998 | Venkatesan et al. |
| 5,736,761 A | 4/1998 | Risch et al. |
| 5,739,066 A | 4/1998 | Pan |
| 5,747,377 A | 5/1998 | Wu |
| 5,748,519 A | 5/1998 | Tehrani et al. |
| 5,753,546 A | 5/1998 | Koh et al. |
| 5,753,947 A | 5/1998 | Gonzalez |
| 5,756,395 A | 5/1998 | Rostoker et al. |
| 5,757,083 A | 5/1998 | Yang |
| 5,760,442 A | 6/1998 | Shigyo et al. |
| 5,763,305 A | 6/1998 | Chao |
| 5,766,991 A | 6/1998 | Chen |
| 5,767,561 A | 6/1998 | Frei et al. |
| 5,772,905 A | 6/1998 | Chou |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,792,687 A | 8/1998 | Jeng |
| 5,792,690 A | 8/1998 | Sung |
| 5,792,691 A | 8/1998 | Koga |
| 5,793,082 A | 8/1998 | Bryant |
| 5,795,830 A | 8/1998 | Cronin et al. |
| 5,798,544 A | 8/1998 | Ohya et al. |
| 5,804,458 A | 9/1998 | Tehrani et al. |
| 5,804,851 A | 9/1998 | Noguchi et al. |
| 5,814,545 A | 9/1998 | Seddon et al. |
| 5,817,552 A | 10/1998 | Roesner et al. |
| 5,821,140 A | 10/1998 | Jost et al. |
| 5,821,577 A | 10/1998 | Crabbe et al. |
| 5,830,332 A | 11/1998 | Babich et al. |
| 5,834,359 A | 11/1998 | Jeng et al. |
| 5,840,591 A | 11/1998 | Park et al. |
| 5,841,611 A | 11/1998 | Sakakima et al. |
| 5,844,418 A | 12/1998 | Wood et al. |
| 5,846,862 A | 12/1998 | May et al. |
| 5,856,225 A | 1/1999 | Lee et al. |
| 5,858,620 A | 1/1999 | Ishibashi et al. |
| 5,861,328 A | 1/1999 | Tehrani et al. |
| 5,866,459 A | 2/1999 | Naem et al. |
| 5,869,359 A | 2/1999 | Prabhakar |
| 5,869,382 A | 2/1999 | Kubota |
| 5,874,760 A | 2/1999 | Burns, Jr. et al. |
| 5,882,973 A | 3/1999 | Gardner et al. |
| 5,885,900 A | 3/1999 | Schwartz |
| 5,891,773 A | 4/1999 | Saitoh |
| 5,892,708 A | 4/1999 | Pohm |
| 5,895,238 A | 4/1999 | Mitani |
| 5,895,740 A | 4/1999 | Chien et al. |
| 5,899,727 A | 5/1999 | Hause et al. |
| 5,899,746 A | 5/1999 | Mukai |
| 5,900,660 A | 5/1999 | Jost et al. |
| 5,902,690 A | 5/1999 | Tracy et al. |
| 5,905,285 A | 5/1999 | Gardner et al. |
| 5,907,170 A | 5/1999 | Forbes et al. |
| 5,908,313 A | 6/1999 | Chau et al. |
| 5,909,618 A | 6/1999 | Forbes et al. |
| 5,909,630 A | 6/1999 | Roberts et al. |
| 5,913,116 A | 6/1999 | Gardner et al. |
| 5,914,504 A | 6/1999 | Augusto |
| 5,917,745 A | 6/1999 | Fujii |
| 5,917,749 A | 6/1999 | Chen et al. |
| 5,918,134 A | 6/1999 | Gardner et al. |
| 5,929,477 A | 7/1999 | Burns, Jr. et al. |
| 5,933,742 A | 8/1999 | Wu |
| 5,943,575 A | 8/1999 | Chung |
| 5,948,470 A | 9/1999 | Harrison et al. |
| 5,949,101 A | 9/1999 | Aritome |
| 5,949,700 A | 9/1999 | Furukawa et al. |
| 5,955,758 A | 9/1999 | Sandhu et al. |
| 5,956,267 A | 9/1999 | Hurst et al. |
| 5,956,594 A | 9/1999 | Yang et al. |
| 5,963,469 A | 10/1999 | Forbes |
| 5,963,803 A | 10/1999 | Dawson et al. |
| 5,964,750 A | 10/1999 | Tulleken et al. |
| 5,972,754 A | 10/1999 | Ni et al. |
| 5,972,758 A | 10/1999 | Liang |
| 5,972,764 A | 10/1999 | Huang et al. |
| 5,973,363 A | 10/1999 | Staab et al. |
| 5,977,579 A | 11/1999 | Noble |
| 5,981,333 A | 11/1999 | Parekh et al. |
| 5,981,350 A | 11/1999 | Geusic et al. |
| 5,981,992 A | 11/1999 | Kenney |
| 5,989,953 A | 11/1999 | Liang et al. |
| 5,990,021 A | 11/1999 | Prall et al. |
| 5,990,509 A | 11/1999 | Burns, Jr. et al. |
| 5,990,536 A | 11/1999 | Lau et al. |
| 5,994,743 A | 11/1999 | Masuoka |
| 5,998,256 A | 12/1999 | Juengling |
| 5,998,288 A | 12/1999 | Gardner et al. |
| 6,002,867 A | 12/1999 | Jazdzewski |

(56) References Cited

U.S. PATENT DOCUMENTS

| | | |
|---|---|---|
| 6,004,862 A | 12/1999 | Kim et al. |
| 6,005,273 A | 12/1999 | Gonzalez et al. |
| 6,005,798 A | 12/1999 | Sakakima et al. |
| 6,005,800 A | 12/1999 | Koch et al. |
| 6,007,745 A | 12/1999 | Coates et al. |
| 6,008,104 A | 12/1999 | Schrems |
| 6,008,106 A | 12/1999 | Tu et al. |
| 6,010,946 A | 1/2000 | Hisamune et al. |
| 6,015,990 A | 1/2000 | Hieda et al. |
| 6,020,255 A | 2/2000 | Tsai et al. |
| 6,022,788 A | 2/2000 | Gandy et al. |
| 6,022,815 A | 2/2000 | Doyle et al. |
| 6,027,975 A | 2/2000 | Hergenrother et al. |
| 6,033,963 A | 3/2000 | Huang et al. |
| 6,034,389 A | 3/2000 | Burns, Jr. et al. |
| 6,037,194 A | 3/2000 | Bronner et al. |
| 6,037,212 A | 3/2000 | Chao |
| 6,037,218 A | 3/2000 | Dennison et al. |
| 6,037,230 A | 3/2000 | Holloway |
| 6,040,212 A | 3/2000 | Kim |
| 6,040,249 A | 3/2000 | Holloway |
| 6,042,998 A | 3/2000 | Brueck et al. |
| 6,049,106 A | 4/2000 | Forbes |
| 6,054,355 A | 4/2000 | Inumiya et al. |
| 6,057,573 A | 5/2000 | Kirsch et al. |
| 6,059,553 A | 5/2000 | Jin et al. |
| 6,060,383 A | 5/2000 | Nogami et al. |
| 6,060,749 A | 5/2000 | Wu |
| 6,063,669 A | 5/2000 | Takaishi |
| 6,063,688 A | 5/2000 | Doyle et al. |
| 6,066,191 A | 5/2000 | Tanaka et al. |
| 6,071,789 A | 6/2000 | Yang et al. |
| 6,072,209 A | 6/2000 | Noble et al. |
| 6,077,745 A | 6/2000 | Burns et al. |
| 6,087,210 A | 7/2000 | Sohn |
| 6,087,709 A | 7/2000 | Gandy et al. |
| 6,090,442 A | 7/2000 | Klaus et al. |
| 6,090,660 A | 7/2000 | Noble |
| 6,090,693 A | 7/2000 | Gonzalez et al. |
| 6,090,700 A | 7/2000 | Tseng |
| 6,091,094 A | 7/2000 | Rupp |
| 6,091,117 A | 7/2000 | Shiozawa et al. |
| 6,093,594 A | 7/2000 | Yeap et al. |
| 6,096,596 A | 8/2000 | Gonzalez |
| 6,096,598 A | 8/2000 | Furukawa et al. |
| 6,096,622 A | 8/2000 | Kim et al. |
| 6,097,055 A | 8/2000 | Lee et al. |
| 6,097,065 A | 8/2000 | Forbes et al. |
| 6,104,068 A | 8/2000 | Forbes |
| 6,104,663 A | 8/2000 | Abraham et al. |
| 6,107,653 A | 8/2000 | Fitzgerald |
| 6,108,191 A | 8/2000 | Bruchhaus et al. |
| 6,110,774 A | 8/2000 | Jost et al. |
| 6,110,837 A | 8/2000 | Linliu et al. |
| 6,111,782 A | 8/2000 | Sakakima et al. |
| 6,114,220 A | 9/2000 | Tsai |
| 6,114,725 A | 9/2000 | Furukawa et al. |
| 6,114,735 A | 9/2000 | Batra et al. |
| 6,120,952 A | 9/2000 | Pierrat et al. |
| 6,121,084 A | 9/2000 | Coursey |
| 6,124,610 A | 9/2000 | Cheek et al. |
| 6,124,611 A | 9/2000 | Mori |
| 6,127,241 A | 10/2000 | Rha |
| 6,127,699 A | 10/2000 | Ni et al. |
| 6,133,106 A | 10/2000 | Chuang et al. |
| 6,133,620 A | 10/2000 | Uochi |
| 6,134,139 A | 10/2000 | Bhattacharyya et al. |
| 6,140,171 A | 10/2000 | Allen et al. |
| 6,140,172 A | 10/2000 | Parekh |
| 6,140,240 A | 10/2000 | Yang et al. |
| 6,141,204 A | 10/2000 | Schuegraf et al. |
| 6,143,476 A | 11/2000 | Ye et al. |
| 6,146,975 A | 11/2000 | Kuehne et al. |
| 6,147,405 A | 11/2000 | Hu |
| 6,149,974 A | 11/2000 | Nguyen et al. |
| 6,150,210 A | 11/2000 | Arnold |
| 6,150,211 A | 11/2000 | Zahurak |
| 6,150,320 A | 11/2000 | Arnold |
| 6,150,687 A | 11/2000 | Noble et al. |
| 6,150,688 A | 11/2000 | Maeda et al. |
| 6,156,589 A | 12/2000 | Noble |
| 6,156,607 A | 12/2000 | Noble et al. |
| 6,157,064 A | 12/2000 | Huang |
| 6,159,789 A | 12/2000 | Chuang et al. |
| 6,159,818 A | 12/2000 | Durcan et al. |
| 6,165,833 A | 12/2000 | Parekh et al. |
| 6,168,996 B1 | 1/2001 | Numazawa et al. |
| 6,172,391 B1 | 1/2001 | Goebel et al. |
| 6,174,754 B1 | 1/2001 | Lee et al. |
| 6,174,780 B1 | 1/2001 | Robinson |
| 6,175,128 B1 | 1/2001 | Hakey et al. |
| 6,175,146 B1 | 1/2001 | Lane et al. |
| 6,177,699 B1 | 1/2001 | Perng et al. |
| 6,180,450 B1 | 1/2001 | Dennison et al. |
| 6,180,486 B1 | 1/2001 | Leobandung et al. |
| 6,180,494 B1 | 1/2001 | Manning |
| 6,184,086 B1 | 2/2001 | Kao |
| 6,184,091 B1 | 2/2001 | Gruening et al. |
| 6,184,151 B1 | 2/2001 | Adair et al. |
| 6,187,620 B1 | 2/2001 | Fulford et al. |
| 6,187,643 B1 | 2/2001 | Borland |
| 6,188,100 B1 | 2/2001 | Hermes |
| 6,191,432 B1 | 2/2001 | Sugiyama et al. |
| 6,191,470 B1 | 2/2001 | Forbes et al. |
| 6,200,836 B1 | 3/2001 | Yoo |
| 6,204,138 B1 | 3/2001 | Krishnan et al. |
| 6,204,143 B1 | 3/2001 | Roberts et al. |
| 6,204,178 B1 | 3/2001 | Marsh |
| 6,207,490 B1 | 3/2001 | Lee |
| 6,211,044 B1 | 4/2001 | Xiang et al. |
| 6,214,670 B1 | 4/2001 | Shih et al. |
| 6,215,149 B1 | 4/2001 | Lee et al. |
| 6,218,236 B1 | 4/2001 | Economikos et al. |
| 6,225,669 B1 | 5/2001 | Long et al. |
| 6,229,169 B1 | 5/2001 | Hofmann et al. |
| 6,229,187 B1 | 5/2001 | Ju |
| 6,229,194 B1 | 5/2001 | Lizotte |
| 6,232,168 B1 | 5/2001 | Coursey |
| 6,236,590 B1 | 5/2001 | Bhattacharyya et al. |
| 6,245,600 B1 | 6/2001 | Geissler et al. |
| 6,245,636 B1 | 6/2001 | Maszara |
| 6,245,684 B1 | 6/2001 | Zhao et al. |
| 6,246,083 B1 | 6/2001 | Noble |
| 6,246,719 B1 | 6/2001 | Agarwal |
| 6,248,667 B1 | 6/2001 | Kim et al. |
| 6,249,019 B1 | 6/2001 | Sandhu et al. |
| 6,251,711 B1 | 6/2001 | Fang et al. |
| 6,252,267 B1 | 6/2001 | Noble |
| 6,255,165 B1 | 7/2001 | Thurgate et al. |
| 6,258,650 B1 | 7/2001 | Sunouchi |
| 6,258,658 B1 | 7/2001 | Bohm et al. |
| 6,259,142 B1 | 7/2001 | Dawson et al. |
| 6,261,878 B1 | 7/2001 | Doyle et al. |
| 6,261,923 B1 | 7/2001 | Kuo et al. |
| 6,261,933 B1 | 7/2001 | Hakey et al. |
| 6,271,080 B1 | 8/2001 | Mandelman et al. |
| 6,274,497 B1 | 8/2001 | Lou |
| 6,274,894 B1 | 8/2001 | Wieczorek et al. |
| 6,274,905 B1 | 8/2001 | Mo |
| 6,274,913 B1 | 8/2001 | Brigham et al. |
| 6,278,161 B1 | 8/2001 | Back et al. |
| 6,281,082 B1 | 8/2001 | Chen et al. |
| 6,282,113 B1 | 8/2001 | Debrosse |
| 6,284,419 B2 | 9/2001 | Pierrat et al. |
| 6,288,454 B1 | 9/2001 | Allman et al. |
| 6,291,334 B1 | 9/2001 | Somekh |
| 6,297,106 B1 | 10/2001 | Pan et al. |
| 6,297,554 B1 | 10/2001 | Lin |
| 6,300,177 B1 | 10/2001 | Sundaresan |
| 6,300,199 B1 | 10/2001 | Reinberg |
| 6,300,219 B1 | 10/2001 | Doan et al. |
| 6,303,432 B1 | 10/2001 | Horita et al. |
| 6,303,518 B1 | 10/2001 | Tian et al. |
| 6,303,956 B1 | 10/2001 | Sandhu et al. |

(56) References Cited

U.S. PATENT DOCUMENTS

| | | |
|---|---|---|
| 6,304,483 B1 | 10/2001 | Noble |
| 6,306,727 B1 | 10/2001 | Akram |
| 6,306,755 B1 | 10/2001 | Zheng |
| 6,313,487 B1 | 11/2001 | Kencke et al. |
| 6,316,299 B1 | 11/2001 | Tung |
| 6,319,644 B2 | 11/2001 | Pierrat et al. |
| 6,319,782 B1 | 11/2001 | Nakabayashi |
| 6,319,853 B1 | 11/2001 | Ishibashi et al. |
| 6,320,222 B1 | 11/2001 | Forbes et al. |
| 6,323,108 B1 | 11/2001 | Kub et al. |
| 6,323,506 B1 | 11/2001 | Alok |
| 6,323,524 B1 | 11/2001 | May et al. |
| 6,323,528 B1 | 11/2001 | Yamazaki et al. |
| 6,329,683 B2 | 12/2001 | Kohyama |
| 6,331,461 B1 | 12/2001 | Juengling |
| 6,335,257 B1 | 1/2002 | Tseng |
| 6,337,497 B1 | 1/2002 | Hanafi et al. |
| 6,340,614 B1 | 1/2002 | Tseng |
| 6,342,421 B1 | 1/2002 | Mitani et al. |
| 6,344,396 B1 | 2/2002 | Ishida et al. |
| 6,346,724 B1 | 2/2002 | Lee |
| 6,348,380 B1 | 2/2002 | Weimer et al. |
| 6,348,385 B1 | 2/2002 | Cha et al. |
| 6,349,052 B1 | 2/2002 | Hofmann et al. |
| 6,350,635 B1 | 2/2002 | Noble et al. |
| 6,355,520 B1 | 3/2002 | Park et al. |
| 6,355,961 B1 | 3/2002 | Forbes |
| 6,358,798 B1 | 3/2002 | Chen |
| 6,362,057 B1 | 3/2002 | Taylor, Jr. et al. |
| 6,362,506 B1 | 3/2002 | Miyai |
| 6,368,950 B1 | 4/2002 | Xiang et al. |
| 6,372,554 B1 | 4/2002 | Kawakita et al. |
| 6,372,559 B1 | 4/2002 | Crowder et al. |
| 6,372,562 B1 | 4/2002 | Matsumoto |
| 6,372,574 B1 | 4/2002 | Lane et al. |
| 6,372,583 B1 | 4/2002 | Tyagi |
| 6,372,615 B2 | 4/2002 | Back et al. |
| 6,372,649 B1 | 4/2002 | Han et al. |
| 6,376,286 B1 | 4/2002 | Ju |
| 6,376,317 B1 | 4/2002 | Forbes et al. |
| 6,376,887 B2 | 4/2002 | Tasaka |
| 6,376,893 B1 | 4/2002 | Rha |
| 6,377,070 B1 | 4/2002 | Forbes |
| 6,383,861 B1 | 5/2002 | Gonzalez et al. |
| 6,383,879 B1 | 5/2002 | Kizilyalli et al. |
| 6,383,907 B1 | 5/2002 | Hasegawa et al. |
| 6,383,952 B1 | 5/2002 | Subramanian et al. |
| 6,388,294 B1 | 5/2002 | Radens et al. |
| 6,391,726 B1 | 5/2002 | Manning |
| 6,391,795 B1 | 5/2002 | Catabay et al. |
| 6,395,597 B2 | 5/2002 | Noble |
| 6,395,613 B1 | 5/2002 | Juengling |
| 6,396,096 B1 | 5/2002 | Park et al. |
| 6,399,490 B1 | 6/2002 | Jammy et al. |
| 6,399,979 B1 | 6/2002 | Noble et al. |
| 6,403,442 B1 | 6/2002 | Reinberg |
| 6,403,460 B1 | 6/2002 | Lin |
| 6,404,014 B1 | 6/2002 | Leobandung et al. |
| 6,404,056 B1 | 6/2002 | Kuge et al. |
| 6,410,355 B1 | 6/2002 | Wallace |
| 6,410,948 B1 | 6/2002 | Tran et al. |
| 6,413,825 B1 | 7/2002 | Forbes |
| 6,414,356 B1 | 7/2002 | Forbes et al. |
| 6,417,040 B2 | 7/2002 | Noble |
| 6,417,073 B2 | 7/2002 | Watanabe |
| 6,417,085 B1 | 7/2002 | Batra et al. |
| 6,420,748 B1 | 7/2002 | Hakey et al. |
| 6,420,767 B1 | 7/2002 | Krishnan et al. |
| 6,420,786 B1 | 7/2002 | Gonzalez et al. |
| 6,423,474 B1 | 7/2002 | Holscher |
| 6,424,001 B1 | 7/2002 | Forbes et al. |
| 6,424,011 B1 | 7/2002 | Assaderaghi et al. |
| 6,424,561 B1 | 7/2002 | Li et al. |
| 6,429,124 B1 | 8/2002 | Tang et al. |
| 6,432,472 B1 | 8/2002 | Farrell et al. |
| 6,440,801 B1 | 8/2002 | Furukawa et al. |
| 6,448,150 B1 | 9/2002 | Tsai et al. |
| 6,448,601 B1 | 9/2002 | Forbes et al. |
| 6,455,372 B1 | 9/2002 | Weimer |
| 6,458,653 B1 | 10/2002 | Jang |
| 6,458,925 B1 | 10/2002 | Fasano |
| 6,459,138 B2 | 10/2002 | Reinberg |
| 6,459,142 B1 | 10/2002 | Tihanyi |
| 6,461,932 B1 | 10/2002 | Wang et al. |
| 6,461,957 B1 | 10/2002 | Yokoyama et al. |
| 6,465,298 B2 | 10/2002 | Forbes et al. |
| 6,465,309 B1 | 10/2002 | Xiang et al. |
| 6,465,852 B1 | 10/2002 | Ju |
| 6,468,887 B2 | 10/2002 | Iwasa et al. |
| 6,473,333 B1 | 10/2002 | Tachibana et al. |
| 6,475,855 B1 | 11/2002 | Fishburn |
| 6,475,867 B1 | 11/2002 | Hui et al. |
| 6,475,874 B2 | 11/2002 | Xiang et al. |
| 6,476,432 B1 | 11/2002 | Basceri et al. |
| 6,476,434 B1 | 11/2002 | Noble et al. |
| 6,476,444 B1 | 11/2002 | Min |
| 6,479,866 B1 | 11/2002 | Xiang |
| 6,482,749 B1 | 11/2002 | Billington et al. |
| 6,486,066 B2 | 11/2002 | Cleeves et al. |
| 6,486,516 B1 | 11/2002 | Hachisuka |
| 6,489,204 B1 | 12/2002 | Tsui |
| 6,492,027 B2 | 12/2002 | Nishiguchi |
| 6,492,233 B2 | 12/2002 | Forbes et al. |
| 6,495,474 B1 | 12/2002 | Rafferty et al. |
| 6,495,870 B1 | 12/2002 | Sekiguchi et al. |
| 6,495,890 B1 | 12/2002 | Ono |
| 6,496,034 B2 | 12/2002 | Forbes et al. |
| 6,498,062 B2 | 12/2002 | Durcan et al. |
| 6,498,087 B2 | 12/2002 | French et al. |
| 6,500,756 B1 | 12/2002 | Bell et al. |
| 6,500,763 B2 | 12/2002 | Kim et al. |
| 6,504,201 B1 | 1/2003 | Noble et al. |
| 6,504,210 B1 | 1/2003 | Divakaruni et al. |
| 6,506,642 B1 | 1/2003 | Luning et al. |
| 6,514,809 B1 | 2/2003 | Xiang |
| 6,514,884 B2 | 2/2003 | Maeda |
| 6,515,348 B2 | 2/2003 | Hueting et al. |
| 6,522,584 B1 | 2/2003 | Chen et al. |
| 6,531,067 B1 | 3/2003 | Shiokawa et al. |
| 6,531,727 B2 | 3/2003 | Forbes et al. |
| 6,534,243 B1 | 3/2003 | Templeton |
| 6,534,409 B1 | 3/2003 | Srinivasan |
| 6,537,870 B1 | 3/2003 | Shen |
| 6,537,871 B2 | 3/2003 | Forbes |
| 6,541,328 B2 | 4/2003 | Whang et al. |
| 6,541,343 B1 | 4/2003 | Murthy et al. |
| 6,544,874 B2 | 4/2003 | Mandelman et al. |
| 6,545,904 B2 | 4/2003 | Tran |
| 6,548,385 B1 | 4/2003 | Lai |
| 6,548,396 B2 | 4/2003 | Naik et al. |
| 6,551,878 B2 | 4/2003 | Clampitt et al. |
| 6,552,401 B1 | 4/2003 | Dennison |
| 6,555,472 B2 | 4/2003 | Aminpur |
| 6,555,862 B1 | 4/2003 | Mandelman et al. |
| 6,555,891 B1 | 4/2003 | Furukawa et al. |
| 6,558,756 B2 | 5/2003 | Sugahara et al. |
| 6,559,017 B1 | 5/2003 | Brown et al. |
| 6,559,491 B2 | 5/2003 | Forbes et al. |
| 6,560,156 B2 | 5/2003 | Lien et al. |
| 6,562,665 B1 | 5/2003 | Yu |
| 6,563,183 B1 | 5/2003 | An et al. |
| 6,566,193 B2 | 5/2003 | Hofmann |
| 6,566,280 B1 | 5/2003 | Meagley et al. |
| 6,566,682 B2 | 5/2003 | Forbes |
| 6,573,030 B1 | 6/2003 | Fairbairn et al. |
| 6,573,136 B1 | 6/2003 | Hummler |
| 6,573,172 B1 | 6/2003 | En et al. |
| 6,573,559 B2 | 6/2003 | Kitada et al. |
| 6,579,759 B1 | 6/2003 | Chudzik et al. |
| 6,586,808 B1 | 7/2003 | Xiang et al. |
| 6,587,476 B1 | 7/2003 | Lewin et al. |
| 6,593,613 B1 | 7/2003 | Alsmeier et al. |
| 6,596,578 B2 | 7/2003 | Takeuchi et al. |
| 6,597,203 B2 | 7/2003 | Forbes |

(56) References Cited

U.S. PATENT DOCUMENTS

| | | |
|---|---|---|
| 6,599,684 B2 | 7/2003 | Reynolds et al. |
| 6,599,789 B1 | 7/2003 | Abbott et al. |
| 6,602,779 B1 | 8/2003 | Li et al. |
| 6,608,348 B2 | 8/2003 | Kuwazawa |
| 6,610,565 B2 | 8/2003 | Kim et al. |
| 6,610,566 B2 | 8/2003 | Forbes et al. |
| 6,617,202 B2 | 9/2003 | Lee |
| 6,617,222 B1 | 9/2003 | Coursey |
| 6,620,680 B2 | 9/2003 | Duncan et al. |
| 6,620,715 B1 | 9/2003 | Blosse et al. |
| 6,620,724 B1 | 9/2003 | Schroeder et al. |
| 6,621,110 B1 | 9/2003 | Matsuoka et al. |
| 6,624,032 B2 | 9/2003 | Alavi et al. |
| 6,624,033 B2 | 9/2003 | Noble |
| 6,627,824 B1 | 9/2003 | Lin |
| 6,627,933 B2 | 9/2003 | Juengling |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,632,741 B1 | 10/2003 | Clevenger et al. |
| 6,635,917 B2 | 10/2003 | Juengling |
| 6,638,441 B2 | 10/2003 | Chang et al. |
| 6,639,268 B2 | 10/2003 | Forbes et al. |
| 6,641,985 B2 | 11/2003 | Unno et al. |
| 6,642,566 B1 | 11/2003 | Mandelman et al. |
| 6,645,818 B1 | 11/2003 | Sing et al. |
| 6,645,869 B1 | 11/2003 | Chu et al. |
| 6,646,303 B2 | 11/2003 | Satoh et al. |
| 6,649,460 B2 | 11/2003 | Leobandung |
| 6,649,953 B2 | 11/2003 | Cha |
| 6,656,748 B2 | 12/2003 | Hall et al. |
| 6,660,591 B2 | 12/2003 | Peake et al. |
| 6,661,061 B1 | 12/2003 | Gardner et al. |
| 6,664,154 B1 | 12/2003 | Bell et al. |
| 6,664,806 B2 | 12/2003 | Forbes et al. |
| 6,667,237 B1 | 12/2003 | Metzler |
| 6,667,502 B1 | 12/2003 | Agarwal et al. |
| 6,670,227 B1 | 12/2003 | Thio et al. |
| 6,670,642 B2 | 12/2003 | Takaura et al. |
| 6,673,684 B1 | 1/2004 | Huang et al. |
| 6,673,693 B1 | 1/2004 | Kirchhoff |
| 6,673,705 B2 | 1/2004 | Miyashita |
| 6,677,230 B2 | 1/2004 | Shimazu et al. |
| 6,678,740 B1 | 1/2004 | Rakib et al. |
| 6,686,245 B1 | 2/2004 | Mathew et al. |
| 6,686,274 B1 | 2/2004 | Shimazu et al. |
| 6,689,660 B1 | 2/2004 | Noble et al. |
| 6,689,695 B1 | 2/2004 | Lui et al. |
| 6,693,026 B2 | 2/2004 | Kim |
| 6,693,324 B2 | 2/2004 | Maegawa et al. |
| 6,696,334 B1 | 2/2004 | Hellig et al. |
| 6,696,745 B2 | 2/2004 | Sandhu et al. |
| 6,696,746 B1 | 2/2004 | Farrar et al. |
| 6,699,763 B2 | 3/2004 | Grider et al. |
| 6,703,273 B2 | 3/2004 | Wang et al. |
| 6,706,571 B1 | 3/2004 | Yu et al. |
| 6,706,600 B2 | 3/2004 | Kanaya |
| 6,707,088 B2 | 3/2004 | Fishburn |
| 6,707,092 B2 | 3/2004 | Sasaki |
| 6,707,706 B2 | 3/2004 | Nitayama et al. |
| 6,709,807 B2 | 3/2004 | Hallock et al. |
| 6,709,978 B2 | 3/2004 | Geusic et al. |
| 6,710,387 B2 | 3/2004 | Nakamura |
| 6,710,402 B2 | 3/2004 | Harada |
| 6,713,392 B1 | 3/2004 | Ngo et al. |
| 6,716,687 B2 | 4/2004 | Wang |
| 6,717,200 B1 | 4/2004 | Schamberger et al. |
| 6,717,205 B2 | 4/2004 | Gratz |
| 6,720,232 B1 | 4/2004 | Tu et al. |
| 6,723,607 B2 | 4/2004 | Nam et al. |
| 6,724,028 B2 | 4/2004 | Gudesen |
| 6,727,137 B2 | 4/2004 | Brown |
| 6,727,540 B2 | 4/2004 | Divakaruni et al. |
| 6,727,550 B2 | 4/2004 | Tezuka et al. |
| 6,730,571 B1 | 5/2004 | Chan et al. |
| 6,734,063 B2 | 5/2004 | Willer et al. |
| 6,734,107 B2 | 5/2004 | Lai et al. |
| 6,734,482 B1 | 5/2004 | Tran et al. |
| 6,734,484 B2 | 5/2004 | Wu |
| 6,736,311 B2 | 5/2004 | Hagglund et al. |
| 6,737,323 B2 | 5/2004 | Mo |
| 6,737,333 B2 | 5/2004 | Chen et al. |
| 6,740,594 B2 | 5/2004 | Lu et al. |
| 6,744,083 B2 | 6/2004 | Chen et al. |
| 6,744,094 B2 | 6/2004 | Forbes |
| 6,744,097 B2 | 6/2004 | Yoo |
| 6,745,392 B1 | 6/2004 | Basawapatna et al. |
| 6,746,825 B2 * | 6/2004 | Nealey et al. ............... 430/315 |
| 6,753,228 B2 | 6/2004 | Azam et al. |
| 6,756,284 B2 | 6/2004 | Sharma |
| 6,756,625 B2 | 6/2004 | Brown |
| 6,758,663 B2 | 7/2004 | Ogata |
| 6,759,180 B2 | 7/2004 | Lee |
| 6,762,447 B1 | 7/2004 | Mandelman et al. |
| 6,762,449 B2 | 7/2004 | Uchiyama et al. |
| 6,764,901 B2 | 7/2004 | Noble |
| 6,764,903 B1 | 7/2004 | Chan et al. |
| 6,764,949 B2 | 7/2004 | Bonser et al. |
| 6,767,789 B1 | 7/2004 | Bronner et al. |
| 6,770,535 B2 | 8/2004 | Yamada et al. |
| 6,773,998 B1 | 8/2004 | Fisher et al. |
| 6,777,725 B2 | 8/2004 | Willer et al. |
| 6,780,691 B2 | 8/2004 | Cha et al. |
| 6,784,112 B2 | 8/2004 | Arita et al. |
| 6,784,479 B2 | 8/2004 | Park |
| 6,787,833 B1 | 9/2004 | Fishburn |
| 6,794,699 B2 | 9/2004 | Bissey et al. |
| 6,794,701 B2 | 9/2004 | Chang et al. |
| 6,797,573 B2 | 9/2004 | Forbes et al. |
| 6,798,009 B2 | 9/2004 | Forbes et al. |
| 6,800,930 B2 | 10/2004 | Jackson et al. |
| 6,800,940 B2 | 10/2004 | Catabay et al. |
| 6,801,056 B2 | 10/2004 | Forbes |
| 6,806,137 B2 | 10/2004 | Tran et al. |
| 6,806,195 B1 | 10/2004 | Enomoto et al. |
| 6,808,979 B1 | 10/2004 | Lin et al. |
| 6,809,364 B2 | 10/2004 | Matsuoka et al. |
| 6,811,954 B1 | 11/2004 | Fukuda |
| 6,812,512 B2 | 11/2004 | Prall et al. |
| 6,812,513 B2 | 11/2004 | Geusic et al. |
| 6,818,141 B1 | 11/2004 | Plat et al. |
| 6,818,250 B2 | 11/2004 | George et al. |
| 6,818,515 B1 | 11/2004 | Lee et al. |
| 6,818,937 B2 | 11/2004 | Noble et al. |
| 6,818,947 B2 | 11/2004 | Grebs et al. |
| 6,822,261 B2 | 11/2004 | Yamazaki et al. |
| 6,822,280 B2 | 11/2004 | Ito et al. |
| 6,825,093 B2 | 11/2004 | Scholz |
| 6,825,129 B2 | 11/2004 | Hong |
| 6,825,529 B2 | 11/2004 | Chidambarrao et al. |
| 6,828,630 B2 | 12/2004 | Park |
| 6,831,310 B1 | 12/2004 | Mathew et al. |
| 6,835,662 B1 | 12/2004 | Erhardt et al. |
| 6,835,663 B2 | 12/2004 | Lipinski |
| 6,844,230 B2 | 1/2005 | Reinberg |
| 6,844,591 B1 | 1/2005 | Tran |
| 6,846,618 B2 | 1/2005 | Hsu et al. |
| 6,849,496 B2 | 2/2005 | Jaiprakash et al. |
| 6,849,501 B2 | 2/2005 | Rudeck |
| 6,849,893 B2 | 2/2005 | Sommer |
| 6,853,023 B2 | 2/2005 | Goebel |
| 6,861,330 B2 | 3/2005 | Basceri et al. |
| 6,864,536 B2 | 3/2005 | Lin et al. |
| 6,864,545 B2 | 3/2005 | Yamashita |
| 6,867,116 B1 | 3/2005 | Chung |
| 6,867,994 B2 | 3/2005 | Tsukikawa |
| 6,875,703 B1 | 4/2005 | Furukawa et al. |
| 6,878,991 B1 | 4/2005 | Forbes |
| 6,881,627 B2 | 4/2005 | Forbes et al. |
| 6,881,635 B1 | 4/2005 | Chidambarrao et al. |
| 6,882,006 B2 | 4/2005 | Maeda et al. |
| 6,885,084 B2 | 4/2005 | Murthy et al. |
| 6,888,187 B2 | 5/2005 | Brown et al. |
| 6,888,198 B1 | 5/2005 | Krivokapic |

(56) References Cited

U.S. PATENT DOCUMENTS

| | | |
|---|---|---|
| 6,888,200 B2 | 5/2005 | Bhattacharyya |
| 6,888,755 B2 | 5/2005 | Harari |
| 6,888,770 B2 | 5/2005 | Ikehashi |
| 6,890,812 B2 | 5/2005 | Forbes et al. |
| 6,890,814 B2 | 5/2005 | Sandhu et al. |
| 6,890,858 B2 | 5/2005 | Juengling et al. |
| 6,891,192 B2 | 5/2005 | Chen et al. |
| 6,891,228 B2 | 5/2005 | Park et al. |
| 6,893,914 B2 | 5/2005 | Kim et al. |
| 6,893,919 B2 | 5/2005 | Chuang et al. |
| 6,893,972 B2 | 5/2005 | Rottstegge et al. |
| 6,897,109 B2 | 5/2005 | Jin et al. |
| 6,900,002 B1 | 5/2005 | Plat et al. |
| 6,900,521 B2 | 5/2005 | Forbes et al. |
| 6,905,628 B2 | 6/2005 | Bjarnason et al. |
| 6,906,953 B2 | 6/2005 | Forbes |
| 6,908,800 B1 | 6/2005 | Kim et al. |
| 6,911,400 B2 | 6/2005 | Colburn et al. |
| 6,916,594 B2 | 7/2005 | Bok |
| 6,916,711 B2 | 7/2005 | Yoo |
| 6,924,190 B2 | 8/2005 | Dennison |
| 6,924,191 B2 | 8/2005 | Liu et al. |
| 6,926,953 B2 | 8/2005 | Nealey et al. |
| 6,927,122 B2 | 8/2005 | Geusic et al. |
| 6,927,170 B2 | 8/2005 | Zheng |
| 6,930,640 B2 | 8/2005 | Chung et al. |
| 6,936,383 B2 | 8/2005 | Mazur et al. |
| 6,936,507 B2 | 8/2005 | Tang et al. |
| 6,936,880 B2 | 8/2005 | Park |
| 6,939,763 B2 | 9/2005 | Schlosser et al. |
| 6,939,794 B2 | 9/2005 | Yin et al. |
| 6,939,808 B2 | 9/2005 | Tzou et al. |
| 6,946,389 B2 | 9/2005 | Farrar et al. |
| 6,946,700 B2 | 9/2005 | Noble |
| 6,946,709 B2 | 9/2005 | Yang |
| 6,951,709 B2 | 10/2005 | Li |
| 6,955,961 B1 | 10/2005 | Chung |
| 6,956,256 B2 | 10/2005 | Forbes |
| 6,960,832 B2 | 11/2005 | Shimazu |
| 6,962,846 B2 | 11/2005 | Fishburn et al. |
| 6,962,867 B2 | 11/2005 | Jackson et al. |
| 6,964,391 B2 | 11/2005 | Hsu |
| 6,964,895 B2 | 11/2005 | Hsu |
| 6,967,140 B2 | 11/2005 | Doyle |
| 6,969,662 B2 | 11/2005 | Fazan et al. |
| 6,977,413 B2 | 12/2005 | Hofmann et al. |
| 6,979,853 B2 | 12/2005 | Sommer et al. |
| 6,982,484 B2 | 1/2006 | Anzai |
| 6,987,291 B2 | 1/2006 | Abbott et al. |
| 6,991,980 B2 | 1/2006 | Park |
| 6,992,019 B2 | 1/2006 | Lee et al. |
| 6,998,319 B2 | 2/2006 | Tanaka et al. |
| 6,998,332 B2 | 2/2006 | Furukawa et al. |
| 7,005,240 B2 | 2/2006 | Manger et al. |
| 7,005,349 B2 | 2/2006 | Lee et al. |
| 7,005,379 B2 | 2/2006 | Sinha et al. |
| 7,005,710 B1 | 2/2006 | Gonzalez |
| 7,009,208 B2 | 3/2006 | Aratani |
| 7,015,082 B2 | 3/2006 | Doris et al. |
| 7,015,089 B2 | 3/2006 | Hsu et al. |
| 7,015,124 B1 | 3/2006 | Fisher et al. |
| 7,022,561 B2 | 4/2006 | Huang et al. |
| 7,022,573 B2 | 4/2006 | Hsiao et al. |
| 7,026,247 B2 | 4/2006 | Dokumaci et al. |
| 7,027,334 B2 | 4/2006 | Ikehashi |
| 7,030,012 B2 | 4/2006 | Divakaruni |
| 7,030,436 B2 | 4/2006 | Forbes |
| 7,030,464 B2 | 4/2006 | Masuoka et al. |
| 7,034,366 B2 | 4/2006 | Watanabe et al. |
| 7,042,009 B2 | 5/2006 | Shaheen |
| 7,042,040 B2 | 5/2006 | Horiguchi |
| 7,042,047 B2 | 5/2006 | Eppich |
| 7,049,196 B2 | 5/2006 | Noble |
| 7,049,702 B2 | 5/2006 | Tseng |
| 7,052,964 B2 | 5/2006 | Yeo et al. |
| 7,053,435 B2 | 5/2006 | Yeo et al. |
| 7,053,453 B2 | 5/2006 | Tsao et al. |
| 7,056,794 B2 | 6/2006 | Ku et al. |
| 7,060,546 B2 | 6/2006 | Hsu et al. |
| 7,064,028 B2 | 6/2006 | Ito et al. |
| 7,064,078 B2 | 6/2006 | Liu et al. |
| 7,064,365 B2 | 6/2006 | An et al. |
| 7,067,385 B2 | 6/2006 | Manning |
| 7,071,043 B2 | 7/2006 | Tang et al. |
| 7,071,055 B2 | 7/2006 | Fishburn |
| 7,073,969 B2 | 7/2006 | Kamm |
| 7,074,668 B1 | 7/2006 | Park et al. |
| 7,074,669 B2 | 7/2006 | Iijima et al. |
| 7,075,151 B2 | 7/2006 | Shino |
| 7,078,292 B2 | 7/2006 | Park et al. |
| 7,078,296 B2 | 7/2006 | Chau et al. |
| 7,081,384 B2 | 7/2006 | Birner et al. |
| 7,084,028 B2 | 8/2006 | Fukuzumi |
| 7,084,076 B2 | 8/2006 | Park et al. |
| 7,084,451 B2 | 8/2006 | Forbes et al. |
| 7,087,956 B2 | 8/2006 | Umebayashi |
| 7,091,092 B2 | 8/2006 | Sneelal et al. |
| 7,091,566 B2 | 8/2006 | Zhu et al. |
| 7,092,285 B1 | 8/2006 | Lu et al. |
| 7,094,701 B2 | 8/2006 | Mitsuo et al. |
| 7,098,099 B1 | 8/2006 | Hornung et al. |
| 7,098,105 B2 | 8/2006 | Juengling |
| 7,098,536 B2 | 8/2006 | Yang et al. |
| 7,105,089 B2 | 9/2006 | Fanselow et al. |
| 7,105,431 B2 | 9/2006 | Yin et al. |
| 7,108,579 B2 | 9/2006 | Wada et al. |
| 7,109,544 B2 | 9/2006 | Schloesser et al. |
| 7,112,454 B2 | 9/2006 | Drewes et al. |
| 7,112,483 B2 | 9/2006 | Lin et al. |
| 7,112,495 B2 | 9/2006 | Ko et al. |
| 7,112,858 B2 | 9/2006 | Inaba et al. |
| 7,115,500 B1 | 10/2006 | Torres |
| 7,115,525 B2 | 10/2006 | Abatchev |
| 7,115,531 B2 | 10/2006 | Shaffer et al. |
| 7,118,950 B2 | 10/2006 | Tran |
| 7,118,988 B2 | 10/2006 | Buerger et al. |
| 7,119,020 B2 | 10/2006 | Okamura et al. |
| 7,119,384 B2 | 10/2006 | Popp et al. |
| 7,122,425 B2 | 10/2006 | Chance et al. |
| 7,122,449 B2 | 10/2006 | Langdo et al. |
| 7,125,774 B2 | 10/2006 | Kim et al. |
| 7,125,781 B2 | 10/2006 | Manning et al. |
| 7,129,538 B2 | 10/2006 | Lee et al. |
| 7,135,371 B2 | 11/2006 | Han et al. |
| 7,148,527 B2 | 12/2006 | Kim et al. |
| 7,151,040 B2 | 12/2006 | Tran et al. |
| 7,151,690 B2 | 12/2006 | Forbes |
| 7,153,731 B2 | 12/2006 | Abbott et al. |
| 7,153,734 B2 | 12/2006 | Brask et al. |
| 7,153,746 B2 | 12/2006 | Moore et al. |
| 7,153,778 B2 | 12/2006 | Busch et al. |
| 7,157,778 B2 | 1/2007 | Moore |
| 7,160,780 B2 | 1/2007 | Lee et al. |
| 7,160,788 B2 | 1/2007 | Sandhu et al. |
| 7,163,853 B2 | 1/2007 | Tu |
| 7,169,678 B2 | 1/2007 | Kim |
| 7,169,711 B1 | 1/2007 | Lyons et al. |
| 7,176,109 B2 | 2/2007 | Ping et al. |
| 7,176,125 B2 | 2/2007 | Liaw |
| 7,176,513 B2 | 2/2007 | Brown |
| 7,179,672 B2 | 2/2007 | Asakawa et al. |
| 7,179,706 B2 | 2/2007 | Patraw et al. |
| 7,180,182 B2 | 2/2007 | Kobayashi et al. |
| 7,182,823 B2 | 2/2007 | Mandigo et al. |
| 7,183,142 B2 | 2/2007 | Anderson |
| 7,183,164 B2 | 2/2007 | Haller |
| 7,183,205 B2 | 2/2007 | Hong |
| 7,183,597 B2 | 2/2007 | Doyle |
| 7,183,823 B2 | 2/2007 | Gibson et al. |
| 7,193,254 B2 | 3/2007 | Chan et al. |
| 7,199,005 B2 | 4/2007 | Sandhu et al. |
| 7,199,419 B2 | 4/2007 | Haller |
| 7,202,127 B2 | 4/2007 | Busch et al. |
| 7,202,174 B1 | 4/2007 | Jung |

(56) References Cited

U.S. PATENT DOCUMENTS

| | | |
|---|---|---|
| 7,205,192 B2 | 4/2007 | Kweon |
| 7,205,598 B2 | 4/2007 | Voshell et al. |
| 7,208,379 B2 | 4/2007 | Venugopal et al. |
| 7,214,621 B2 | 5/2007 | Nejad et al. |
| 7,214,629 B1 | 5/2007 | Luo et al. |
| 7,214,989 B2 | 5/2007 | Ushiroda et al. |
| 7,217,974 B2 | 5/2007 | Forbes |
| 7,223,690 B2 | 5/2007 | Kondo et al. |
| 7,226,845 B2 | 6/2007 | Manning et al. |
| 7,227,331 B2 | 6/2007 | Galli et al. |
| 7,235,441 B2 | 6/2007 | Yasui et al. |
| 7,235,479 B2 | 6/2007 | Verhaverbeke |
| 7,235,485 B2 | 6/2007 | Kwak et al. |
| 7,238,580 B2 | 7/2007 | Orlowski et al. |
| 7,241,655 B2 | 7/2007 | Tang et al. |
| 7,241,658 B2 | 7/2007 | Forbes |
| 7,244,644 B2 | 7/2007 | Zhu et al. |
| 7,244,659 B2 | 7/2007 | Tang et al. |
| 7,250,650 B2 | 7/2007 | Hierlemann et al. |
| 7,253,118 B2 | 8/2007 | Tran et al. |
| 7,262,089 B2 | 8/2007 | Abbott et al. |
| 7,268,034 B2 | 9/2007 | Basceri et al. |
| 7,268,039 B2 | 9/2007 | Fishburn et al. |
| 7,268,054 B2 | 9/2007 | Tran et al. |
| 7,271,051 B2 | 9/2007 | Manning et al. |
| 7,271,057 B2 | 9/2007 | Eppich |
| 7,271,107 B2 | 9/2007 | Marks et al. |
| 7,271,413 B2 | 9/2007 | Chance et al. |
| 7,273,779 B2 | 9/2007 | Fishburn et al. |
| 7,276,418 B2 | 10/2007 | Brown |
| 7,279,379 B2 | 10/2007 | Tran et al. |
| 7,282,401 B2 | 10/2007 | Juengling |
| 7,282,756 B2 | 10/2007 | Agarwal et al. |
| 7,285,812 B2 | 10/2007 | Tang et al. |
| 7,288,445 B2 | 10/2007 | Bryant et al. |
| 7,288,806 B2 | 10/2007 | Tran et al. |
| 7,291,560 B2 | 11/2007 | Parascandola et al. |
| 7,294,888 B1 | 11/2007 | Paak et al. |
| 7,298,004 B2 | 11/2007 | Specht et al. |
| 7,315,055 B2 | 1/2008 | Cho et al. |
| 7,319,255 B2 | 1/2008 | Hwang et al. |
| 7,320,911 B2 | 1/2008 | Basceri et al. |
| 7,321,149 B2 | 1/2008 | Busch et al. |
| 7,321,150 B2 | 1/2008 | Fishburn et al. |
| 7,323,379 B2 | 1/2008 | Sinitsky et al. |
| 7,335,935 B2 | 2/2008 | Sinha et al. |
| 7,341,909 B2 | 3/2008 | McDaniel et al. |
| 7,349,232 B2 | 3/2008 | Wang et al. |
| 7,351,666 B2 | 4/2008 | Furukawa et al. |
| 7,355,273 B2 | 4/2008 | Jackson et al. |
| 7,358,121 B2 | 4/2008 | Chau et al. |
| 7,361,545 B2 | 4/2008 | Li et al. |
| 7,361,569 B2 | 4/2008 | Tran et al. |
| 7,365,385 B2 | 4/2008 | Abbott |
| 7,368,769 B2 | 5/2008 | Paik |
| 7,368,800 B2 | 5/2008 | Sandhu |
| 7,372,091 B2 | 5/2008 | Leslie |
| 7,378,727 B2 | 5/2008 | Caspary et al. |
| 7,384,847 B2 | 6/2008 | Tran et al. |
| 7,384,849 B2 | 6/2008 | Parekh et al. |
| 7,384,868 B2 | 6/2008 | Cabral, Jr. et al. |
| 7,387,939 B2 | 6/2008 | Manning |
| 7,387,940 B2 | 6/2008 | Sandhu et al. |
| 7,390,746 B2 | 6/2008 | Bai et al. |
| 7,391,070 B2 | 6/2008 | Juengling |
| 7,393,741 B2 | 7/2008 | Sandhu et al. |
| 7,393,743 B2 | 7/2008 | Manning |
| 7,393,789 B2 | 7/2008 | Abatchev et al. |
| 7,396,767 B2 | 7/2008 | Wu et al. |
| 7,396,781 B2 | 7/2008 | Wells |
| 7,410,856 B2 | 8/2008 | Brown |
| 7,413,952 B2 | 8/2008 | Busch et al. |
| 7,413,981 B2 | 8/2008 | Tang et al. |
| 7,420,238 B2 | 9/2008 | Manning et al. |
| 7,429,536 B2 | 9/2008 | Abatchev et al. |
| 7,432,166 B2 | 10/2008 | Sandhu et al. |
| 7,432,553 B2 | 10/2008 | Chen et al. |
| 7,435,536 B2 | 10/2008 | Sandhu et al. |
| 7,439,152 B2 | 10/2008 | Manning |
| 7,440,255 B2 | 10/2008 | McClure et al. |
| 7,442,600 B2 | 10/2008 | Wang et al. |
| 7,442,976 B2 | 10/2008 | Juengling |
| 7,445,990 B2 | 11/2008 | Busch et al. |
| 7,445,991 B2 | 11/2008 | Manning |
| 7,446,049 B2 | 11/2008 | Kim et al. |
| 7,449,391 B2 | 11/2008 | Manning et al. |
| 7,453,103 B2 | 11/2008 | Abbott |
| 7,455,956 B2 | 11/2008 | Sandhu et al. |
| 7,456,458 B2 | 11/2008 | Wang |
| 7,456,508 B2 | 11/2008 | Mascolo et al. |
| 7,459,362 B2 | 12/2008 | Juengling |
| 7,459,757 B2 | 12/2008 | Sandhu et al. |
| 7,465,616 B2 | 12/2008 | Tang et al. |
| 7,470,576 B2 | 12/2008 | Tang |
| 7,473,644 B2 | 1/2009 | Lane et al. |
| 7,474,215 B2 | 1/2009 | Scott et al. |
| 7,476,933 B2 | 1/2009 | Juengling |
| 7,482,229 B2 | 1/2009 | Juengling |
| 7,488,641 B2 | 2/2009 | Noble |
| 7,488,685 B2 | 2/2009 | Kewley |
| 7,494,870 B2 | 2/2009 | Chien et al. |
| 7,494,909 B2 | 2/2009 | Ju et al. |
| 7,495,294 B2 | 2/2009 | Higashitani |
| 7,495,946 B2 | 2/2009 | Gruening-von Schwerin et al. |
| 7,501,676 B2 | 3/2009 | Doyle |
| 7,504,686 B2 | 3/2009 | Lutze et al. |
| 7,517,753 B2 | 4/2009 | Manning |
| 7,517,754 B2 | 4/2009 | McDaniel et al. |
| 7,518,174 B2 | 4/2009 | Brown |
| 7,518,182 B2 | 4/2009 | Abbott |
| 7,518,184 B2 | 4/2009 | Tran |
| 7,521,322 B2 | 4/2009 | Tang |
| 7,528,440 B2 | 5/2009 | Forbes |
| 7,534,694 B2 | 5/2009 | Manning |
| 7,535,745 B2 | 5/2009 | Shuto |
| 7,537,866 B2 | 5/2009 | Liu |
| 7,538,036 B2 | 5/2009 | Busch et al. |
| 7,544,563 B2 | 6/2009 | Manning |
| 7,547,599 B2 | 6/2009 | Sandhu et al. |
| 7,547,640 B2 | 6/2009 | Abatchev et al. |
| 7,547,945 B2 | 6/2009 | Tang |
| 7,557,013 B2 | 7/2009 | Bhat et al. |
| 7,557,015 B2 | 7/2009 | Sandhu et al. |
| 7,560,390 B2 | 7/2009 | Sant et al. |
| 7,564,087 B2 | 7/2009 | Forbes |
| 7,567,452 B2 | 7/2009 | Song et al. |
| 7,572,572 B2 | 8/2009 | Wells |
| 7,572,692 B2 | 8/2009 | Yang |
| 7,573,088 B2 | 8/2009 | Juengling |
| 7,576,389 B2 | 8/2009 | Tanaka |
| 7,576,441 B2 | 8/2009 | Yin et al. |
| 7,579,278 B2 | 8/2009 | Sandhu |
| 7,589,995 B2 | 9/2009 | Tang et al. |
| 7,592,218 B2 | 9/2009 | Brown |
| 7,602,001 B2 | 10/2009 | Gonzalez |
| 7,605,090 B2 | 10/2009 | Gutsche et al. |
| 7,608,503 B2 | 10/2009 | Lung et al. |
| 7,608,876 B2 | 10/2009 | Forbes |
| 7,611,944 B2 | 11/2009 | Tran et al. |
| 7,611,980 B2 | 11/2009 | Wells et al. |
| 7,619,311 B2 | 11/2009 | Lung |
| 7,629,693 B2 | 12/2009 | Abatchev et al. |
| 7,638,392 B2 | 12/2009 | Wang et al. |
| 7,648,919 B2 | 1/2010 | Tran et al. |
| 7,655,387 B2 | 2/2010 | Sandhu et al. |
| 7,655,968 B2 | 2/2010 | Manning |
| 7,659,560 B2 | 2/2010 | Tang et al. |
| 7,682,924 B2 | 3/2010 | Bhat et al. |
| 7,684,245 B2 | 3/2010 | Schumann et al. |
| 7,687,342 B2 | 3/2010 | Haller et al. |
| 7,687,408 B2 | 3/2010 | Abatchev et al. |
| 7,700,441 B2 | 4/2010 | Kim et al. |
| 7,718,540 B2 | 5/2010 | Tran et al. |
| 7,723,007 B2 | 5/2010 | Ogata et al. |

(56) References Cited

U.S. PATENT DOCUMENTS

| | | | |
|---|---|---|---|
| 7,723,009 B2 * | 5/2010 | Sandhu et al. ............ 430/270.1 |
| 7,732,275 B2 | 6/2010 | Orimoto et al. |
| 7,736,980 B2 | 6/2010 | Juengling |
| 7,755,132 B2 | 7/2010 | Mokhlesi |
| 7,759,193 B2 | 7/2010 | Fishburn |
| 7,759,197 B2 | 7/2010 | Tran |
| 7,772,633 B2 | 8/2010 | Juengling |
| 7,776,744 B2 | 8/2010 | Sandhu et al. |
| 7,785,962 B2 | 8/2010 | Bhat et al. |
| 7,807,580 B2 | 10/2010 | Lee et al. |
| 7,811,940 B2 | 10/2010 | Sandhu |
| 7,816,262 B2 | 10/2010 | Juengling |
| 7,825,452 B2 | 11/2010 | Eppich |
| 7,829,262 B2 | 11/2010 | Tran |
| 7,842,558 B2 | 11/2010 | Juengling |
| 7,851,135 B2 | 12/2010 | Jung |
| 7,858,458 B2 | 12/2010 | Mathew |
| 7,871,909 B1 | 1/2011 | Wang et al. |
| 7,879,694 B1 | 2/2011 | Foote |
| 7,901,866 B2 | 3/2011 | Ito |
| 7,902,028 B2 | 3/2011 | Kim et al. |
| 7,902,081 B2 | 3/2011 | Raghu et al. |
| 7,915,692 B2 | 3/2011 | Juengling |
| 7,923,373 B2 | 4/2011 | Sandhu |
| 7,944,743 B2 | 5/2011 | Tang et al. |
| 7,964,107 B2 | 6/2011 | Millward |
| 7,910,288 B2 | 9/2011 | Abatchev et al. |
| 8,012,847 B2 | 9/2011 | Patraw et al. |
| 8,039,348 B2 | 10/2011 | Juengling |
| 8,043,915 B2 | 10/2011 | Tran |
| 8,084,190 B2 | 12/2011 | Gutsche et al. |
| 8,114,573 B2 | 2/2012 | Sandhu et al. |
| 8,129,289 B2 | 3/2012 | Smythe |
| 8,148,247 B2 | 4/2012 | Juengling |
| 8,207,576 B2 | 6/2012 | Tran et al. |
| 8,207,583 B2 | 6/2012 | Juengling |
| 8,266,556 B2 | 9/2012 | Wells |
| 8,274,106 B2 | 9/2012 | Abbott et al. |
| 8,278,223 B2 | 10/2012 | Kang |
| 8,287,957 B2 * | 10/2012 | Nealey et al. ............ 427/256 |
| 8,349,699 B2 | 1/2013 | Patraw et al. |
| 8,372,295 B2 | 2/2013 | Millward |
| 8,390,034 B2 | 3/2013 | Tran |
| 8,431,971 B2 | 4/2013 | Tran |
| 8,440,515 B2 | 5/2013 | Tang et al. |
| 8,518,788 B2 | 8/2013 | Lee |
| 8,592,940 B2 | 11/2013 | Sandhu et al. |
| 8,601,410 B2 | 12/2013 | Wells |
| 8,772,840 B2 | 7/2014 | Juengling |
| 8,829,602 B2 | 9/2014 | Juengling |
| 8,884,966 B2 | 11/2014 | Hao et al. |
| 8,932,960 B2 | 1/2015 | Tran |
| 2001/0000918 A1 | 5/2001 | Forbes et al. |
| 2001/0001722 A1 | 5/2001 | Forbes et al. |
| 2001/0002304 A1 | 5/2001 | Pierrat et al. |
| 2001/0004549 A1 | 6/2001 | Arndt et al. |
| 2001/0005631 A1 | 6/2001 | Kim et al. |
| 2001/0012223 A1 | 8/2001 | Kohyama |
| 2001/0014533 A1 | 8/2001 | Sun |
| 2001/0017390 A1 | 8/2001 | Long et al. |
| 2001/0019870 A1 | 9/2001 | Noble |
| 2001/0019893 A1 | 9/2001 | Prall et al. |
| 2001/0023045 A1 | 9/2001 | Pierrat et al. |
| 2001/0025973 A1 | 10/2001 | Yamada et al. |
| 2001/0026974 A1 | 10/2001 | Reinberg |
| 2001/0028080 A1 | 10/2001 | Himeno et al. |
| 2001/0029077 A1 | 10/2001 | Noble et al. |
| 2001/0030338 A1 | 10/2001 | Noble |
| 2001/0033000 A1 | 10/2001 | Misty |
| 2001/0038111 A1 | 11/2001 | DeBoer et al. |
| 2001/0038123 A1 | 11/2001 | Yu |
| 2001/0039091 A1 | 11/2001 | Nakagawa |
| 2001/0040273 A1 | 11/2001 | Hueting et al. |
| 2001/0044181 A1 | 11/2001 | Nakamura |
| 2001/0052617 A1 | 12/2001 | Kitada et al. |
| 2002/0000608 A1 | 1/2002 | Harada |
| 2002/0001891 A1 | 1/2002 | Kim et al. |
| 2002/0001960 A1 | 1/2002 | Wu et al. |
| 2002/0006699 A1 | 1/2002 | Noble et al. |
| 2002/0008243 A1 | 1/2002 | Goetz et al. |
| 2002/0010284 A1 | 1/2002 | Nishiguchi |
| 2002/0022339 A1 | 2/2002 | Kirchhoff |
| 2002/0024081 A1 | 2/2002 | Gratz |
| 2002/0024091 A1 | 2/2002 | Mo |
| 2002/0028456 A1 | 3/2002 | Mansky |
| 2002/0030203 A1 | 3/2002 | Fitzgerald |
| 2002/0030214 A1 | 3/2002 | Horiguchi |
| 2002/0030221 A1 | 3/2002 | Sandhu et al. |
| 2002/0030222 A1 | 3/2002 | Agarwal |
| 2002/0030227 A1 | 3/2002 | Bulsara et al. |
| 2002/0038886 A1 | 4/2002 | Mo |
| 2002/0039826 A1 | 4/2002 | Reinberg |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0056887 A1 | 5/2002 | Horstmann et al. |
| 2002/0063110 A1 | 5/2002 | Cantell et al. |
| 2002/0068243 A1 | 6/2002 | Hwang et al. |
| 2002/0079557 A1 | 6/2002 | Ahn et al. |
| 2002/0086479 A1 | 7/2002 | Reinberg |
| 2002/0090779 A1 | 7/2002 | Jang |
| 2002/0094619 A1 | 7/2002 | Mandelman et al. |
| 2002/0094622 A1 | 7/2002 | Sneelal et al. |
| 2002/0094688 A1 | 7/2002 | Mitsuiki |
| 2002/0098654 A1 | 7/2002 | Durcan et al. |
| 2002/0098655 A1 | 7/2002 | Zheng et al. |
| 2002/0098657 A1 | 7/2002 | Alavi et al. |
| 2002/0102817 A1 | 8/2002 | Chen et al. |
| 2002/0102848 A1 | 8/2002 | Xiang et al. |
| 2002/0109173 A1 | 8/2002 | Forbes et al. |
| 2002/0109176 A1 | 8/2002 | Forbes et al. |
| 2002/0123167 A1 | 9/2002 | Fitzgerald |
| 2002/0123216 A1 | 9/2002 | Yokoyama et al. |
| 2002/0125471 A1 | 9/2002 | Fitzgerald et al. |
| 2002/0125497 A1 | 9/2002 | Fitzgerald |
| 2002/0125536 A1 | 9/2002 | Iwasa et al. |
| 2002/0125538 A1 | 9/2002 | Abedifard et al. |
| 2002/0127796 A1 | 9/2002 | Hofmann et al. |
| 2002/0127798 A1 | 9/2002 | Prall |
| 2002/0127810 A1 | 9/2002 | Nakamura |
| 2002/0130348 A1 | 9/2002 | Tran |
| 2002/0130378 A1 | 9/2002 | Forbes et al. |
| 2002/0130686 A1 | 9/2002 | Forbes |
| 2002/0135029 A1 | 9/2002 | Ping et al. |
| 2002/0135030 A1 | 9/2002 | Horikawa |
| 2002/0151206 A1 | 10/2002 | Yeomans et al. |
| 2002/0153579 A1 | 10/2002 | Yamamoto |
| 2002/0153589 A1 | 10/2002 | Oh |
| 2002/0153614 A1 | 10/2002 | Ema et al. |
| 2002/0158273 A1 | 10/2002 | Satoh et al. |
| 2002/0160557 A1 | 10/2002 | Peake et al. |
| 2002/0163026 A1 | 11/2002 | Park |
| 2002/0163039 A1 | 11/2002 | Cleventer et al. |
| 2002/0166107 A1 | 11/2002 | Capodieci et al. |
| 2002/0167048 A1 | 11/2002 | Tweet et al. |
| 2002/0168864 A1 | 11/2002 | Cheng et al. |
| 2002/0179946 A1 | 12/2002 | Hara et al. |
| 2002/0179956 A1 | 12/2002 | McTeer et al. |
| 2002/0182847 A1 | 12/2002 | Yokoyama et al. |
| 2002/0182871 A1 | 12/2002 | Lu et al. |
| 2002/0187578 A1 | 12/2002 | Hong |
| 2002/0192911 A1 | 12/2002 | Parke |
| 2003/0001200 A1 | 1/2003 | Divakaruni et al. |
| 2003/0001290 A1 | 1/2003 | Nitayama et al. |
| 2003/0006410 A1 | 1/2003 | Doyle |
| 2003/0008438 A1 | 1/2003 | Abbott et al. |
| 2003/0008461 A1 | 1/2003 | Forbes et al. |
| 2003/0010971 A1 | 1/2003 | Zhang et al. |
| 2003/0011032 A1 | 1/2003 | Umebayashi |
| 2003/0015757 A1 | 1/2003 | Ohsawa |
| 2003/0015766 A1 | 1/2003 | Abbott et al. |
| 2003/0020102 A1 | 1/2003 | Gajda |
| 2003/0025157 A1 | 2/2003 | Ho et al. |
| 2003/0034529 A1 | 2/2003 | Fitzgerald et al. |

(56) References Cited

U.S. PATENT DOCUMENTS

| | | |
|---|---|---|
| 2003/0040158 A1 | 2/2003 | Saitoh |
| 2003/0040186 A1 | 2/2003 | Juengling et al. |
| 2003/0042512 A1 | 3/2003 | Gonzalez |
| 2003/0042542 A1 | 3/2003 | Maegawa et al. |
| 2003/0042555 A1 | 3/2003 | Kitada et al. |
| 2003/0044722 A1 | 3/2003 | Hsu et al. |
| 2003/0057439 A1 | 3/2003 | Fitzgerald |
| 2003/0068883 A1 | 4/2003 | Ajmera et al. |
| 2003/0085420 A1 | 5/2003 | Ito et al. |
| 2003/0085422 A1 | 5/2003 | Amali et al. |
| 2003/0087501 A1 | 5/2003 | Park |
| 2003/0089901 A1 | 5/2003 | Fitzgerald |
| 2003/0090002 A1 | 5/2003 | Sugawara et al. |
| 2003/0092238 A1 | 5/2003 | Eriguchi |
| 2003/0094636 A1 | 5/2003 | Maeda |
| 2003/0094651 A1 | 5/2003 | Suh |
| 2003/0104658 A1 | 6/2003 | Furukawa et al. |
| 2003/0109102 A1 | 6/2003 | Kujirai et al. |
| 2003/0113987 A1 | 6/2003 | Hayamizu |
| 2003/0119307 A1 | 6/2003 | Bekiaris et al. |
| 2003/0127426 A1 | 7/2003 | Chang et al. |
| 2003/0129001 A1 | 7/2003 | Kisu et al. |
| 2003/0129543 A1 | 7/2003 | Hwang et al. |
| 2003/0132480 A1 | 7/2003 | Chau et al. |
| 2003/0134468 A1 | 7/2003 | Wang et al. |
| 2003/0146461 A1 | 8/2003 | Beer et al. |
| 2003/0153146 A1 | 8/2003 | Won et al. |
| 2003/0157436 A1 | 8/2003 | Manger et al. |
| 2003/0157774 A1 | 8/2003 | Tominari et al. |
| 2003/0161201 A1 | 8/2003 | Sommer et al. |
| 2003/0164513 A1 | 9/2003 | Ping et al. |
| 2003/0164527 A1 | 9/2003 | Sugi et al. |
| 2003/0168680 A1 | 9/2003 | Hsu |
| 2003/0169629 A1 | 9/2003 | Goebel et al. |
| 2003/0170941 A1 | 9/2003 | Colavito |
| 2003/0170955 A1 | 9/2003 | Kawamura et al. |
| 2003/0170995 A1 | 9/2003 | Chou |
| 2003/0176033 A1 | 9/2003 | Grider et al. |
| 2003/0178673 A1 | 9/2003 | Bhalla et al. |
| 2003/0178684 A1 | 9/2003 | Nakamura |
| 2003/0189233 A1 | 10/2003 | Yamashita |
| 2003/0190782 A1 | 10/2003 | Ko et al. |
| 2003/0197221 A1 | 10/2003 | Shinozaki et al. |
| 2003/0199169 A1 | 10/2003 | Jun et al. |
| 2003/0201458 A1 | 10/2003 | Clark et al. |
| 2003/0201710 A1 | 10/2003 | Rasmussen |
| 2003/0203319 A1 | 10/2003 | Lee |
| 2003/0203564 A1 | 10/2003 | McQueen et al. |
| 2003/0207207 A1 | 11/2003 | Li |
| 2003/0207555 A1 | 11/2003 | Takayanagi et al. |
| 2003/0207584 A1 | 11/2003 | Sivakumar et al. |
| 2003/0209748 A1 | 11/2003 | Basceri et al. |
| 2003/0215978 A1 | 11/2003 | Maimon et al. |
| 2003/0216050 A1 | 11/2003 | Golz et al. |
| 2003/0218199 A1 | 11/2003 | Forbes et al. |
| 2003/0227044 A1 | 12/2003 | Park |
| 2003/0227072 A1 | 12/2003 | Forbes et al. |
| 2003/0230234 A1 | 12/2003 | Nam et al. |
| 2003/0234414 A1 | 12/2003 | Brown |
| 2003/0235076 A1 | 12/2003 | Forbes |
| 2004/0000534 A1 | 1/2004 | Lipinski |
| 2004/0000686 A1 | 1/2004 | Houston |
| 2004/0002203 A1 | 1/2004 | Seshpande et al. |
| 2004/0002217 A1 | 1/2004 | Mazur et al. |
| 2004/0009644 A1 | 1/2004 | Suzuki |
| 2004/0017989 A1 | 1/2004 | So |
| 2004/0018679 A1 | 1/2004 | Yu et al. |
| 2004/0018694 A1 | 1/2004 | Lee et al. |
| 2004/0018738 A1 | 1/2004 | Liu |
| 2004/0021159 A1 | 2/2004 | Matsuoka et al. |
| 2004/0023475 A1 | 2/2004 | Bonser et al. |
| 2004/0029052 A1 | 2/2004 | Park et al. |
| 2004/0033646 A1 | 2/2004 | Tang et al. |
| 2004/0033668 A1 | 2/2004 | Cha et al. |
| 2004/0034587 A1 | 2/2004 | Amberson et al. |
| 2004/0036095 A1 | 2/2004 | Brown et al. |
| 2004/0036126 A1 | 2/2004 | Chau et al. |
| 2004/0041189 A1 | 3/2004 | Voshell et al. |
| 2004/0042256 A1 | 3/2004 | Forbes |
| 2004/0043549 A1 | 3/2004 | Sayama et al. |
| 2004/0043623 A1 | 3/2004 | Liu et al. |
| 2004/0047201 A1 | 3/2004 | Yamanaka et al. |
| 2004/0053169 A1 | 3/2004 | Kindt |
| 2004/0053475 A1 | 3/2004 | Sharma |
| 2004/0056295 A1 | 3/2004 | Agarwal et al. |
| 2004/0058522 A1 | 3/2004 | Lee |
| 2004/0061148 A1 | 4/2004 | Hsu |
| 2004/0061153 A1 | 4/2004 | Misewich et al. |
| 2004/0061156 A1 | 4/2004 | Cha |
| 2004/0063264 A1 | 4/2004 | Zheng et al. |
| 2004/0070028 A1 | 4/2004 | Azam et al. |
| 2004/0071267 A1 | 4/2004 | Jacob et al. |
| 2004/0079456 A1 | 4/2004 | Mandigo et al. |
| 2004/0079988 A1 | 4/2004 | Harari |
| 2004/0023502 A1 | 5/2004 | Tzou et al. |
| 2004/0085804 A1 | 5/2004 | Winograd et al. |
| 2004/0089892 A1 | 5/2004 | Suzuki |
| 2004/0092115 A1 | 5/2004 | Hsieh et al. |
| 2004/0104405 A1 | 6/2004 | Huang et al. |
| 2004/0105330 A1 | 6/2004 | Juengling |
| 2004/0106257 A1 | 6/2004 | Okamura et al. |
| 2004/0110340 A1 | 6/2004 | Kim et al. |
| 2004/0113207 A1 | 6/2004 | Hsu et al. |
| 2004/0125636 A1 | 7/2004 | Kurjanowicz et al. |
| 2004/0127012 A1 | 7/2004 | Jin |
| 2004/0129979 A1 | 7/2004 | Park et al. |
| 2004/0137648 A1 | 7/2004 | An |
| 2004/0137729 A1 | 7/2004 | Norman |
| 2004/0147137 A1 | 7/2004 | Hiraiwa et al. |
| 2004/0150070 A1 | 8/2004 | Okada et al. |
| 2004/0150111 A1 | 8/2004 | Shimazu et al. |
| 2004/0156255 A1 | 8/2004 | Tsukikawa |
| 2004/0157353 A1 | 8/2004 | Ouyang et al. |
| 2004/0159857 A1 | 8/2004 | Horita et al. |
| 2004/0165441 A1 | 8/2004 | Chevallier |
| 2004/0173844 A1 | 9/2004 | Williams et al. |
| 2004/0175628 A1 | 9/2004 | Nealey et al. |
| 2004/0180504 A1 | 9/2004 | Lee et al. |
| 2004/0184298 A1 | 9/2004 | Takahashi et al. |
| 2004/0188738 A1 | 9/2004 | Farnworth et al. |
| 2004/0195613 A1 | 10/2004 | Kweon |
| 2004/0197995 A1 | 10/2004 | Lee et al. |
| 2004/0203236 A1 | 10/2004 | Shim et al. |
| 2004/0203525 A1 | 10/2004 | Gillette et al. |
| 2004/0206996 A1 | 10/2004 | Lee et al. |
| 2004/0212024 A1 | 10/2004 | Oh et al. |
| 2004/0217391 A1 | 11/2004 | Forbes |
| 2004/0222458 A1 | 11/2004 | Hsieh et al. |
| 2004/0222490 A1 | 11/2004 | Raaijmakers et al. |
| 2004/0223363 A1 | 11/2004 | Peng |
| 2004/0224476 A1 | 11/2004 | Yamada et al. |
| 2004/0232466 A1 | 11/2004 | Birner et al. |
| 2004/0232471 A1 | 11/2004 | Shukuri |
| 2004/0235255 A1 | 11/2004 | Tanaka et al. |
| 2004/0245547 A1 | 12/2004 | Stipe |
| 2004/0256639 A1 | 12/2004 | Ouyang et al. |
| 2004/0256647 A1 | 12/2004 | Lee et al. |
| 2004/0259311 A1 | 12/2004 | Kim et al. |
| 2004/0262784 A1 | 12/2004 | Doris et al. |
| 2004/0266081 A1 | 12/2004 | Oh et al. |
| 2004/0266112 A1 | 12/2004 | Skotnicki et al. |
| 2004/0266118 A1 | 12/2004 | Han et al. |
| 2005/0003599 A1 | 1/2005 | Yeo et al. |
| 2005/0012131 A1 | 1/2005 | Chen et al. |
| 2005/0012149 A1 | 1/2005 | Liu et al. |
| 2005/0017240 A1 | 1/2005 | Fazan |
| 2005/0017281 A1 | 1/2005 | Lowrey |
| 2005/0023588 A1 | 2/2005 | Sandhu et al. |
| 2005/0029601 A1 | 2/2005 | Chen et al. |
| 2005/0040465 A1 | 2/2005 | Park et al. |
| 2005/0042833 A1 | 2/2005 | Park et al. |
| 2005/0045918 A1 | 3/2005 | Reith |
| 2005/0045965 A1 | 3/2005 | Lin et al. |
| 2005/0046048 A1 | 3/2005 | Yun et al. |

(56) References Cited

U.S. PATENT DOCUMENTS

| | | |
|---|---|---|
| 2005/0048714 A1 | 3/2005 | Noble |
| 2005/0051822 A1 | 3/2005 | Manning |
| 2005/0051866 A1 | 3/2005 | Wang et al. |
| 2005/0054159 A1 | 3/2005 | Manning et al. |
| 2005/0059242 A1 | 3/2005 | Cabral et al. |
| 2005/0063224 A1 | 3/2005 | Fazan et al. |
| 2005/0064691 A1 | 3/2005 | Kim |
| 2005/0066892 A1 | 3/2005 | Dip et al. |
| 2005/0074949 A1 | 4/2005 | Jung et al. |
| 2005/0079662 A1 | 4/2005 | Miki |
| 2005/0079721 A1 | 4/2005 | Buerger et al. |
| 2005/0087892 A1 | 4/2005 | Hsu et al. |
| 2005/0095756 A1 | 5/2005 | Tang et al. |
| 2005/0095767 A1 | 5/2005 | Tang et al. |
| 2005/0101075 A1 | 5/2005 | Tang |
| 2005/0104107 A1 | 5/2005 | Fazan et al. |
| 2005/0104110 A1 | 5/2005 | Yeo et al. |
| 2005/0104117 A1 | 5/2005 | Mikolajick et al. |
| 2005/0104156 A1 | 5/2005 | Wasshuber |
| 2005/0106795 A1 | 5/2005 | Tang et al. |
| 2005/0106820 A1 | 5/2005 | Tran |
| 2005/0106838 A1 | 5/2005 | Lim et al. |
| 2005/0112811 A1 | 5/2005 | Hsu et al. |
| 2005/0112812 A1 | 5/2005 | Jang |
| 2005/0112854 A1 | 5/2005 | Ito et al. |
| 2005/0112886 A1 | 5/2005 | Asakawa et al. |
| 2005/0124130 A1 | 6/2005 | Mathew et al. |
| 2005/0136606 A1 | 6/2005 | Rulke et al. |
| 2005/0136616 A1 | 6/2005 | Cho et al. |
| 2005/0139895 A1 | 6/2005 | Koh |
| 2005/0139930 A1 | 6/2005 | Chidambarrao et al. |
| 2005/0142497 A1 | 6/2005 | Ryou |
| 2005/0145913 A1 | 7/2005 | Katsumata et al. |
| 2005/0148136 A1 | 7/2005 | Brask et al. |
| 2005/0151206 A1 | 7/2005 | Schwerin |
| 2005/0153530 A1 | 7/2005 | Ku et al. |
| 2005/0153562 A1 | 7/2005 | Furukawa et al. |
| 2005/0156208 A1 | 7/2005 | Lin et al. |
| 2005/0156230 A1 | 7/2005 | Forbes |
| 2005/0158949 A1 | 7/2005 | Manning |
| 2005/0164443 A1 | 7/2005 | Kim et al. |
| 2005/0164454 A1 | 7/2005 | Leslie |
| 2005/0164489 A1 | 7/2005 | Kloster |
| 2005/0167394 A1 | 8/2005 | Liu et al. |
| 2005/0167741 A1 | 8/2005 | Divakaruni et al. |
| 2005/0167751 A1 | 8/2005 | Nakajima et al. |
| 2005/0176210 A1 | 8/2005 | Kim et al. |
| 2005/0184348 A1 | 8/2005 | Youn et al. |
| 2005/0186705 A1 | 8/2005 | Jackson et al. |
| 2005/0186746 A1 | 8/2005 | Lee et al. |
| 2005/0199949 A1 | 9/2005 | Chau et al. |
| 2005/0202651 A1 | 9/2005 | Akram |
| 2005/0202656 A1 | 9/2005 | Ito et al. |
| 2005/0202672 A1 | 9/2005 | Divakaruni et al. |
| 2005/0207264 A1 | 9/2005 | Hsieh et al. |
| 2005/0215039 A1 | 9/2005 | Hill et al. |
| 2005/0263826 A1 | 12/2005 | Yang |
| 2005/0266631 A1 | 12/2005 | Kim et al. |
| 2005/0272259 A1 | 12/2005 | Hong |
| 2005/0275014 A1 | 12/2005 | Kim |
| 2005/0275042 A1 | 12/2005 | Hwang et al. |
| 2005/0277249 A1 | 12/2005 | Juengling |
| 2005/0277276 A1 | 12/2005 | Stephens et al. |
| 2005/0285153 A1 | 12/2005 | Weis et al. |
| 2005/0287738 A1 | 12/2005 | Cho et al. |
| 2005/0287780 A1 | 12/2005 | Manning et al. |
| 2005/0287795 A1 | 12/2005 | Torek et al. |
| 2006/0001107 A1 | 1/2006 | Kim et al. |
| 2006/0003182 A1 | 1/2006 | Lane et al. |
| 2006/0006444 A1 | 1/2006 | Leslie |
| 2006/0006502 A1 | 1/2006 | Yin et al. |
| 2006/0011947 A1 | 1/2006 | Juengling |
| 2006/0011959 A1 | 1/2006 | Park et al. |
| 2006/0011996 A1 | 1/2006 | Wu et al. |
| 2006/0014344 A1 | 1/2006 | Manning |
| 2006/0017088 A1 | 1/2006 | Abbott et al. |
| 2006/0019488 A1 | 1/2006 | Liaw |
| 2006/0022248 A1 | 2/2006 | Fischer et al. |
| 2006/0024940 A1 | 2/2006 | Furukawa et al. |
| 2006/0024945 A1 | 2/2006 | Kim et al. |
| 2006/0024958 A1 | 2/2006 | Ali |
| 2006/0024966 A1 | 2/2006 | Mitsuo et al. |
| 2006/0028859 A1 | 2/2006 | Forbes et al. |
| 2006/0033678 A1 | 2/2006 | Lubomirsky et al. |
| 2006/0043431 A1 | 3/2006 | Eppich |
| 2006/0043449 A1 | 3/2006 | Tang et al. |
| 2006/0043450 A1 | 3/2006 | Tang et al. |
| 2006/0043617 A1 | 3/2006 | Abbott |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046420 A1 | 3/2006 | Manning |
| 2006/0046422 A1 | 3/2006 | Tran et al. |
| 2006/0046424 A1 | 3/2006 | Chance et al. |
| 2006/0046438 A1 | 3/2006 | Kirby |
| 2006/0046484 A1* | 3/2006 | Abatchev et al. ............ 438/689 |
| 2006/0049455 A1 | 3/2006 | Jang et al. |
| 2006/0051918 A1 | 3/2006 | Busch et al. |
| 2006/0056474 A1 | 3/2006 | Fujimoto et al. |
| 2006/0063344 A1 | 3/2006 | Manning et al. |
| 2006/0063345 A1 | 3/2006 | Manning et al. |
| 2006/0073613 A1 | 4/2006 | Aggarwal et al. |
| 2006/0076090 A1 | 4/2006 | Mandigo et al. |
| 2006/0081884 A1 | 4/2006 | Abbott |
| 2006/0083058 A1 | 4/2006 | Ohsawa |
| 2006/0083996 A1 | 4/2006 | Kim |
| 2006/0094180 A1 | 5/2006 | Doczy et al. |
| 2006/0099793 A1 | 5/2006 | Yang et al. |
| 2006/0105537 A1 | 5/2006 | Nam et al. |
| 2006/0105568 A1 | 5/2006 | Shen et al. |
| 2006/0108622 A1 | 5/2006 | Joo et al. |
| 2006/0110880 A1 | 5/2006 | Yuan |
| 2006/0113588 A1 | 6/2006 | Wu |
| 2006/0115951 A1 | 6/2006 | Mosley |
| 2006/0115952 A1 | 6/2006 | Wu |
| 2006/0115978 A1 | 6/2006 | Specht |
| 2006/0121672 A1 | 6/2006 | Basceri et al. |
| 2006/0125006 A1 | 6/2006 | Harada et al. |
| 2006/0134556 A1 | 6/2006 | Nealey et al. |
| 2006/0148190 A1 | 7/2006 | Busch |
| 2006/0157795 A1 | 7/2006 | Chen et al. |
| 2006/0166443 A1 | 7/2006 | Forbes |
| 2006/0167741 A1 | 7/2006 | Ramachandra |
| 2006/0172504 A1 | 8/2006 | Sinitsky et al. |
| 2006/0172540 A1 | 8/2006 | Marks et al. |
| 2006/0176210 A1 | 8/2006 | Nakamura et al. |
| 2006/0177979 A1 | 8/2006 | Tu |
| 2006/0180857 A1 | 8/2006 | Loechelt et al. |
| 2006/0180866 A1 | 8/2006 | Zhu et al. |
| 2006/0186451 A1 | 8/2006 | Dusberg et al. |
| 2006/0189150 A1 | 8/2006 | Jung |
| 2006/0192249 A1 | 8/2006 | Kim et al. |
| 2006/0194410 A1 | 8/2006 | Sugaya |
| 2006/0204898 A1 | 9/2006 | Gutsche et al. |
| 2006/0211196 A1 | 9/2006 | Tanaka et al. |
| 2006/0211211 A1 | 9/2006 | Sandhu et al. |
| 2006/0211260 A1 | 9/2006 | Tran et al. |
| 2006/0214243 A1 | 9/2006 | Sakoda et al. |
| 2006/0216293 A1 | 9/2006 | Couto et al. |
| 2006/0216894 A1 | 9/2006 | Parekh et al. |
| 2006/0216922 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0237762 A1 | 10/2006 | Park |
| 2006/0240361 A1 | 10/2006 | Lee et al. |
| 2006/0240634 A1 | 10/2006 | Tran |
| 2006/0246217 A1 | 11/2006 | Weidman et al. |
| 2006/0249798 A1 | 11/2006 | Manning |
| 2006/0250593 A1 | 11/2006 | Nishii |
| 2006/0252264 A1 | 11/2006 | Kimizuka et al. |
| 2006/0258084 A1 | 11/2006 | Tang et al. |
| 2006/0258107 A1 | 11/2006 | Tang et al. |

(56) References Cited

U.S. PATENT DOCUMENTS

| | | |
|---|---|---|
| 2006/0258109 A1 | 11/2006 | Juengling |
| 2006/0258159 A1 | 11/2006 | Colburn et al. |
| 2006/0258162 A1 | 11/2006 | Abatchev et al. |
| 2006/0261393 A1 | 11/2006 | Tang et al. |
| 2006/0261440 A1 | 11/2006 | Manning |
| 2006/0262511 A1 | 11/2006 | Abatchev et al. |
| 2006/0263699 A1 | 11/2006 | Abatchev et al. |
| 2006/0263968 A1 | 11/2006 | Manning |
| 2006/0263979 A1 | 11/2006 | Nejad et al. |
| 2006/0264001 A1 | 11/2006 | Tran et al. |
| 2006/0264002 A1 | 11/2006 | Tran et al. |
| 2006/0264043 A1 | 11/2006 | Stewart et al. |
| 2006/0267075 A1 | 11/2006 | Sandhu et al. |
| 2006/0273456 A1 | 12/2006 | Sant et al. |
| 2006/0278911 A1 | 12/2006 | Eppich |
| 2006/0281239 A1 | 12/2006 | Matthew |
| 2006/0281250 A1 | 12/2006 | Schloesser |
| 2006/0281266 A1 | 12/2006 | Wells |
| 2006/0284224 A1 | 12/2006 | Shuto |
| 2006/0286740 A1 | 12/2006 | Lin et al. |
| 2006/0286783 A1 | 12/2006 | Papanu et al. |
| 2006/0289914 A1 | 12/2006 | Juengling |
| 2007/0001219 A1 | 1/2007 | Radosavljevic |
| 2007/0001222 A1 | 1/2007 | Orlowski et al. |
| 2007/0001233 A1 | 1/2007 | Schwan et al. |
| 2007/0003881 A1 | 1/2007 | Ito et al. |
| 2007/0004145 A1 | 1/2007 | Kim et al. |
| 2007/0007571 A1 | 1/2007 | Lindsay et al. |
| 2007/0018345 A1 | 1/2007 | Chao |
| 2007/0024321 A1 | 2/2007 | Lin et al. |
| 2007/0026672 A1 | 2/2007 | Tang et al. |
| 2007/0032014 A1 | 2/2007 | Sandhu et al. |
| 2007/0037101 A1 | 2/2007 | Morioka |
| 2007/0040268 A1 | 2/2007 | Sherrer et al. |
| 2007/0045699 A1 | 3/2007 | Liao et al. |
| 2007/0045712 A1 | 3/2007 | Haller et al. |
| 2007/0045736 A1 | 3/2007 | Yagishita |
| 2007/0045780 A1 | 3/2007 | Akram et al. |
| 2007/0045799 A1 | 3/2007 | Liao et al. |
| 2007/0048674 A1 | 3/2007 | Wells |
| 2007/0048941 A1 | 3/2007 | Tang et al. |
| 2007/0048942 A1 | 3/2007 | Hanson et al. |
| 2007/0048976 A1 | 3/2007 | Raghu |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0051997 A1 | 3/2007 | Haller et al. |
| 2007/0057304 A1 | 3/2007 | Boescke et al. |
| 2007/0066010 A1 | 3/2007 | Ando |
| 2007/0077524 A1 | 4/2007 | Koh |
| 2007/0087502 A1 | 4/2007 | Chung-Zen |
| 2007/0090487 A1 | 4/2007 | Babich et al. |
| 2007/0093022 A1 | 4/2007 | Basceri |
| 2007/0096204 A1 | 5/2007 | Shiratake |
| 2007/0099328 A1 | 5/2007 | Chiang et al. |
| 2007/0099423 A1 | 5/2007 | Chen et al. |
| 2007/0105323 A1 | 5/2007 | Tang et al. |
| 2007/0117310 A1 | 5/2007 | Bai et al. |
| 2007/0122955 A1 | 5/2007 | Luo et al. |
| 2007/0128856 A1 | 6/2007 | Tran et al. |
| 2007/0132018 A1 | 6/2007 | Kotani et al. |
| 2007/0138526 A1 | 6/2007 | Tran et al. |
| 2007/0145009 A1 | 6/2007 | Fucsko et al. |
| 2007/0145450 A1 | 6/2007 | Wang et al. |
| 2007/0148968 A1 | 6/2007 | Kwon et al. |
| 2007/0148984 A1 | 6/2007 | Abatchev et al. |
| 2007/0158719 A1 | 7/2007 | Wang |
| 2007/0166920 A1 | 7/2007 | Tang et al. |
| 2007/0172994 A1 | 7/2007 | Yang |
| 2007/0178641 A1 | 8/2007 | Kim et al. |
| 2007/0181929 A1 | 8/2007 | Juengling |
| 2007/0187358 A1 | 8/2007 | Van Haren et al. |
| 2007/0190728 A1 | 8/2007 | Sreekantham et al. |
| 2007/0190762 A1 | 8/2007 | Franciscus Van Haren et al. |
| 2007/0196973 A1 | 8/2007 | Park et al. |
| 2007/0196978 A1 | 8/2007 | Manning |
| 2007/0202686 A1 | 8/2007 | Dixit et al. |
| 2007/0205438 A1 | 9/2007 | Juengling |
| 2007/0207622 A1 | 9/2007 | Rana et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0224823 A1 | 9/2007 | Sandhu |
| 2007/0228455 A1 | 10/2007 | Sasago et al. |
| 2007/0238259 A1 | 10/2007 | Bhat |
| 2007/0238299 A1 | 10/2007 | Niroomand et al. |
| 2007/0238308 A1 | 10/2007 | Niroomand et al. |
| 2007/0249170 A1 | 10/2007 | Kewley |
| 2007/0257323 A1 | 11/2007 | Tsui et al. |
| 2007/0261016 A1 | 11/2007 | Sandhu et al. |
| 2007/0275309 A1 | 11/2007 | Liu |
| 2007/0281219 A1 | 12/2007 | Sandhu |
| 2007/0296017 A1 | 12/2007 | Mawatari |
| 2008/0012056 A1 | 1/2008 | Gonzalez |
| 2008/0012070 A1 | 1/2008 | Juengling |
| 2008/0042179 A1 | 2/2008 | Haller et al. |
| 2008/0054350 A1 | 3/2008 | Breitwisch et al. |
| 2008/0057610 A1 | 3/2008 | Lee et al. |
| 2008/0057687 A1 | 3/2008 | Hunt et al. |
| 2008/0057692 A1 | 3/2008 | Wells et al. |
| 2008/0061346 A1 | 3/2008 | Tang et al. |
| 2008/0070165 A1 | 3/2008 | Fischer et al. |
| 2008/0070356 A1 | 3/2008 | Brown et al. |
| 2008/0081461 A1 | 4/2008 | Lee et al. |
| 2008/0085612 A1 | 4/2008 | Smythe et al. |
| 2008/0090416 A1 | 4/2008 | Raghu et al. |
| 2008/0090419 A1 | 4/2008 | Koh et al. |
| 2008/0099816 A1 | 5/2008 | Brown |
| 2008/0099847 A1 | 5/2008 | Tang et al. |
| 2008/0113483 A1 | 5/2008 | Wells |
| 2008/0142882 A1 | 6/2008 | Tang et al. |
| 2008/0166856 A1 | 7/2008 | Parekh et al. |
| 2008/0171137 A1 | 7/2008 | Kim et al. |
| 2008/0174430 A1 | 7/2008 | Scott et al. |
| 2008/0179635 A1 | 7/2008 | Gossner |
| 2008/0261156 A1 | 10/2008 | Ryou et al. |
| 2008/0292991 A1 | 11/2008 | Wallow |
| 2008/0299774 A1 | 12/2008 | Sandhu |
| 2008/0311719 A1 | 12/2008 | Tang et al. |
| 2009/0035665 A1 | 2/2009 | Tran |
| 2009/0047769 A1 | 2/2009 | Bhat et al. |
| 2009/0115064 A1 | 5/2009 | Sandhu et al. |
| 2009/0130807 A1 | 5/2009 | Noble |
| 2009/0140439 A1 | 6/2009 | Ju et al. |
| 2009/0149026 A1 | 6/2009 | Zhou et al. |
| 2009/0152645 A1 | 6/2009 | Tran |
| 2009/0173994 A1 | 7/2009 | Min et al. |
| 2009/0176011 A1 | 7/2009 | Kiehlbauch |
| 2009/0194824 A1 | 8/2009 | Wirbeleit |
| 2009/0197379 A1 | 8/2009 | Leslie |
| 2009/0207649 A1 | 8/2009 | Tang et al. |
| 2009/0251845 A1 | 10/2009 | Kiehlbauch |
| 2009/0311845 A1 | 12/2009 | Tang et al. |
| 2010/0006983 A1 | 1/2010 | Gutsche et al. |
| 2010/0009512 A1 | 1/2010 | Fishburn |
| 2010/0041204 A1 | 2/2010 | Kiehlbauch |
| 2010/0112798 A1 | 5/2010 | Lai et al. |
| 2010/0297819 A1 | 11/2010 | Noble |
| 2011/0033786 A1 | 2/2011 | Sandhu |
| 2011/0042755 A1 | 2/2011 | Juengling |
| 2011/0140187 A1 | 6/2011 | Lindholm et al. |
| 2011/0151655 A1 | 6/2011 | Chan et al. |
| 2011/0183522 A1 | 7/2011 | Mikhaylichenko et al. |
| 2011/0227140 A1 | 9/2011 | Ishiduki et al. |
| 2011/0227167 A1 | 9/2011 | Chuang et al. |
| 2012/0009772 A1 | 1/2012 | Mathew et al. |
| 2012/0138571 A1 | 6/2012 | Black et al. |
| 2012/0225243 A1 | 9/2012 | Millward |

(56) References Cited

U.S. PATENT DOCUMENTS

| | | | |
|---|---|---|---|
| 2013/0230959 A1 | 9/2013 | Tang et al. | |
| 2014/0284672 A1 | 9/2014 | Juengling | |

FOREIGN PATENT DOCUMENTS

| | | |
|---|---|---|
| CN | 1905193 | 1/2007 |
| CN | 200880121431.6 | 4/2013 |
| CN | 200880121431.6 | 10/2013 |
| DE | 280551 | 7/1990 |
| DE | 4408764 | 2/1994 |
| DE | 42 36 609 | 5/1994 |
| DE | 19928781 | 7/2000 |
| DE | 4447804 | 1/2002 |
| DE | 10361695 | 2/2005 |
| EP | 0 227 303 | 7/1987 |
| EP | 0315803 | 5/1989 |
| EP | 0453998 | 10/1991 |
| EP | 0 491 408 | 6/1992 |
| EP | 0491408 A3 | 9/1992 |
| EP | 0744772 | 11/1996 |
| EP | 0936673 | 8/1999 |
| EP | 0967643 | 12/1999 |
| EP | 1003219 | 5/2000 |
| EP | 1061592 | 12/2000 |
| EP | 1067597 | 1/2001 |
| EP | 1089344 | 4/2001 |
| EP | 1271632 | 1/2003 |
| EP | 1089344 A3 | 7/2003 |
| EP | 1326280 | 7/2003 |
| EP | 1 357 433 | 10/2003 |
| EP | 1391939 | 2/2004 |
| EP | 0681338 | 10/2004 |
| EP | 0936623 | 4/2005 |
| EP | 06736975.1 | 12/2008 |
| EP | 1696477 | 9/2009 |
| EP | 1125167 | 5/2010 |
| EP | 06790064.7 | 2/2011 |
| EP | 08861157.9 | 2/2011 |
| EP | 05790231.4 | 4/2011 |
| EP | 100114743 | 7/2011 |
| EP | 08861157 | 11/2013 |
| EP | 08845706.4 | 7/2014 |
| GB | 2404083 | 1/2005 |
| JP | 51-147280 | 12/1976 |
| JP | 52-48983 | 4/1977 |
| JP | 53-148389 | 12/1978 |
| JP | 57-048237 | 3/1982 |
| JP | 58-220464 | 12/1983 |
| JP | 59-107518 | 6/1984 |
| JP | 60-167349 | 8/1985 |
| JP | 62-045058 | 2/1987 |
| JP | 63-260166 | 10/1988 |
| JP | 64-28876 | 1/1989 |
| JP | 64-035916 | 2/1989 |
| JP | 64-042132 | 2/1989 |
| JP | 01-100948 | 4/1989 |
| JP | 01-119028 | 5/1989 |
| JP | 01-124219 | 5/1989 |
| JP | 02-143527 | 6/1990 |
| JP | 02-219253 | 8/1990 |
| JP | 03-003375 | 1/1991 |
| JP | 03-155165 | 7/1991 |
| JP | 03-219677 | 9/1991 |
| JP | 03-239332 | 10/1991 |
| JP | 04-014253 | 1/1992 |
| JP | 04-014255 | 1/1992 |
| JP | 04-085872 | 3/1992 |
| JP | 04-130630 | 5/1992 |
| JP | 04-155810 | 5/1992 |
| JP | 04-162528 | 6/1992 |
| JP | 1992-307969 | 10/1992 |
| JP | 05-502548 | 4/1993 |
| JP | 05-343370 | 12/1993 |
| JP | 06-045431 | 2/1994 |
| JP | 06-097450 | 4/1994 |
| JP | 06-112481 | 4/1994 |
| JP | 06-216084 | 8/1994 |
| JP | 06-268174 | 9/1994 |
| JP | 07-078977 | 3/1995 |
| JP | 07-106435 | 4/1995 |
| JP | 07-297297 | 11/1995 |
| JP | 07-307333 | 11/1995 |
| JP | 07-326562 | 12/1995 |
| JP | H08-55908 | 2/1996 |
| JP | H08-55920 | 2/1996 |
| JP | 08-23672 | 9/1996 |
| JP | 08-264512 | 10/1996 |
| JP | 08-274278 | 10/1996 |
| JP | 09-129837 | 5/1997 |
| JP | 09-293793 | 11/1997 |
| JP | 10-116907 | 5/1998 |
| JP | 10-150027 | 6/1998 |
| JP | 10-189912 | 7/1998 |
| JP | 10-209407 | 8/1998 |
| JP | 02-002172 | 1/1999 |
| JP | 11-026719 | 1/1999 |
| JP | 11-097652 | 4/1999 |
| JP | 11-191615 | 7/1999 |
| JP | 11-261056 | 9/1999 |
| JP | 11-274478 | 10/1999 |
| JP | 2000-022101 | 1/2000 |
| JP | 2000-091524 | 3/2000 |
| JP | 2000-196038 | 7/2000 |
| JP | 2000-208434 | 7/2000 |
| JP | 2000-208762 | 7/2000 |
| JP | 2000-357736 | 12/2000 |
| JP | 2300-353793 | 12/2000 |
| JP | 2001-024161 | 1/2001 |
| JP | 2001-036081 | 2/2001 |
| JP | 2001-110782 | 4/2001 |
| JP | 2001-189438 | 7/2001 |
| JP | 2001-210801 | 8/2001 |
| JP | 2001-345446 | 12/2001 |
| JP | 2002-151654 | 5/2002 |
| JP | 2002-184958 | 6/2002 |
| JP | 2002-194547 | 7/2002 |
| JP | 2002-208646 | 7/2002 |
| JP | 2002-530872 | 9/2002 |
| JP | 2002-359352 | 12/2002 |
| JP | 2003-007859 | 1/2003 |
| JP | 2003-017585 | 1/2003 |
| JP | 2003-023150 | 1/2003 |
| JP | 2003-077922 | 3/2003 |
| JP | 2003-086795 | 3/2003 |
| JP | 2003-109333 | 4/2003 |
| JP | 2003-142605 | 5/2003 |
| JP | 2003 155365 | 5/2003 |
| JP | 2003-249437 | 9/2003 |
| JP | 2003-258296 | 9/2003 |
| JP | 2003-264246 | 9/2003 |
| JP | 2003-273247 | 9/2003 |
| JP | 2003-297952 | 10/2003 |
| JP | 2004-014783 | 1/2004 |
| JP | 2004-193483 | 2/2004 |
| JP | 2004-503927 | 2/2004 |
| JP | 2004-071935 | 3/2004 |
| JP | 2004-072078 | 3/2004 |
| JP | 2004-080033 | 3/2004 |
| JP | 2004-111626 | 4/2004 |
| JP | 2004-128463 | 4/2004 |
| JP | 2004-140212 | 5/2004 |
| JP | 2004-152784 | 5/2004 |
| JP | 2004-520718 | 7/2004 |
| JP | 2004-247656 | 9/2004 |
| JP | 2005-019943 | 1/2005 |
| JP | 2005-032982 | 2/2005 |
| JP | 2005-039270 | 2/2005 |
| JP | 2005-060583 | 3/2005 |
| JP | 2005-097442 | 4/2005 |
| JP | 2005-142203 | 6/2005 |
| JP | 2005-150333 | 6/2005 |
| JP | 2005-175090 | 6/2005 |
| JP | 2005-093808 | 7/2005 |
| JP | 2005-197748 | 7/2005 |

(56) References Cited

FOREIGN PATENT DOCUMENTS

| | | |
|---|---|---|
| JP | 2005-277430 | 10/2005 |
| JP | 2005-354069 | 12/2005 |
| JP | 2006-032695 | 2/2006 |
| JP | 2006-135364 | 5/2006 |
| JP | 2006-237196 | 9/2006 |
| JP | 2006-334693 | 12/2006 |
| JP | 2007-273859 | 10/2007 |
| JP | 2008-218569 | 9/2008 |
| JP | 2009-054956 | 3/2009 |
| JP | 2010-522643 | 7/2010 |
| JP | 2007-530053 | 8/2010 |
| JP | 2010-527137 | 8/2010 |
| JP | 2007-530053 | 1/2011 |
| JP | 2008-529192 | 2/2011 |
| JP | 2007-515171 | 3/2011 |
| JP | 2007-530235 | 3/2011 |
| JP | 2008-529144 | 9/2011 |
| JP | 2006-351861 | 1/2012 |
| JP | 2007-515171 | 3/2012 |
| JP | 2008-529192 | 5/2012 |
| JP | 2010-539709 | 8/2013 |
| JP | 2013-242620 | 10/2014 |
| KR | 1993-0006930 | 4/1993 |
| KR | 1994-0006679 | 7/1994 |
| KR | 10-1995-0034748 | 12/1995 |
| KR | 10-0122315 | 9/1997 |
| KR | 10-1998-0012565 | 4/1998 |
| KR | 10-1999-0001440 | 1/1999 |
| KR | 10-1999-027887 | 4/1999 |
| KR | 2001-0061020 | 7/2001 |
| KR | 10-2001-108963 | 12/2001 |
| KR | 2001-0114003 | 12/2001 |
| KR | 2002-0002578 | 1/2002 |
| KR | 10-2003-0058018 | 7/2003 |
| KR | 10-2003-0074803 | 9/2003 |
| KR | 10-2005-0000896 | 1/2005 |
| KR | 10-2005-0052213 | 6/2005 |
| KR | 10-2005-0066176 | 6/2005 |
| KR | 10-0520223 | 10/2005 |
| KR | 10-0546409 | 1/2006 |
| KR | 10-2004-0109280 | 10/2006 |
| KR | 10-0640616 | 10/2006 |
| KR | 10-2010-7021228 | 9/2011 |
| KR | 10-2010-7021228 | 5/2012 |
| KR | 10-2010-7021228 | 7/2012 |
| KR | 10-2009-7006260 | 10/2013 |
| KR | 10-2008-7024116 | 12/2013 |
| KR | 10-2009-7006260 | 10/2014 |
| SG | 2010-042356 | 11/2011 |
| TW | 376582 | 12/1999 |
| TW | 439136 | 6/2001 |
| TW | 498332 | 8/2002 |
| TW | 513801 | 12/2002 |
| TW | 574746 | 2/2004 |
| TW | 428308 | 4/2004 |
| TW | 200408125 | 5/2004 |
| TW | 200408129 | 5/2004 |
| TW | 200411832 | 7/2004 |
| TW | I231042 | 4/2005 |
| TW | I235479 | 7/2005 |
| TW | I252511 | 4/2006 |
| TW | 200617957 | 6/2006 |
| TW | 263307 | 10/2006 |
| TW | 200715533 | 4/2007 |
| TW | I307160 | 3/2009 |
| TW | 200931592 | 7/2009 |
| TW | 096131938 | 5/2011 |
| TW | 096128462 | 6/2011 |
| TW | 098121062 | 8/2012 |
| TW | 097142287 | 9/2013 |
| TW | 097143566 | 12/2013 |
| TW | 097143566 | 9/2014 |
| TW | 097149200 | 11/2014 |
| WO | WO 86/03341 | 6/1986 |
| WO | WO 92/02044 | 2/1992 |
| WO | WO 94/15261 | 7/1994 |
| WO | WO 97/44826 | 11/1997 |
| WO | WO 99/36961 | 7/1999 |
| WO | WO 00/19272 | 4/2000 |
| WO | WO 01/01489 | 1/2001 |
| WO | WO 02/089182 | 11/2002 |
| WO | WO 02/089182 A3 | 11/2002 |
| WO | WO 02/099864 | 12/2002 |
| WO | WO 2004/001799 | 12/2003 |
| WO | WO 2004/003977 | 1/2004 |
| WO | WO 2004/073044 | 8/2004 |
| WO | WO 2005/010973 | 2/2005 |
| WO | WO PCT/US2004/027898 | 2/2005 |
| WO | WO PCT/US2004/030367 | 2/2005 |
| WO | WO 2005/024936 | 3/2005 |
| WO | WO 2006/028777 | 3/2005 |
| WO | WO 2005/034215 | 4/2005 |
| WO | WO PCT/US2004/034587 | 5/2005 |
| WO | WO PCT/US2004/040252 | 5/2005 |
| WO | WO 2005/062349 | 7/2005 |
| WO | WO 2005/083770 | 9/2005 |
| WO | WO PCT/US2005/006211 | 9/2005 |
| WO | WO PCT/US2005/017156 | 11/2005 |
| WO | WO 2005/119741 | 12/2005 |
| WO | WO PCT/US2005/030668 | 1/2006 |
| WO | WO PCT/US2005/030677 | 1/2006 |
| WO | WO PCT/US2005/029984 | 2/2006 |
| WO | WO 2006/026699 | 3/2006 |
| WO | WO2006/028705 | 3/2006 |
| WO | WO PCT/US2004/030367 | 3/2006 |
| WO | WO 2006/070474 | 7/2006 |
| WO | WO PCT/US2006/00829 | 7/2006 |
| WO | WO PCT/US2006/006806 | 7/2006 |
| WO | WO PCT/US2006/007739 | 7/2006 |
| WO | WO PCT/US2006/008295 | 8/2006 |
| WO | WO 2006/101695 | 9/2006 |
| WO | WO PCT/US2004/027898 | 9/2006 |
| WO | WO2006/104634 | 10/2006 |
| WO | WO 2006/112887 | 10/2006 |
| WO | WO2006/127586 | 11/2006 |
| WO | WO PCT/US2005/017156 | 11/2006 |
| WO | WO PCT/US2006/031555 | 12/2006 |
| WO | WO PCT/US2005/031094 | 1/2007 |
| WO | WO PCT/US2006/006806 | 1/2007 |
| WO | WO PCT/US2006/033421 | 1/2007 |
| WO | WO PCT/US2006/006806 | 2/2007 |
| WO | WO PCT/US2006/033703 | 2/2007 |
| WO | WO 2007/027686 | 3/2007 |
| WO | WO PCT/US2005/029984 | 3/2007 |
| WO | WO PCT/US2005/030677 | 3/2007 |
| WO | WO PCT/US2005/031094 | 3/2007 |

(56) References Cited

FOREIGN PATENT DOCUMENTS

| | | |
|---|---|---|
| WO | WO PCT/US2006/033374 | 3/2007 |
| WO | WO PCT/US2006/033420 | 4/2007 |
| WO | WO 2007/058840 | 5/2007 |
| WO | WO PCT/US2006/008295 | 5/2007 |
| WO | WO PCT/US2007/001953 | 6/2007 |
| WO | WO PCT/US2005/006211 | 7/2007 |
| WO | WO PCT/US2007/005305 | 8/2007 |
| WO | WO 2007/103147 | 9/2007 |
| WO | WO PCT/US2006/007739 | 9/2007 |
| WO | WO PCT/US2005/030668 | 10/2007 |
| WO | WO PCT/US2007/014689 | 12/2007 |
| WO | WO PCT/US2007/014689 | 1/2008 |
| WO | WO PCT/US2007/016573 | 1/2008 |
| WO | WO PCT/US2007/019592 | 2/2008 |
| WO | WO PCT/US2006/033374 | 3/2008 |
| WO | WO PCT/US2006/033420 | 3/2008 |
| WO | WO PCT/US2006/033421 | 3/2008 |
| WO | WO PCT/US2006/033703 | 3/2008 |
| WO | WO PCT/US2007/023767 | 4/2008 |
| WO | WO PCT/US2007/005305 | 5/2008 |
| WO | WO PCT/US2007/020687 | 7/2008 |
| WO | WO PCT/US2007/001953 | 8/2008 |
| WO | WO PCT/US2007/018395 | 8/2008 |
| WO | WO PCT/US2007/011524 | 9/2008 |
| WO | WO PCT/US2007/014689 | 1/2009 |
| WO | WO PCT/US2007/016573 | 2/2009 |
| WO | WO PCT/US2007/018395 | 3/2009 |
| WO | WO PCT/US2007/019592 | 3/2009 |
| WO | WO PCT/US2008/081380 | 3/2009 |
| WO | WO PCT/US2007/020687 | 4/2009 |
| WO | WO PCT/US2007/023767 | 5/2009 |
| WO | WO 2009/079517 | 6/2009 |
| WO | WO PCT/US2008/070071 | 7/2009 |
| WO | WO PCT/US2008/087029 | 7/2009 |
| WO | WO PCT/US2008/063943 | 12/2009 |
| WO | WO PCT/US2009/046946 | 1/2010 |
| WO | WO PCT/US2008/081380 | 5/2010 |
| WO | WO PCT/US2008/087029 | 6/2010 |
| WO | WO PCT/US2004/040252 | 12/2010 |
| WO | WO PCT/US2008/070071 | 12/2010 |
| WO | WO PCT/US2009/046946 | 1/2011 |
| WO | WO PCT/US2006/031555 | 10/2011 |
| WO | WO PCT/US2004/034587 | 1/2012 |

OTHER PUBLICATIONS

Sundrani et al, Guiding Polymers to Perfection: Macroscopic Alignment of Nanoscale Domains, Dec. 2003, Nano Letters 2004, vol. 4, No. 2, pp. 273-276.*
Edwards et al, Dimensions and Shapes of Block Copolymer Domains Assembled on Lithographically Defined Chemically Patterned Substrates, Dec. 2006, Macromolecules 2007, 40, pp. 90-96.*
Search Report and Written Opinion dated Mar. 14, 2012 in corresponding Singapore Patent Application No. 201002089-9.
Office Action dated Jul. 13, 2011 in U.S. Appl. No. 12/757,327.
Notice of Rejection Ground dated May 1, 2012 in corresponding Japanese Patent Application No. 2010-511238.
Cerofolini et al., "Strategies for nanoelectronics", *Microelectronic Engineering*, vol. 81, pp. 405-419, Apr. 2005.
Office Action, and its English translation, dated Mar. 26, 2015 in corresponding Korean Patent Application No. 10-2009-7027395.
U.S. Appl. No. 11/192,828 Office Action, dated Oct. 5, 2007, 8 pages.
U.S. Appl. No. 11/366,212 Office Action, dated Feb. 26, 2008, 13 pages.
U.S. Appl. No. 11/367,820 Final Office Action, dated Sep. 23, 2009, 19 pages.
U.S. Appl. No. 11/367,020 Office Action, dated Jan. 29, 2008, 16 pages.
U.S. Appl. No. 11/367,020 Office Action, dated Jan. 8, 2009, 17 pages.
U.S. Appl. No. 11/490,294 Office Action, dated Jan. 24, 2008, 10 pages.
U.S. Appl. No. 11/492,323 Office Action, dated Jun. 3, 2008, 6 pages.
U.S. Appl. No. 11/492,513 Office Action, dated May 15, 2008, 5 pages.
U.S. Appl. No. 11/670,296 Final Office Action, dated Aug. 18, 2009, 9 pages.
U.S. Appl. No. 12/116,748 Final Office Action, dated Aug. 23, 2010, 9 pages.
U.S. Appl. No. 12/324,701 Notice of Allowance, dated Feb. 9, 2010, 7 pages.
U.S. Appl. No. 12/339,610 Notice of Allowance, dated Apr. 6, 2010, 6 pages.
U.S. Appl. No. 13/053,604 Office Action, dated Jun. 13, 2012, 12 pages.
Barth, "ITRS Commodity Memory Roadmap", Proceedings of the 2003 International Workshop on Memory Technology, Design and Testing, Jul. 28-29, 2003, United States, pp. 61-63.
Cho et al. "A Novel Pillar DRAM Cell for 4Gbit and Beyond", IEEE Symposium on VLSI Technology Digest of Technical Papers, Jun. 1998, United States, pp. 38-39.
Clein, "What is Full Custom Layout Design," available online at http://www.eetimes.com/document.asp?doc_id=1277368, printed Jun. 8, 2001, 6 pages.
Cong et al., "Interconnect Layout Optimization Under Higher-Order RLC Model", Proceedings of the IEEE/ACM International Conference on Computer-Aided Design, 1997, United States, pp. 713-720.
Denton et al., "Fully Developed Dual-Gated Thin-Film SOI P-MOSFET's Fabricated in SOI Islands with an Isolated Buried Polysilicon Backgate", IEEE Electron Device Letters vol. 17, No. 11, Nov. 1996, United States, pp. 509-511.

(56) References Cited

OTHER PUBLICATIONS

Doyle et al., "High Performance Fully-Depleted Tri-Gate CMOS Transistors", IEEE Electron Device Letters vol. 24, No. 4, Apr. 2003, United States, pp. 263-265.
Doyle et al., "Tri-Gate Fully-Depleted CMOS Transistors: Fabrication, Design and Layout", IEEE Symposium on VLSI Technology Digest of Technical Papers, Jun. 2003, Japan, pp. 133-134.
Endoh et al., "2.4F2 Memory Cell Technology with Stacked-Surrounding Gate Transistor (S-SGT) DRAM", IEEE Transactions on Electron Devices vol. 48, No. 8, Aug. 2001, United States, pp. 1599-1603.
Endoh et al., "Novel Ultrahigh-Density Flash Memory with a Stacked-Surrounding Gate Transistor (S-SGT) Structured Cell", IEEE Transactions on Electron Devices vol. 50, No. 4, Apr. 2003, United States, pp. 945-951.
Goebel et al., "Fully Depleted Surrounding Gate Transistor (SGT) for 70 nm DRAM and Beyond", IEEE International Electron Devices Meeting, Dec. 2002, United States, pp. 275-278.
Helmbold et al., "Optical Absorption of Amorphous Hydrogenated Carbon Thin Films", Thin Solid Films 283, 1996, Netherlands, pp. 196-203.
Huang et al., "Sub-50 nm P-Channel FinFet", IEEE Transactions on Electron Devices vol. 48, No. 5, May 2001, United States, pp. 880-886.
Kalavade et al., "A Novel Sub-10nm Transistor", IEEE Device Research Conference, Jun. 2000, United States, pp. 71-72.
Kedzierski et al., "High-Performance Symmetric-Gate and CMOS-Compatible Vt Asymmetric-Gate FinFet Devices", IEEE International Electron Devices Meeting Paper 19.5, 2001, United States, 4 pages.
Lim et al., "Atomic Layer Deposition of Transistion Metals", Nature vol. 2, Nov. 2003, United Kingdom, pp. 749-754.
Madou, "Fundamentals of Microfabrication: The Science of Miniaturization" 2002, CRC Press, Edition 2, United States, p. 302.
Miyano et al., "Numerical Analysis of a Cylindrical Thin-Pillar Transistor (CYNTHIA)", IEEE Transactions on Electron Devices vol. 39, No. 8, Aug. 1992, United States, pp. 1876-1891.
Nitayama et al., "Multi-Pillar Surrounding Gate Transistor (M-SGT) for Compact and High-Speed Circuits", IEEE Transactions on Electron Devices vol. 38, No. 3, Mar. 1991, United States, pp. 579-583.
Pohm et al., "Experimental and Analytical Properties of 0.2 Micron Wide, Multi-Layer, GMR, Memory Elements", IEEE Transactions on Magnetics vol. 32, No. 5, Sep. 1996, United States, pp. 4645-4647.
Pohm et al., "Experimental and Analytical Properties of 0.2-μm-Wide, End-On, Multi-Layer, Giant Magnetoresistance, Read Head Sensors", Journal of Applied Physics vol. 79, No. 8, Apr. 1996, United States, pp. 5889-5891.
Sunouchi et al., "A Surrounding Gate Transistor (SGT) Cell for 64-256Mbit DRAMS", IEEE International Electron Devices Meeting Technical Digest, 1989, Japan, pp. 2.1.1-2.1.4.
Takato et al., "High Performance CMOS Surrouding Gate Transistor (SGT) for Ultra High Density LSIs", IEEE International Electron Devices Meeting Technical Digest, 1988, Japan, pp. 222-225.
Terauchi et al., "A Surrounding Gate Transistor (SGT) Gain Cell for Ultra High Density DRAMs", IEEE Symposium on VLSI Technology Digest Papers, 1993, Japan, pp. 21-22.
U.S. Appl. No. 11/669,840 Final Office Action, dated Mar. 29, 2010, 9 pages.
Wong et al., "Self-Aligned (Top and Bottom) Double-Gate MOSFET with a 25 nm Thick Silicon Channel", IEEE International Electron Device Meeting, 1997, United States, pp. 427-430.
Xuan et al., "60 nm Planarized Ultra-Thin Body Solid Phase Epitaxy MOSFETs", IEEE Device Research Conference, Jun. 2000, United States, pp. 67-68.
Contreras et al., "Catalytic CO Oxidation Reaction Studies on Lithographically Fabricated Platinum Nanowire Arrays with Different Oxide Supports", Catalysis Letters vol. 111, Nos. 1-2, Oct. 2006, Netherlands, pp. 5-13.
Liu et al., "Dual-Work-Function Metal Gates by Full Silicidation of Poly-Si with Co—Ni Bi-Layers", IEEE Electron Device Letters vol. 26, No. 4, Apr. 2005, United States, pp. 228-230.
Mo et al., "Formation and Properties of Ternary Silicide (CoxNi1-x)Si2 Thin Films", IEEE 5th International Conference on Solid-State and Integrated Circuit Technology, 1998, China, pp. 271-274.
U.S. Appl. No. 11-152,998 Final Office Action, dated Mar. 21, 2008, 20 pages.
U.S. Appl. No. 11/152,998 Notice of Allowance, dated Aug. 23, 2010, 13 pages.
US 7,122,483, 09/2006, Lin (withdrawn).
Bashir et al., "Characterization of Sidewall Defects in Selective Epitaxial Growth of Silicon", American Vacuum Society, Journal of Vacuum Science and Technology B: Nanotechnology and Microelectronics vol. 13, No. 3, May/Jun. 1995, United States, pp. 923-927.
Bashir et al., "Reduction of Sidewall Defect Induced Leakage Currents by the Use of Nitrided Field Oxides in Silicon Selective Epitaxial Growth Isolation for Advanced Ultralarge Scale Integration", American Vacuum Society, Journal of Vacuum Science and Technology B: Nanotechnoloy and Microelectronics, vol. 18, No. 2, Mar./Apr. 2000, United States, pp. 695-699.
Bernstein et al., "Floating Body Effects", Chapter 3, 3.4-3.5, SOI Device Electrical Properties, Jan. 2000, United States, pp. 34-53.
Chen et al., "The Enhancement of Gate-Induced-Drain-Leakage (GIDL) Current in Short-Channel SOI MOSFET and its Application in Measuring Lateral Bipolar Current Gain ß", IEEE Electron Device Letters vol. 13, No. 11, Nov. 1992, United States, pp. 572-574.
Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs", Japan Journal of Applied Physics vol. 42, 2003, Japan, pp. 2073-2076.
Clarke, "Device Structures: Architectures Compatible with Conventional Silicon Processes—Vertical Transistors Plumbed for Memory, Logic", Electronic Engineering Times, Feb. 14, 2000, United States, p. 24.
Fazab et al., "MOSFET Design Simplifies DRAM", EE Times, available online at http://www.eetimes.com/in_focus/mixed_signals/OEG20020510S0065, May 13, 2002, 4 pages.
Gonzalez et al., "A Dynamic Source-Drain Extension MOSFET Using a Separately Biased Conductive Spacer", Solid-State Electronics vol. 46, 2002, United Kingdom, pp. 1525-1530.
Hammad et al., "The Pseudo-Two-Dimensional Approach to Model the Drain Section in SOI MOSFETs", IEEE Transactions on Electron Devices vol. 48, No. 2, Feb. 2001, United States, pp. 386-387.
Hara, "Toshiba Cuts Capacitor from DRAM Cell Design", EE Times, available online at http://www.us.design-reuse.com/news/?id=24&print=yes, Feb. 7, 2002, 2 pages.
Henkels et al., "Large-Signal 2T, 1C DRAM Cell: Signal and Layout Analysis", IEEE Journal of Solid-State Circuits vol. 29, No. 7, Jul. 1994, United States, pp. 829-832.
Keast et al., "Silicon Contact Formation and Photoresist Planarization Using Chemical Mechanical Polishing", International VLSI Multilevel Interconnection Conference, Jun. 7-8, 1994, United States, pp. 204-205.
Kim et al., "An Outstanding and Highly Manufacturable 80nm DRAM Technology", IEEE, 2003, 4 pages.
Kim et al., "The Breakthrough in Data Retention Time of DRAM Using Recess-Channel-Array Transistor (RCAT) for 88nm Feature Size and Beyond", IEEE Symposium on VLSI Technology Digest of Technical Papers, 2003, United States, 2 pages.
Kraynik, "Foam Structure: From Soap Froth to Solid Foams", Materials Research Society Bulletin vol. 28, Issue 4, Apr. 2003, United States, pp. 275-278.
Kuo et al., "A Capacitatorless Double-Gate DRAM Cell Design for High Density Applications", IEEE International Electron Devices Meeting, Dec. 8-11, 2002, United States, pp. 843-846.
Lammers, "Bell Labs Opens Gate to Deeper-Submicron CMOS", Electric Engineering Times, Dec. 6, 1999, United States, p. 18.

(56) References Cited

OTHER PUBLICATIONS

Lusky et al., "Investigation of Channel Hot Electron Injection by Localized Charge-Trapping Nonvolatile Memory Devices", IEEE Transactions on Electron Devices vol. 51, No. 3, Mar. 2004, United States, pp. 444-451.
Maeda et al., "Impact of a Vertical-Shape Transistor Cell for a 1 Gbit DRAM and Beyond", IEEE Transactions on Electron Devices vol. 42, No. 12, Dec. 1995, United States, pp. 2117-2124.
Minami et al., "A Floating Body Cell (FBC) Fully Compatible with 90nm CMOS Technology (CMOS IV) for 128Mb SOI DRAM", IEEE, 2005, United States, 4 pages.
Minami et al., "A High Speed and High Reliability MOSFET Utilizing an Auxiliary Gate", IEEE Symposium on VLSI Technology, 1990, United States, pp. 41-42.
Ranica et al., "A One Transistor Cell on Bulk Substrate (1T-Bulk) for Low-Cost and High Density eDRAM", IEEE Symposium on VLSI Technology Digest of Technical Papers, Jun. 15-17, 2004, United States, pp. 128-129.
Richardson et al., "A Trench Transistor Cross-Point DRAM Cell", IEEE International Electron Devices Meeting vol. 31, 1985, United States, pp. 714-717.
Risch et al., "Vertical MOS Transistors with 70nm Channel Length", IEEE Transactions on Electron Devices vol. 43, No. 9, Sep. 1996, United States, pp. 1495-1498.
Sivagnaname et al., "Stand-By Current in PD-SOI Pseudo-nMOS Circuits", IEEE, 2003, United States, pp. 95-96.
Sunouchi et al., "Double LDD Concave (DLC) Structure for Sub-Half Micron MOSFET", IEEE International Electron Devices Meeting Technical Digest, 1988, Japan, 4 pages.
Tanaka et al., "Scalability Study on a Capacitorless 1T-DRAM: From Single-Gate PD-SOI to Double-Gate FinDRAM", IEEE International Electron Devices Meeting Technical Digest, 2004, Japan, pp. 37.5.1-37.5.4.
Tiwari et al., "Straddle Gate Transistors: High Ion/Ioff Transistors at Short Gate Lengths", IBM Research Article, IEEE 57th Annual Device Research Conference Digest, 1999, United States, pp. 26-27.
Villaret, "Mechanisms of Charge Modulation in the Floating Body of Triple-Well nMOSFET Capacitor-Less DRAMs", Microelectronic Engineering vol. 72, 2004, Netherlands, pp. 434-439.
Wang et al., "Achieving Low Juntion Capacitance on Bulk SI MOSFET Using SDOI Process", Micron Technology, Inc., 2003, United States, 12 pages.
Yasaitis et al., "A Modular Process for Integrating Thick Polysilicon MEMS Devices with Sub-Micron CMOS", Proceedings of SPIE vol. 4979, 2003, United States, pp. 145-154.
Yoshida et al., "A Capacitorless 1T-DRAM Technology Using Gate-Induced Drain-Leakage (GIDL) Current for Low-Power and High-Speed Embedded Memory", IEEE Transactions on Electron Devices vol. 53, No. 4, Apr. 2006, United States, pp. 692-697.
Yoshida et al., "A Design of a Capacitorless 1T-Dram Cell Using Gate-Induced Drain Leakage (GIDL) Current for Low-Power and High-Speed Embedded Memory", IEEE International Electron Device Meeting, 2003, Japan, 4 pages.
Banhart, "Aluminum Foams: On the Road to Real Applications". Materials Research Society Bulletin, Apr. 2003, United States, pp. 290-295.
Crouse et al., "Self-Assembled Nanostructures Using Anodized Alumina Thin Films for Optoelectronic Applications", IEEE, 1999, United States, pp. 234-235.
Green et al., "Cellular Ceramics: Intriguing Structures, Novel Properties, and Innovative Applications", Materials Research Society Bulletin, Apr. 2003, United States, pp. 296-300.
Green et al., "The Structure and Applications of Cellular Ceramics", Materials Research Society Bulletin Web Extra, Apr. 2003, United States, 10 pages.
Kim et al., "A Mechanically Enhanced Storage Node for Virtually Unlimited Height (MESH) Capacitor Aiming at Sub 70nm DRAMs", IEEE International Electron Devices Meeting, Jan. 2004, United States, pp. 3.4.1-3.4.4.
Konovalov et al., "Highly Ordered Nanotopographies on Electropolished Aluminum Single Crystals", Chemistry of Materials vol. 11, No. 8, Aug. 1999, United States, pp. 1949-1951.
Li et al., "Metal-Assisted Chemical Etching in HF/H2O2 Produces Porous Silicon", Applied Physics Letters vol. 77, No. 16, Oct. 16, 2000, United States, pp. 2572-2574.
Liang et al., "Nonlithographic Fabrication of Lateral Superlattices for Nanometric Electromagnetic-Optic Applications", IEEE Journal of Selected Topics in Quantum Electronics vol. 8, No. 5, Sep./Oct. 2002, United States, pp. 998-1008.
Liu et al., "Ordered Anodic Alumina Nanochannels on Focused-Ion-Beam-Prepatterned Aluminum Surfaces", Applied Physics Letters vol. 78, No. 1, Jan. 1, 2001, United States, pp. 120-122.
Maire et al., "In Situ X-Ray Tomography Measurements of Deformation in Cellular Solids", Materials Research Society Bulletin, Apr. 2003, United States, pp. 284-289.
Masuda et al., "Highly Ordered Nanochannel-Array Architecture in Anodic Alumina", Applied Physics Letters vol. 71, No. 19, Nov. 10, 1997, United States, pp. 2770-2772.
Nadeem et al., "Fabrication of Microstructures Using Aluminum Anodization Techniques", Proceedings of the IEEE International Conference on Micro Electro Mechanical Systems (MEMS), Feb. 1998, United States, pp. 274-277.
Oh et al., "Preparation and Pore-Characteristics Control of Nano-Porous Materials using Organometallic Building Blocks", Carbon Science vol. 4, No. 1, Mar. 2003, Korea, 9 pages. (Abstract Only).
Onck, "Scale Effects in Cellular Metals", Materials Research Society Bulletin, Apr. 2003, United States, pp. 279-283.
O'Sullivan et al., "The Morphology and Mechanism of Formation of Porous Anodic Films on Aluminium", Proceedings of the Royal Society of London Series A: Mathematical and Physical Sciences vol. 317, 1970, Great Britain, pp. 511-543.
Park et al., "Block Copolymer Lithography: Periodic Arrays of ~$10^{11}$ Holes in 1 Square Centimeter", Science vol. 276, May 30, 1997, United States, pp. 1401-1404.
Park et al., "Novel Robust Cell Capacitor (Learning Exterminated Ring Type Insulator) and New Storage Node Contact (Top Spacer Contact) for 70nm DRAM Technology and Beyond", IEEE Symposium on VLSI Technology Digest of Technical Papers, Jul. 2004, United States, pp. 34-35.
Shingubara, "Fabrication of Nanomaterials using Porous Alumina Templates", Journal of Nanoparticle Research vol. 5, 2003, Netherlands, pp. 17-30.
Tan et al., "High Aspect Ratio Microstructures on Porous Anodic Aluminum Oxide", IEEE, 1995, United States, pp. 267-272.
Gibson, "Cellular Solids", Materials Research Society Bulletin, Apr. 2003, United States, pp. 270-274.
Karp et al., "Scaffolds for Tissue Engineering", Materials Research Society Bulletin, Apr. 2003, United States, pp. 301-306.
Robertson, "Diamond-Like Amorphous Carbon", Material Science and Engineering R: Reports vol. 37, 2002, Netherlands, pp. 129-281.
Robertson, "Hard Amorphous (Diamond-Like) Carbons", Progress in Solid State Chemistry vol. 21, 1991, Great Britain, pp. 199-333.
Tsukada et al., "Preparating and Application of Porous Silk Fibroin Materials", Journal of Applied Polymer Science vol. 54, 1994, United States, pp. 507-514.
Wikipedia, "Conductive Polymer", available online at http://en.wikipedia.org/w/index.php?title=Conductive_polymer&printable=yes, Nov. 14, 2007, 5 pages.
Chang et al., "Trench Filling Characteristics of Low Stress TEOS/Ozone Oxide Deposited by PECVD and SACVD" Microsystems Technologies 10, 2004, Germany, pp. 97-102.
Cohen, "Block Copolymers as Templates for Functional Materials", Current Opinion in Solid State and Materials Science vol. 4, Dec. 1999, United Kingdom, pp. 587-590.
Klaus et al., "Growth of SiO2 at Room Temperature with the Use of Catalyzed Sequential Half-Reactions", Science vol. 278, Dec. 12, 1997, United States, pp. 1934-1936.
Millman, "Microelectronics: Digital and Analog Circuits and Systems", McGraw-Hill, 1979, pp. 289 and 295.

(56) References Cited

OTHER PUBLICATIONS

Radens et al., "A 0.21 μm2 6F2 Trench Cell with a Locally-Open Globally-Folded Dual Bitline for 1Gb/4Gb DRAM", IEEE Symposium on VLSI Technology Digest of Technical Papers, Jun. 9-11, 1998, United States, pp. 36-37.
Sakao et al., "A Straight-Line-Trench Isolation and Trench-Gate Transistor (SLIT) Cell for Giga-bit DRAMs", Proceedings of IEEE VLSI Technology Symposium, May 17-19, 1993 Kyoto, Japan, pp. 19-20.
Schloesser et al., "Highly Scalable Sub-50nm Vertical Double Gate Trench DRAM Cell", IEEE International Electron Devices Meeting Technical Digest, 2004, United States, 4 pages.
Terai et al., "Hall Pattern Shrink Technology for a Semiconductor—RELACS Technology for ArF Lithography", Journal of the Society of Electrical Materials Engineering vol. 13, No. 1, Sep. 25, 2004, pp. 82-86.
Yan et al., "Scaling the SI MOSFET: From Bulk to SOI to Bulk", IEEE Transactions on Electron Devices vol. 39, No. 7, Jul. 1992, United States, pp. 1704-1710.
Ahn et al., "Examination and Improvement of Reading Disturb Characteristics of a Surrounded Gate STTM Memory Cell", IEEE Third Conference on Nanotechnology Proceedings vol. 2, 2003, United States, pp. 528-530.
Ahn et al., "Highly Scalable and CMOS-Compatible STTM Cell Technology", IEEE International Electron Devices Meeting, 2003, United States, 4 pages.
Cho et al., "High Performance Fully and Partially Depleted Poly-Si Surrounding Gate Transistors", Symposium on VLSI Technology Digest of Technical Papers, 1999, United States, pp. 31-32.
Clarke, "ISSCC: Vertical Transistor Structures Considered", available online at http://www.eetimes.com/article/showArticle.jhtml?articleId=18303643, Feb. 9, 2000, 3 pages.
Date et al., "Suppression of the Floating-Body Effect Using SiGe Layers in Vertical Surrounding-Gate MOSFETs", IEEE Transactions on Electron Devices vol. 48, No. 12, Dec. 2001, United States, pp. 2684-2689.
De et al., "Impact of Gate Workfunction on Device Performance at the 50 nm Technology Node", Solid-State Electronics vol. 44, 2000, United Kingdom, pp. 1077-1080.
Endoh et al., "A High Signal Swing Pass-Transistor Logic Using Surrounding Gate Transistor", IEEE International Conference on Simulation Semiconductor Processes and Devices, 2000, United States, pp. 273-275.
Endoh et al., "An Accurate Model of Fully-Depleted Surrounding Gate Transistor (FD-SGT)", Transactions of the Institute of Electronics, Information and Communications Engineers vol. E80-C, No. 7, Jul. 1997, Japan, pp. 905-910.
Endoh et al., "An Analytic Steady-State Current-Voltage Characteristics of Short Channel Fully-Depleted Surrounding Gate Transistor (FD-SGT)", Transactions of the Institute of Electronics, Information and Communication Engineers vol. E80-C, No. 7, Jul. 1997, Japan, pp. 911-917.
Endoh et al., "Analysis of High Speed Operation for Multi-SGT", Transactions of the Institute of Electronics, Information and Communication Engineers C-I vol. J80C-I, No. 8, Aug. 1997, Japan, pp. 382-383.
Endoh et al., "Floating Channel Type SGT Flash Memory", Transactions of the Institute of Electronics, Information and Communication Engineers C-I vol. J82C-I, No. 3, Mar. 1999, Japan, pp. 134-135.
Endoh et al., "Novel Ultra High Density Flash Memory with a Stacked-Surrounding Gate Transistor (S-SGT) Structured Cell", IEEE International Electron Devices Meeting, 2001, United States, 4 pages.
Endoh et al., "The 1.44F2 Memory Cell Technology with the Stacked-Surrounding Gate Transistor (S-SGT) DRAM", Proceedings of the 22nd International Conference on Microelectronics vol. 2, May 14-17, 2000, Serbia, pp. 451-454.
Endoh et al., "The Analysis of the Stacked-Surrounding Gate Transistor (S-SGT) DRAM for the High Speed and Low Voltage Operation", Transactions of the Institute of Electronics, Information and Communication Engineers C vol. E81-C, No. 9, Sep. 1998, Japan, pp. 1491-1498.
Endoh et al., "The Stacked-SGT DRAM Using 3D-Building Memory Array Technology", Transactions of the Institute of Electronics, Information and Communication Engineers C-I vol. J81C-I, No. 5, May 1998, Japan, pp. 288-289.
Forbes, "DRAM Array with Surrounding Gate Access Transistors and Capacitors over Global Bit Lines", surroundingdisc4.doc, Sep. 14, 2004, United States, 20 pages.
Hioki et al., "An Analysis of Program and Erase Operation for FC-SGT Flash Memory Cells", IEEE International Conference on Simulation Semiconductor Processes and Devices, 2000, United States, pp. 116-118.
IEDM, "Notes from IEDM, Part 3", available online at http://www.thinfilmmfg.com/Northworthy/Noteworthy01/IEDM12Dec01.htm, Dec. 12, 2001, 2 pages.
ISE, "Quantum Confinement Effects in a 3D FinFET Transistor", available online at http://www.ise.com/appex/FinFET/FinFET.hml, Jan. 15, 2003, 5 pages.
Iwai et al., "Buried Gate Type SGT Flash Memory", Transactions of the Institute of Electronics, Information and Communication Engineers C vol. J86-C, No. 5, May 2003, Japan, pp. 562-564.
Kim et al., "Nanoscale CMOS Circuit Leakage Power Reduction by Double-Gate Device", International Symposium on Low Power Electronics and Design, Aug. 9-11, 2004, United States, pp. 102-107.
Kranti et al., "An Analytical Temperature Dependent Threshold Voltage Model for Thin Film Surrounded Gate SOI MOSFET", Proceedings of the SPIE—The International Society for Optical Engineering vol. 3975, Parts 1-2, 2000, United States, pp. 605-608.
Kranti et al., "Optimisation for Improved Short-Channel Performance of Surrounding/Cylindrical Gate MOSFETs", Electronics Letters vol. 37, No. 8, Apr. 12, 2001, United Kingdom, pp. 533-534.
Lau et al., "High Aspect Ratio Submicron Silicon Pillars Fabricated by Photoassisted Electrochemical Etching and Oxidation", Applied Physics Letters vol. 67, No. 13, Sep. 25, 1995, United States, pp. 1877-1879.
Lau et al., "High Aspect Ratio Sub-Micron Silicon Pillars for Light Emission Studies and Photonic Band Gap Material Applications", 1995/1996 Research Journal, Microelectronics Group, Univeristy of Southampton, Jun. 1996, United Kingdom, 3 pages.
Lutze et al., "Field Oxide Thinning in Poly Buffer LOCOS Isolation with Active Area Spacings to 0.1 μm", Journal of the Electrochemical Society vol. 137, No. 6, Jun. 1990, United States, pp. 1867-1870.
Mandelman et al., "Challenges and Future Directions for the Scaling of Dynamic Random-Access Memory (DRAM)", IBM Journal of Research and Development vol. 46, No. 2/3, Mar./May 2002, United States, pp. 187-212.
Matsuoka et al., "A Study of Soft Error in SGT DRAM", Record of Electrical and Communication Engineering vol. 71, No. 1, Oct. 2002, United Kingdom, pp. 469-470.
Matsuoka et al., "Numerical Analysis of Alpha-Particle-Induced Soft Errors in Floating Channel Type Surrounding Gate Transistor (FC-SGT) DRAM Cell", IEEE Transactions on Electron Devices vol. 50, No. 7, Jul. 2003, United States, pp. 1638-1644.
Miyamoto et al., "Effect of LDD Structure and Channel Poly-Si Thinning on a Gate-All-Around TFT (GAT) for SRAM's", IEEE Transactions on Electron Devices vol. 46, No. 8, Aug. 1999, United States, pp. 1693-1698.
Nakamura, "A Study of Steady-State Characteristics of SGT Type Three-Dimensional MOS Transistor", Record of Electrical and Communication Engineering vol. 66, No. 1, Jan. 1998, United Kingdom, pp. 211-212.
Nishi et al., "Analysis of the Shape of Diffusion Layer of SGT for Suppressing Substrate Bias Effect", Transactions of the Institute of Electronics, Information and Communication Engineers C vol. J84-C, No. 10, Oct. 2001, Japan, pp. 1018-1020.
Nishi et al., "Concave Source SGT for Supressing Punch-Through Effect", Transactions of the Institute of Electronics, Information and Communication Engineers C vol. J86-C, No. 2, Feb. 2003, Japan, pp. 200-201.

(56) References Cited

OTHER PUBLICATIONS

Nitayama et al., "High Speed and Compact CMOS Circuits with Multi-Pillar Surrounding Gate Transistors", IEEE Transactions on Electron Devices vol. 36, No. 11, Nov. 1989, United States, pp. 2605-2606.
Sakai et al., "A Study of Stacked-SGT-Based Pass-Transistor Logic Circuit", Record of Electrical and Communication Engineering vol. 72, No. 2, Feb. 2004, United Kingdom, pp. 108-109.
Sakamoto et al., "A Study of Current Drivability of SGT", Record of Electrical and Communication Engineering vol. 72, No. 2, Feb. 2004, United Kingdom, pp. 110-111.
Seeger et al., "Fabrication of Ordered Arrays of Silicon Nanopillars", Journal of Physics D: Aplied Physics vol. 32, 1999, United Kingdom, pp. L129-L132.
Takato et al., "Impact of Surrounding Gate Transistor (SGT) for Ultra-High-Density LSI's", IEEE Transactions on Electron Devices vol. 38, No. 3, Mar. 1991, United States, pp. 573-578.
Terauchi et al., "Depletion Isolation Effect of Surrounding Gate Transistors", IEEE Transactions on Electron Devices vol. 44, No. 12, Dec. 1997, United States, pp. 2303-2305.
Watanabe et al., "A Novel Circuit Technology with the Surrounding Gate Transistors (SGT's) for Ultra High Density DRAM's", IEEE Journal of Solid-State Circuits vol. 30, No. 9, Sep. 1995, United States, pp. 960-971.
Watanabe, "Impact of Three-Dimensional Transistor on the Pattern Area Reduction for ULSI", IEEE Transactions on Electron Devices vol. 50, No. 10, Oct. 2003, United States, pp. 2073-2080.
Wolf et al., "CMOS Process Integration", Silicon Processing for the VLSI Era vol. 1—Process Technology, Second Edition, 2000, United States, pp. 833-834.
Wolf et al., "Complementary Bipolar (CB) Technology", Silicon Processing for the VLSI Era vol. 2—Process Integration, 1990, United States, pp. 557-558.
Wolf et al., "Ion Implantation for ULSI", Silicon Processing for the VLSI Era vol. 1—Process Technology, Second Edition, 2000, United States, pp. 421-423.
Wolf et al., "Silicon Epitaxial Film Growth", Silicon Processing for the VLSI Era vol. 1—Process Technology, 1986, United States, pp. 124-160.
Wolf et al., "Wet Processing: Cleaning, Etching and Liftoff", Silicon Processing for the VLSI Era vol. 1—Process Technology, 1986, United States, pp. 529-555.
Yamashita et al., "A Study of Process Design in Three Dimensional SGT Device", Record of Electrical and Communication Engineering vol. 71, No. 1, Oct. 2002, United Kingdom, pp. 467-468.
Zhang et al., "A Study of Load Capacitance in SGT", Record of Electrical and Communication Engineering vol. 71, No. 1, Oct. 2002, United Kingdom, pp. 473-474.
Bates et al.; "Block Copolymers-Designer Soft Materials"; *Physics Today*; Feb. 1999, vol. 52, No. 2; pp. 32-38.
Bergeron, et al., "Resolution Enhancement Techniques for the 90nm Technology Node and Beyond," Future Fab International, Issue 15, Jul. 11, 2003, 4 pages.
Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.
Black et al. "IBM demos new nanotechnology method to build chip components. Creates nanocrystal memory devices using self assembly technique compatible with conventional semiconductor processing," http://domino.research.ibm.com/comm/pr.nsf/pages/news.20031208_selfassembly.html; Dec. 8, 2003.
Black et al. "Nanometer-Scale Pattern Registration and Aignment by Directed Diblock Copolymer Self-Assembly," IEEE Transactions on Nanotechnology, vol. 3, No. 3 (Sep. 2004); pp. 412-415.
Bruek, "Optical and Interferometric Lithography—Nanotechnology Enablers," 2005, Proceedings of the IEEE, vol. 93, No. 10, pp. 1704-1721.
Callahan, Tim; "Pattern Formation"; Mathematics Department; www.math.lsa.umich.edu/~timcall/patterns/; Oct. 28, 2005; 5 pgs.

Carcia et al., "Thin films for Phase-shift Masks," *Vacuum and Thin Film*, IHS Publishing Group, 14-21 (Sep. 1999).
Chen et al., Achieving area-selective atomic layer deposition on patterned substrates by selective surface modification, Applied Physics Letters 86, 191910-1-191910-3 (2005).
Cheng et al., "Fabrication of nanostructures with long-range order using block copolymer lithography," Applied Physics Letters, vol. 81, No. 19, pp. 3657-3659 (Nov. 4, 2002).
Choi et al., "Sublithographic nanofabrication technology for nanocatalysts and DNA chips," *J. Vac. Sci. Technol.*, pp. 2951-2955 (Nov./Dec. 2003).
Chou et al., Nanoimprint lithography, J.Vac. Sci. Technol. B 14(6), Nov./Dec. 1996, American Vacuum Society.
Chung et al., "Nanoscale Multi-Line Patterning Using Sidewall Structure," Jpn., J. App.. Phys. vol. 41 (2002) Pt. 1, No. 6B, pp. 4410-4414.
Chung et al., "Pattern multiplication method and the uniformity of nanoscale multiple lines*:" J.Vac.Sci.Technol. B21(4), Jul./Aug. 2003, pp. 1491-1495.
Cochran, Eric W.; Chemical Engineering—Iowa State University; www.iastate.edu/~ch_e/faculty/cochran.htm; Oct. 28, 2005; 2 pgs.
U.S Appl. No. 11/445,907, filed Jun. 2, 2006, Micron Ref. No. 2005-0865.00/US.
U.S. Appl. No. 11/389,581, filed Mar. 23, 2006, Micron Ref. No. 2005-0695.00/US.
U.S. Appl. No. 11/543,515, filed Oct. 24, 2006, Micron Ref. No. 2005-1173.00/US.
Edwards et al., "Precise Control over Molecular Dimensions of Block-Copolymer Domains Using the Interfacial Energy of Chemically Nanopatterned Substrates," *Advanced Materials*, 16, No. 15, (Aug. 4, 2004); pp. 1315-1319.
Ex Parte Centell, unpublished decision of the Board of Patent Appeals and Interferences, Mar. 4, 2005.
Fasolka et al.; "Block Copolymer Thin Films: Physics and Applications"; Annu. Rev. Mater. Res. 2001.31:323-355.
Guarini et al., "Low voltage, scalable nanocrystal FLASH memory fabricated by templated self-assembly," Electron Devices Meeting 2003, IEDM 03 Technical Digest. IEEE International Dec. 8-10, 2003, pp. 22.2.1-22.2.4.
Guarini et al.; "Optimization of Diblock Copolymer Thin Film Self Assembly"; Adv. Mater. 2002, 14, No. 1, Sep. 16; pp. 1290-1294.
Herr, Daniel J.C.; "The Extensibility of Optical Patterning via Directed Self-Assembly of Nano-Engineered Imaging Materials"; Future Fab Intl.; www.future-fab.com; 8 pgs.; Oct. 27, 2005.
http://mrsec.uchicago.edu/Nuggets/Stripes/; Oct. 27, 2005; 3 pgs.
International Search Report (International Application No. PCT/US2007/011524), 2007.
Jeong et al.; "Asymmetric Block Copolymers with Homopolymers: Routes to Multiple Length Scale Nanostructures"; Adv. Mater. 2002, 14, No. 4, Feb. 19; pp. 274-276.
Jeong et al.; "Volume Contractions Induced by Crosslinking: A Novel Route to Nanoporous Polymer Films"; Adv. Mater. 2003, 15, No. 15, Aug. 5; pp. 1247-1250.
Joubert et al. "Nanometer scale linewidth control during etching of polysilicon gates in high-density plasmas," Microelectronic Engineering 69 (2003), pp. 350-357.
Kim et al., "Epitaxial self-assembly of block copolymers on lithographically defined nanopatterned substrates," *Nature* 424, 411-414 (Jul. 24, 2003).
Limary et al.; "Block Copolymer Thin Films Above and Below the Order-Disorder Transition Temperature"; Mat.Res.Soc.Symp. vol. 629; (2000) Materials Research Society;6 pgs.
"Molecular Thermodynamics & Statistical Mechanics (MTSM) Research Group"; www.engr.wisc.edu/groups/mtsm/research.shtml; Oct. 28, 2005; 7 pgs.
Nealy et al, "Directed assembly of imaging layers for sub-30 nm lithography", *First International Nanotechnology Conference on Communication and Cooperation*, Jun. 2005, 2 pages.
Ngandu, K., "Resolution Enhancement Techniques for Optical Lithography," NNIN REU Research Accomplishments, 90-91 (2004).
Oehrlein et al. "Pattern transfer into low dielectric materials by high-density plasma etching," Solid State Tech., May 2000, 8 pages.

(56) References Cited

OTHER PUBLICATIONS

Park et al., "Enabling Nanotechnology with Self-Assembled Block Copolymer Patterns," *Polymer*, Elsevier Science Publishers, B.V., GB, vol. 44, No. 22 pp. 6725-6760 (Oct. 2003).
Park et al., Microcontact patterning of ruthenium gate electrodes by selective area atomic layer deposition, Applied Physics Letters 86, 051903 (2005).
PCT International Search Report dated Sep. 26, 2008, International Application No. PCT/US2008/063943, Filed: May 16, 2008.
"Polymer Research Laboratory"; www.princeton.edu/~polymer/block.html; Oct. 27, 2005; 2 pgs.
Qin et al., On Wire Lithography, www.sciencemag.org, vol. 309, Jul. 1, 2005, p. 113-115.
Rockford et al., "Polymers on Nanoperiodic, Heterogeneous Surfaces," *Physical Review Letters APS USA*, vol. 82, No. 12 (Mar. 22, 1999).
Sheats et al., "Microlithography: Science and Technology," *Marcel Dekkar, Inc.*, pp. 104-105 (1998).
Sinha et al., Area-Selective ALD of Titanium Dioxide Using Lithographically Defind Poly (methyl methacrylate) Films, Journal of the Electrochemical Society, 153 (5) G465-0469 (2006).
Sony CX—News vol. 29, 2002, Next Generation Low-Cost Electron Beam Lithography Fabrication Technology, www.sony.net/Products/SC-HP/cx_news/vol29/pdf/mask.pdf.
Stoykovich et al., "Directed Assembly of Block Copolymer Blends into Nonregular Device-Oriented Structures," *Science*, vol. 308, 1442-1446 (Jun. 3, 2005).
Tirrell et al.; "Self-Assembly in Materials Synthesis"; MRS Bulletin; vol. 30; Oct. 2005; pp. 700-704.
U.S. Office Action dated Jul. 11, 2008 in U.S. Appl. No. 11/367,020, filed Mar. 2, 2006.
U.S. Office Action dated Jun. 2, 2008 in U.S. Appl. No. 11/219,067, filed Sep. 1, 2005.
U.S. Office Action dated Jun. 5, 2008 in U.S. Appl. No. 11/514,117, filed Aug. 30, 2006.
U.S. Office Action dated Jun. 25, 2009 in U.S. Appl. No. 11/445,907.
U.S. Office. Action dated Apr. 17, 2008 in U.S. Appl. No. 11/389,581, filed Mar. 23, 2006.
Wang et al., "Symmetric diblock copolymer thin films confined between homogenous and patterned surfaces: Simulations and theory," *Journal of Chemical Physics* vol. 112, No. 22, (2000); pp. 9996-10010.
Yamaguchi et al., "Resist-pattern guided self-assembly of symmetric diblock copolymer," *Journal of Photopolymer Science and Technology*, vol. 19, No. 3, (2006), pp. 385-388.
Yang et al., "Guided self-assembly of symmetic diblock copolymer films on chemically nanopatterned substrates," *Macromolecules*, vol. 33, No. 26, (2000) pp. 9575-9582.
Zheng et al.; "Structural Evolution and Alignment of Cylinder-Forming PS-b-PEP Thin Films in Confinement Studied by Time-Lapse Atomic Force Microscopy"; Mater.Res.Soc.Symp.Proc. vol. 854E (2005) Materials Research Society; 4 pgs.

\* cited by examiner

PITCH MULTIPLICATION USING SELF-ASSEMBLING MATERIALS

PRIORITY APPLICATION

This application is a continuation of U.S. patent application Ser. No. 11/757,846, filed Jun. 4, 2007, now U.S. Pat. No. 7,923,373.

REFERENCE TO RELATED APPLICATIONS

This application is related to U.S. patent application Ser. No. 11/389,581 to Gurtej Sandhu, filed Mar. 23, 2006, now U.S. Pat. No. 7,579,278, entitled Topography Directed Patterning and U.S. patent application Ser. No. 11/445,907 to Gurtej Sandhu, filed Jun. 2, 2006, now U.S Pat. No. 7,723,009 entitled Topography Based Patterning. The entire disclosure of each of these references is incorporated by reference herein.

BACKGROUND OF THE INVENTION

Field of the Invention

This invention relates to mask formation, including printing techniques for integrated circuit fabrication.

Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM for flash memory).

In another example, flash memory typically includes millions of flash memory cells containing floating gate field effect transistors that may retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. Just as a slide has an image to be projected onto a screen, the reticle typically has a pattern to be transferred to a substrate. By directing light or radiation through the reticle, the pattern in the reticle may be focused on the photoresist. The light or radiation causes a chemical change in the illuminated parts of the photoresist, which allows those parts to be selectively retained or removed, depending upon whether positive or negative photoresist is used, relative to parts which were in the shadows. Thus, the exposed and unexposed parts form a pattern in the photoresist.

Because lithography is typically accomplished by projecting light or radiation onto a surface, the ultimate resolution of a particular lithography technique depends upon factors such as optics and light or radiation wavelength. For example, the ability to focus well-defined patterns onto resist depends upon the size of the features and on the wavelength of the radiation projected through the reticle. It will be appreciated that resolution decreases with increasing wavelength, due, among other things, to diffraction. Thus, shorter wavelength radiation is typically used to form well-resolved features, as the sizes of the features decrease.

In conjunction with radiation of a particular wavelength, photolithography utilizes photoresist compatible with that radiation. After being developed, the photoresist acts as a mask to transfer a pattern to an underlying material. The photoresist is sufficiently robust to withstand the development step without deforming and is also sufficiently robust to withstand an etch for transferring the mask pattern to an underlying material. As feature sizes decrease, however, the widths of the photoresist mask features also decrease, but typically without a corresponding decrease in the heights of these mask features. Due to the high aspect ratio of these mask features, it may be difficult to maintain the structural integrity of these thin mask features during the development and pattern transfer steps. As a result, the availability of sufficiently robust photoresist materials may limit the ability of photolithography to print features, as those features continue to decrease in size.

Accordingly, there is a continuing need for high resolution methods to pattern small features.

DETAILED DESCRIPTION OF SOME EMBODIMENTS

Figure 1:
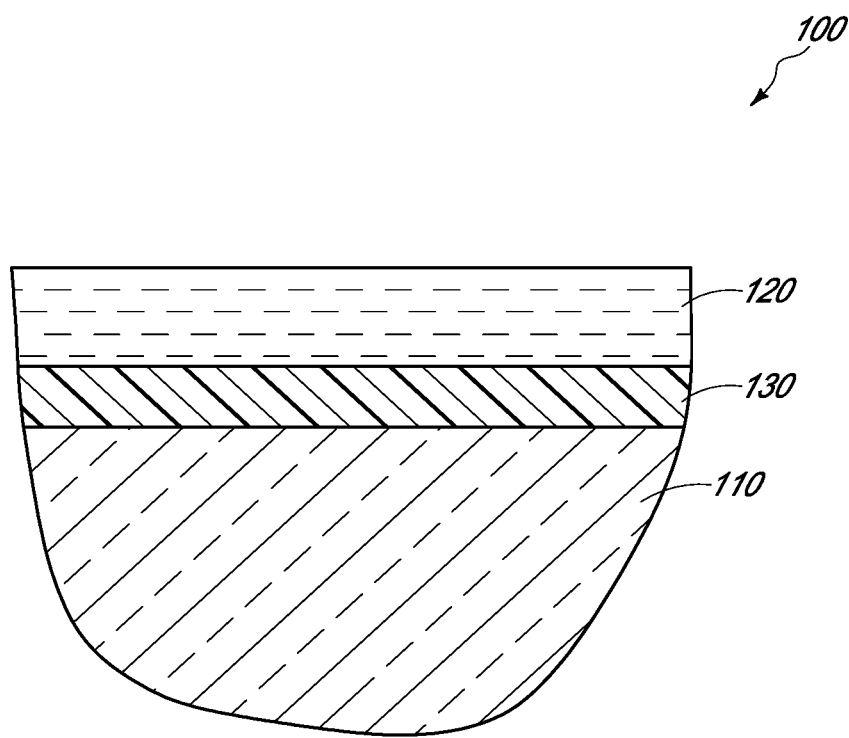
FIG. 1 is a schematic cross-sectional side view of a substrate with overlying masking layers, in accordance with some embodiments of the invention.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar and non-polar blocks, the blocks will segregate so that non-polar blocks aggregate with other non-polar blocks and polar blocks aggregate with other polar blocks. It will be appreciated that the block copolymers may be described as a self-organizing material since the blocks can move to form a pattern without active application of an external force to direct the movement of particular individual molecules, although heat may be applied to increase the rate of movement of the population of molecules as a whole.

In addition to interactions between the block species, the self-organization of block copolymers can be influenced by topographical features, such as steps on the surface on which the block copolymers are deposited. For example, a diblock copolymer, a copolymer formed of two different block species, may form alternating domains, or regions, which are each formed of a substantially different block species. When self-organization of block species occurs in the area between the walls of a step, the steps may interact with the blocks such that, e.g., each of the alternating regions formed by the blocks is made to form a regular pattern with features oriented parallel to the walls. In addition, the self-organization of block copolymers may be guided by photolithographicly modifying a surface, without forming steps in the surface, as disclosed in: Stoykovich et al., Science 308, 1442 (2005); Kim et al., Nature 424, 411 (2003); and Edwards et al., Adv. Mater. 16, 1315 (2004). The entire disclosure of each to these references is incorporated by reference herein.

Such self-organization can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a copolymer mask are disclosed in U.S. patent application Ser. No. 11/389,581 to Gurtej Sandhu, filed Mar. 23, 2006, now U.S Pat. No. 7,579,278, entitled Topography Directed Patterning; and U.S. patent application Ser. No. 11/445,907 to Gurtej Sandhu, filed Jun. 2, 2006, now U.S. Pat. No 7,723,009, entitled Topography Based Patterning the entire disclosure of each of which is incorporated by reference herein. While self-organizing materials may be used to form relatively small mask features, further decreases in the sizes of the mask features are desired due to the constant miniaturization of integrated circuits.

Moreover, the lengths of block copolymers may be an intrinsic limit to the sizes of domains formed by the blocks of those block copolymers. For example, the copolymers may be chosen with a length that facilitates self-assembly into a desired pattern of domains, and shorter copolymers may not self-assemble as desired.

Embodiments of the invention allow for the formation of features smaller than those that may be formed by block polymers alone. In embodiments of the invention, a self-organizing material formed of different chemical species is allowed to organize to form domains composed of like chemical species. Some of those domains are selectively removed to form mandrels, or temporary placeholders. A pitch multiplication process is then performed using the mandrels formed from the self-organizing material. Features with a pitch smaller than a pitch of the mandrels are derived from the mandrels. In some embodiments, spacers are formed on sidewalls of the mandrels and the mandrels are selectively removed. The spacers, or other mask features derived from the spacers, are used as part of a mask to pattern underlying materials, e.g., during the fabrication of integrated circuits.

Embodiments of the invention may form the mask features may be formed without using newer, relatively complex and expensive lithography techniques and the burden on the robustness of photoresist may be reduced. For example, rather than using relatively soft and structurally delicate photoresist in a mask, spacers or mask features derived from the spacers may be used as a mask. The use of spacers allows the selection of a variety of materials for the spacers, and the materials may be selected for robustness and compatibility with underlying materials used in a process flow. Moreover, because copolymer material is not used as a mask for patterning underlying layers, the copolymer materials may be selected without regard to, e.g., their robustness and suitability for forming masking layers. Rather, the copolymer material may be selected based upon their self-organizing behavior and suitability for use in mandrels, thereby increasing process latitude. Moreover, the self-organizing behavior of materials such as block copolymers allows the reliable formation of very small features, thereby facilitating the formation of a mask with a very small feature size. For example, features having a critical dimension of about 1 nm to about 100 nm, about 3 nm to about 50 nm or about 5 nm to about 30 may be formed.

Reference will now be made to the Figures, wherein like numerals refer to like parts throughout. It will be appreciated that the Figures are not necessarily drawn to scale.

In a first phase of methods according to some embodiments, a plurality of mandrels is formed from self-organizing material, such as block copolymers. FIGS. 1-8 illustrate a method for self-assembling the self-organizing material into a desired pattern using guides or step features to guide the self-assembly. In other embodiments, it will be appreciated that the self-assembly of the self-organizing material may be directed by any method known in the art.

With reference to FIG. 1, a cross-sectional side view of a partially formed integrated circuit 100 is illustrated. Masking layers 120, 130 may be provided above a substrate 110 to form guides for copolymer self-assembly. The materials for the layers 120, 130 overlying the substrate 110 are chosen based upon consideration of the interaction of the layers with block copolymer materials to be used and of the chemistry and process conditions for the various pattern forming and pattern transferring steps discussed herein. For example, because patterns in upper layers are transferred to lower layers, the lower masking layer 130 is chosen so that it can be selectively etched relative to at least some of the other exposed materials. It will be appreciated that a material is considered selectively, or preferentially, etched when the etch rate for that material is at least about 2-3 times greater, or at least about 10 times greater, or at least about 20 times greater, or at least about 50 times greater than that for surrounding materials.

It will be appreciated that the "substrate" to which patterns are transferred may include a single material, a plurality of layers of different materials, a layer or layers having regions of different materials or different structures in them, etc. These materials may include semiconductors, insulators, conductors, or combinations thereof. For example, the substrate may comprise doped polysilicon, a single crystal electrical device active area, a silicide, or a metal layer, such as a tungsten, aluminum or copper layer, or combinations thereof. In some embodiments, the mask features discussed below may directly correspond to the desired placement of conductive features, such as interconnects, in the substrate. In other embodiments, the substrate may be an insulator and the location of mask features may correspond to the desired location of insulation between conductive features, such as in damascene metallization. The mask features may be used as a hard mask to directly etch the substrate, or may be used to transfer a pattern to another underlying layer, e.g., a carbon layer, such as a transparent carbon, layer, which is then used to transfer the pattern to one or more underlying layers, such as the substrate.

With continued reference to FIG. 1, the selectively definable layer 120 overlies a hard mask, or etch stop, layer 130, which overlies the substrate 110. The selectively definable layer 120 may be photodefinable, e.g., formed of a photoresist, including any photoresist known in the art. For example, the photoresist may be any photoresist compatible with extreme ultraviolet systems (e.g., 13.4 nm wavelength systems), 157 nm, 193 nm, 248 nm or 365 nm wavelength systems, or 193 nm wavelength immersion systems. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm. KrF photoresists are used with longer wavelength photolithography systems, such as 248 nm systems. In addition, while the use of self-organizing material and pitch multiplication in embodiments of the invention may obviate the need to define extremely small features with expensive, relatively new direct formation techniques such as extreme ultraviolet systems (including 13.4 nm wavelength systems) or electron beam lithographic systems, such systems may also be used, if desired. In addition, maskless lithography, or maskless photolithography, may be used to define the selectively definable layer 120. In other embodiments, the layer 120 and any subsequent resist layers may be formed of a resist that may be patterned by nano-imprint lithography, e.g., by using a mold or mechanical force to form a pattern in the resist.

The material for the hard mask layer 130 may comprise an inorganic material, which is not a polymer. Exemplary materials include silicon oxide ($SiO_2$), silicon nitride, silicon or a dielectric anti-reflective coating (DARC), such as a silicon-rich silicon oxynitride. The hard mask layer 130 comprises silicon nitride in the illustrated embodiment. The material for the hard mask layer 130 is selected to interact with the later-deposited self-organizing material to direct the self-assembly of the self-organizing material into a desired pattern.

Figure 2:
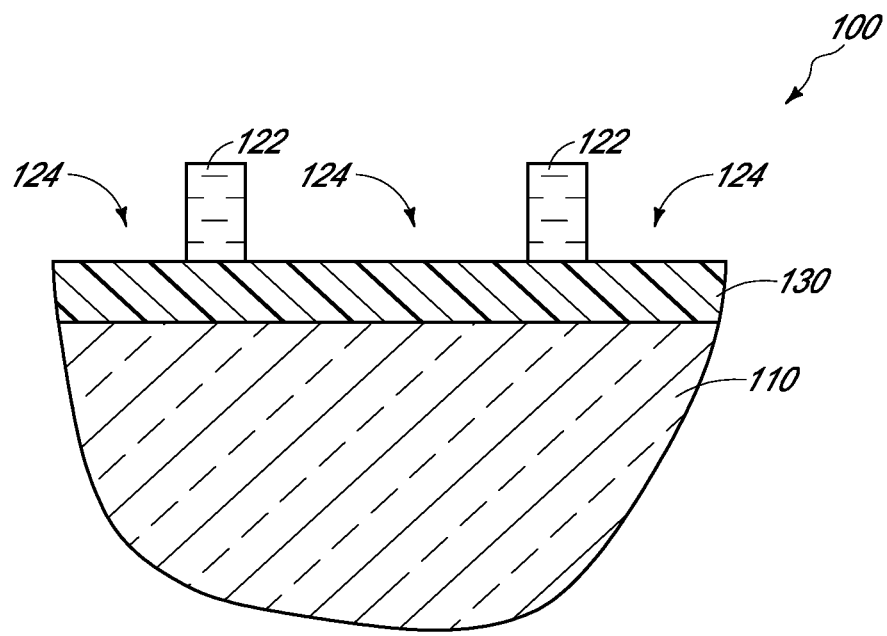
FIG. 2 is a schematic cross-sectional side view of the structure of FIG. 1 after patterning a selectively-definable layer, in accordance with some embodiments of the invention.

With reference to FIG. 2, the photodefinable layer 120 is exposed to radiation through a reticle and then developed to leave a pattern comprising features 122 which are formed of photodefinable material. It will be appreciated that the pitch of the resulting features 122, e.g., lines, is equal to the sum of the width of a line 122 and the width of a neighboring space 124. In some embodiments, the pitch of the features 122 may be, e.g., about 400 nm or less, about 300 nm or less, about 200 nm or less, or about 100 or less. In an exemplary embodiment, the features 122 may have a critical dimension of about 140 nm and a pitch of about 280 nm.

Figure 3:
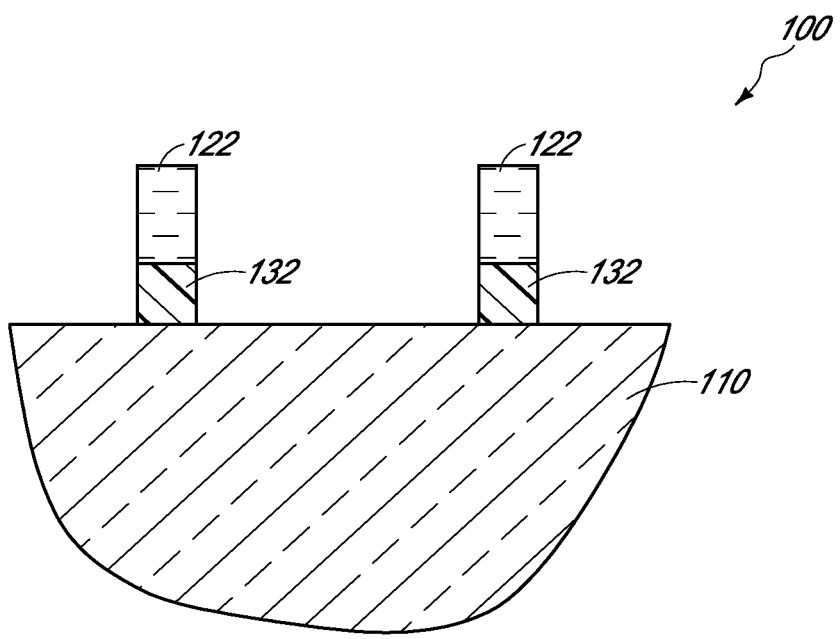
FIG. 3 is a schematic cross-sectional side view of the structure of FIG. 2 after etching through a hard mask layer, in accordance with embodiments of the invention.
Figure 4:
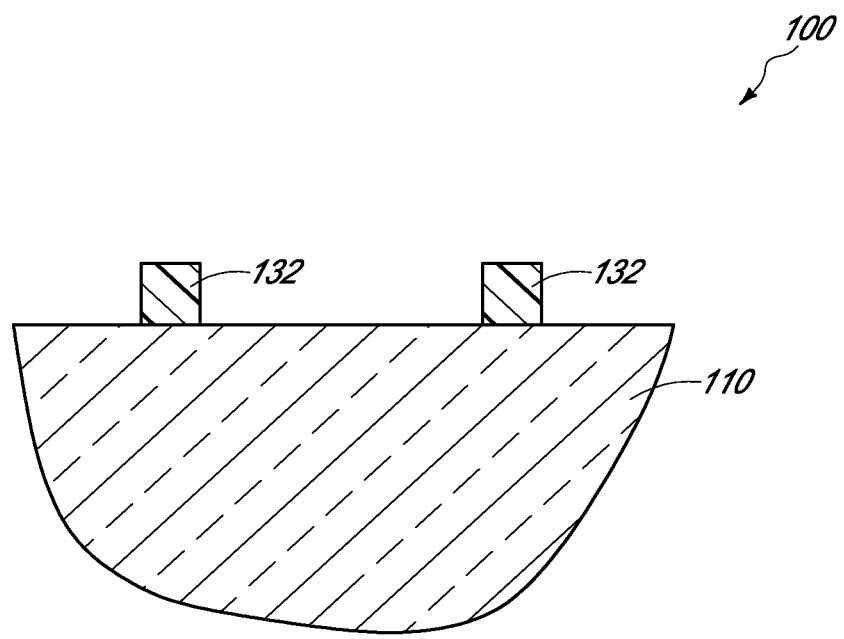
FIG. 4 is a schematic cross-sectional side view of the structure of FIG. 3 after removing the selectively-definable layer, in accordance with some embodiments of the invention.

With reference to FIG. 3, the pattern in the photodefinable layer 120 is transferred to the hard mask layer 130, thereby forming hard mask features 132 in the hard mask layer 130. The pattern transfer may be accomplished using an anisotropic etch, such as an etch using a fluorocarbon plasma, although a wet (isotropic) etch may also be suitable if the hard mask layer 130 is sufficiently thin. Exemplary fluorocarbon plasma etch chemistries include $CFH_3$, $CF_2H_2$, $CF_3H$ and $CF_4$/HBr. With reference to FIG. 4, resist forming the photodefinable layer 120 may also be removed, e.g., by plasma ashing.

Figure 5:
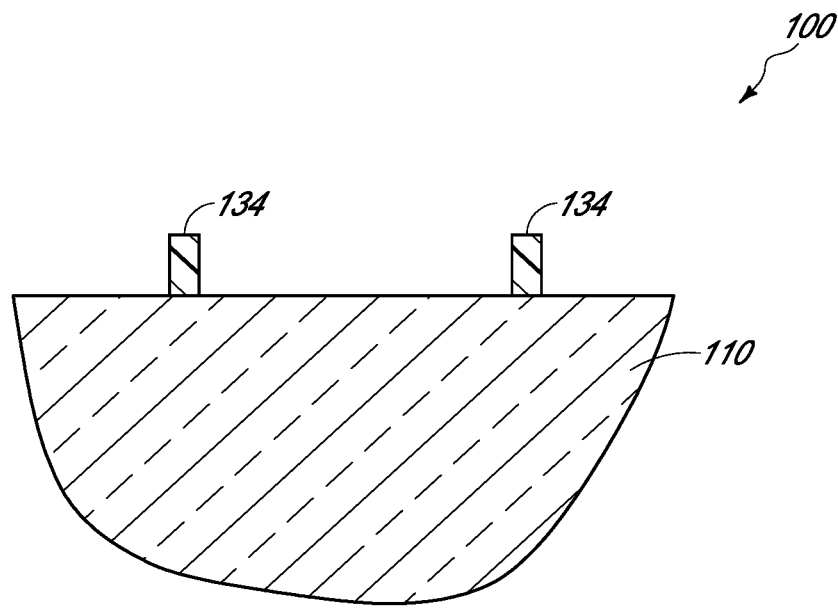
FIG. 5 is a schematic, cross-sectional side view of the structure of FIG. 4 after widening spaces between features in the hard mask layer, in accordance with some embodiments of the invention.

With reference to FIG. 5, the hard mask features 132 (FIG. 4) are trimmed to form guides 134 for copolymer self-assembly. The hard mask features 132 may be trimmed using a wet or dry etch which selectively etches the hard mask material relative to other exposed matrials. The trim etch may be performed using, e.g., a $SO_2/O_2$/Ar plasma. The trim allows the formation of features having smaller critical dimensions than could easily be formed using conventional photolithography. For example, hard mask features 132 having a critical dimension of about 140 nm and a pitch of about 280 nm may be trimmed to form copolymer self-assembly guides 134 having a critical dimension of about 35 nm and the same pitch of about 280 nm. In other embodiments, the photoresist features 122 (FIG. 2) may be trimmed in addition to, or instead of, the hard mask features 132, thereby allowing guides 134 of the desired size to be formed without the need to trim the hard mask features 132.

A self-organizing material, e.g., block copolymers, is next applied and allowed to self-assemble to form a mask pattern over the substrate 110. Method for forming self-organized block copolymer patterns are disclosed in Block, IEE Transactions in Nanotechnology, Vol. 3, No. 3, September 2004 and in U.S. patent application Ser. Nos. 11/389,581 and 11/445,907, the entire disclosure of each of which is incorporated by reference herein.

Figure 6:
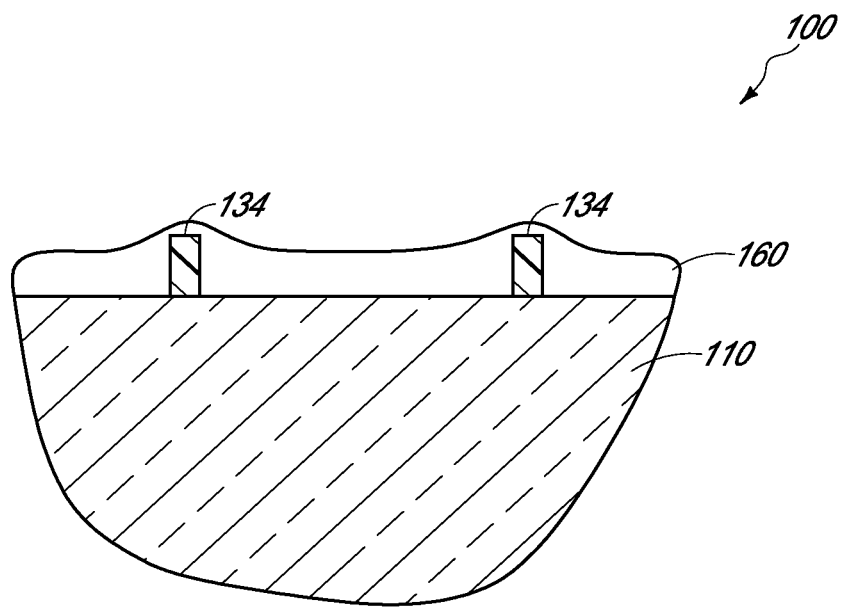
FIG. 6 is a schematic, cross-sectional side view of the structure of FIG. 5 after depositing a layer of a solution of self-organizing material, in accordance with some embodiments of the invention.
Figure 12:
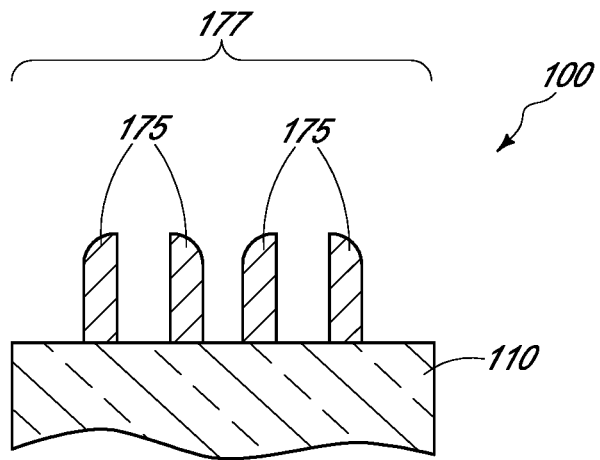
FIG. 12 is a schematic, cross-sectional side view of the structure of FIG. 11 after removing the mandrels to leave a pattern of free-standing spacers, in accordance with some embodiments of the invention.

With reference to FIG. 6, a film 160 of block copolymer material is deposited between and over the guides 134. The copolymer comprises blocks of polymer material which may be selectively etched relative to one another and which may self-organize in a desired and predictable manner, e.g., the blocks are immiscible and will segregate under appropriate conditions to form domains predominantly containing a single block species. In the exemplary illustrated embodiment, the copolymer is a diblock copolymer, comprising, e.g., polystyrene (PS) and poly-methylmethacrylate (PMMA). The diblock copolymers may be provided dissolved in a solvent, e.g., toluene. It will be appreciated that the total size of each diblock copolymer and the ratio of the constituent blocks and monomers may be chosen to facilitate self-organization and to form organized block domains having desired dimensions. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains. In some embodiments, the copolymers are selected to provide mandrels that provide a consistent spacing between spacers 175 (FIG. 12). In other embodiments, the block copolymers are selected to facilitate self-assembly into a desired pattern, the mandrels are trimmed, e.g., by a wet or dry etch, to provide a desired spacing between mandrels. The block copolymers may be deposited by various methods, including, e.g., spin-on coating, spin casting, brush coating or vapor deposition.

Figure 8:
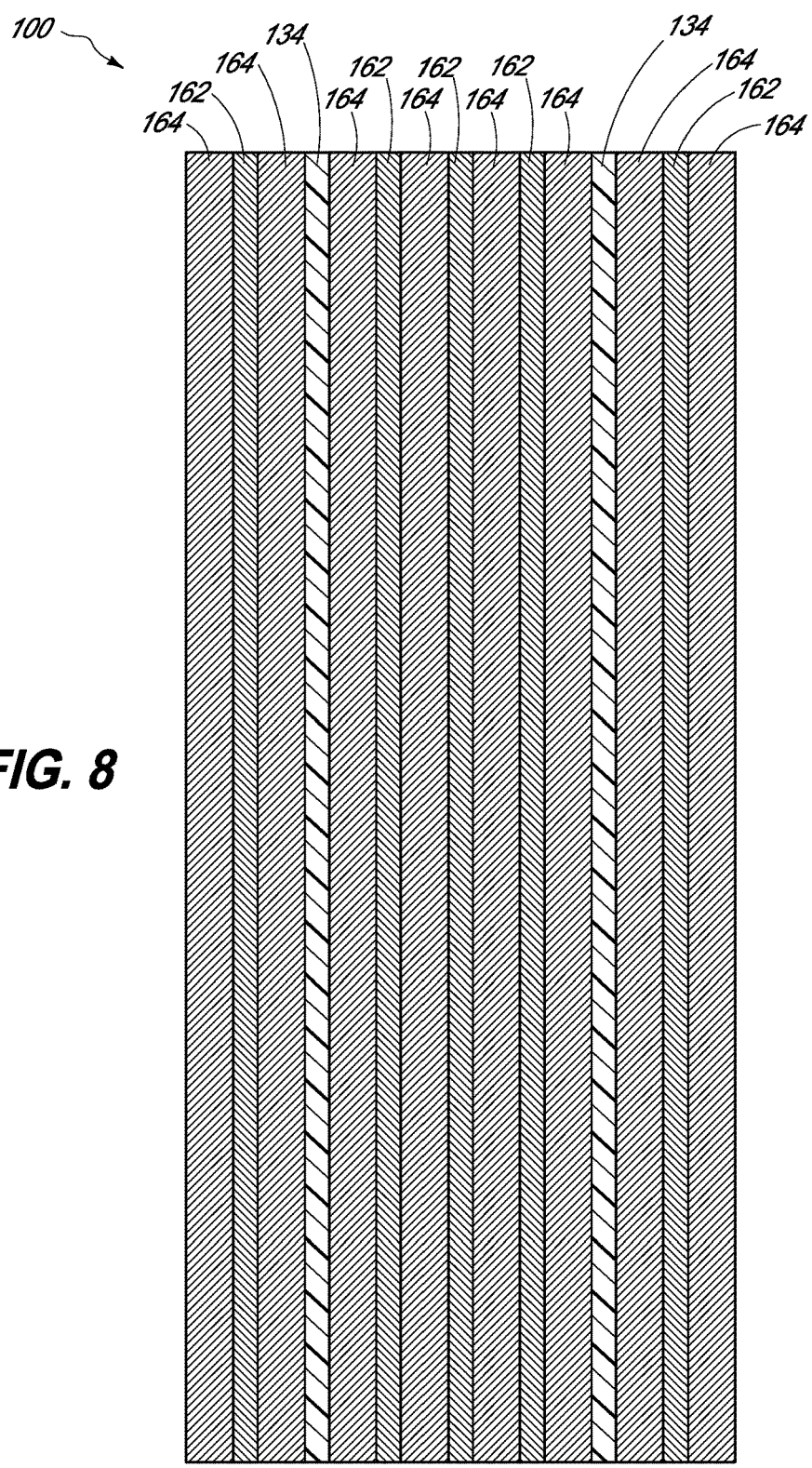
FIG. 8 is a schematic, top plan view of the structure of FIG. 7 showing an arrangement of domains of material resulting from the self-assembly of the self-organizing material, in accordance with some embodiments of the invention.

The thickness of the copolymer film 160 may be chosen based upon the desired pattern to be formed by the copolymers. It will be appreciated that, up to a particular thickness related to the polymer length scale and the environment in which the polymers are disposed, e.g., the distance between and the height of the guides 134, the copolymers will typically orient to form alternating, substantially lamellar domains that form parallel lines, as viewed in a top-down view (FIG. 8). Such lamellae may be used to pattern, e.g., interconnects, or the lateral extension of the lamellae may be limited to form isolated features, e.g., transistor gates. Under some conditions, related to the thickness of the film 160, the polymer length scale and the environment in which the polymers are disposed, the copolymers may orient to form vertically-extending pillars, such as cylinders, or spheres.

For forming lamellae, the copolymer film thickness may be less than about the length scale of the copolymers forming the film. For example, where the copolymer length scale is about 35 nm, the thickness of the films is about 35 nm or less, about 30 nm or less, or about 25 nm or less.

It will be appreciated that the thickness of the film 160 may be greater than, equal to or less than the height of the guides 134. As illustrated and discussed further below, a thickness which is greater than the height of the guides 134 may be used to provide a copolymer reservoir. In other embodiments, a thickness which is equal to, or less than the height of the guides 134 may be used to form isolated islands of copolymers between the guides 134, thereby preventing cross-diffusion of copolymers between the islands.

While the invention is not bound by theory, it will be appreciated that the different block species are understood to self-aggregate due to thermodynamic considerations in a process similar to the phase separation of materials. The self-organization is guided by the guides 134, which encourage the constituent blocks of the block copolymers to orient themselves along the length of the guides 134 due to interfacial interactions. It will be appreciated that the self-organization may result in a more efficient packing of the copolymer species. As a result, in some cases, the free copolymers available for the self-organization may be depleted if the copolymer film 160 extends over too large of an expanse, causing an area in the middle of the expanse to be formed without organized copolymers or with poorly organized copolymers. Thus, in some embodiments, the copolymer film 160 is sufficiently thick to extend above the guides 134 to provide a reservoir of copolymers for the self-organization which occurs between the guides 134. In addition, the distance between the guides 134 may be chosen to be sufficiently small to minimize the depletion effect that may occur over large expanses.

Figure 7:
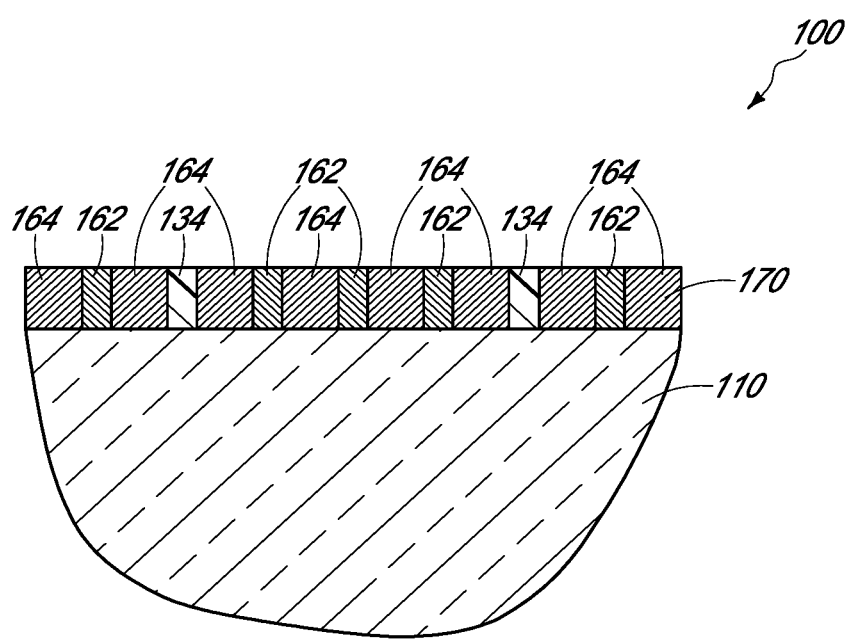
FIG. 7 is a schematic, cross-sectional side view of the structure of FIG. 6 after self-assembly of the self-organizing material, in accordance with some embodiments of the invention.

With reference to FIG. 7, the block copolymers in the copolymer film 160 are allowed to self-organize. The self-organization may be facilitated and accelerated by annealing the partially-fabricated integrated circuit 100. The temperature of the anneal may be chosen to be sufficiently low to prevent adversely affecting the block copolymers or the partially fabricated integrated circuit 100. The anneal may be performed at a temperature of less than about 250° C., less than about 200° C. or about 180° C. in some embodiments. The anneal may also be used to cause cross-linking of the copolymers, thereby stabilizing the copolymers for later etching and pattern transfer steps.

A pattern of lamellae resulting after the anneal is shown in FIG. 7. Domains 162 of one block species, e.g., PS, and domains 164 of the other block species, e.g., PMMA, alternate between the guides 134. It will be appreciated that the sizes of the block domains are determined by the sizes of the block species forming them.

With reference to FIG. 8, a top-down view of the partially fabricated integrated circuit of FIG. 7 is shown. The PS domains 162 can be seen alternating with the PMMA domains 164. Both domains 162 and 164 extend along the length of the guides 134.

Figure 9:
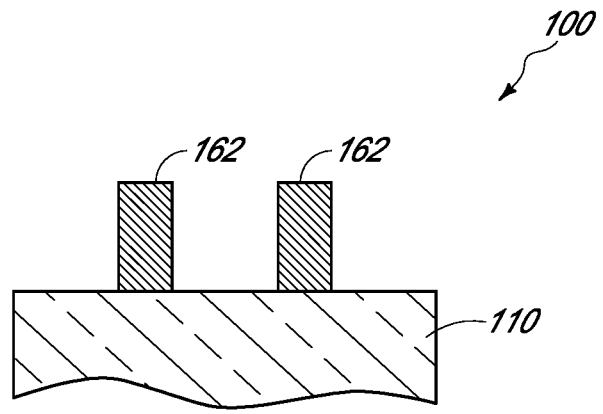
FIG. 9 is a schematic, cross-sectional side view of the structure of FIG. 7 after selectively removing some domains of self-organizing material to form mandrels, in accordance with some embodiments of the invention.

With reference to FIG. 9, the domains 164 are selectively removed, leaving behind the domain 162 and the guides 134 (not shown), which can function as mandrels for pitch multiplication. It will be appreciated that the domains 164 may be removed in a single step using a single etch chemistry or may be removed using multiple etches with different etch chemistries. For example, where the domains 164 are formed of PMMA and the domains 162 are formed of PS, the domains 164 may be removed by performing a selective wet etch, e.g., using acetic acid as an etchant. In other embodiments, a dry or anisotropic etch may be appropriate where one of the domains may be etched at a faster rate than the other. It will be appreciated that the dimensions of the resulting features may vary, depending on the size of the copolymer used and process conditions. In some embodiments, the resulting pattern may comprise PS domains having a critical dimension of about 50 nm to about 2 nm, about 35 nm or less to about 3 nm, with a pitch of about 100 nm to about 4 nm, or about 70 nm to about 6 nm. It will be appreciated that in other embodiments, the domains 162 and/or the guides 134 may be removed instead, thereby leaving the domains 164, with or without the guides 134.

Figure 10:
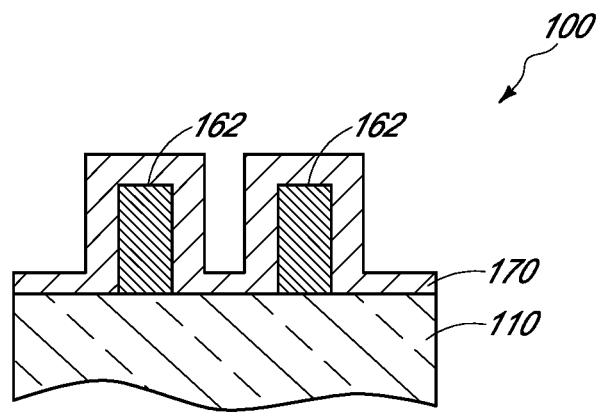
FIG. 10 is a schematic, cross-sectional side view of the structure of FIG. 9 after depositing a layer of a spacer material, in accordance with some embodiments of the invention.

Next, with reference to FIG. 10, a layer 170 of spacer material is blanket deposited conformally over exposed surfaces, including the substrate 110. The spacer material may be any material that may act as a mask for transferring a pattern to an underlying material. The spacer material: 1) may be deposited with good step coverage; 2) may be deposited at a temperature compatible with the mandrels 162; and 3) may be selectively etched relative to the mandrels 162 and guides 134, if present, and the underlying substrate 110. The spacer material may be, without limitation, an inorganic material, such as a silicon-containing material, or an organic material, such as a polymer. The silicon-containing spacer materials may be, without limitation, silicon, silicon oxide and silicon nitride. In the illustrated embodiment, the spacer material is silicon oxide.

Methods for spacer material deposition include atomic layer deposition, e.g., using a self-limiting deposition with a silicon precursor and a subsequent exposure to an oxygen or nitrogen precursor to form silicon oxides and nitrides, respectively. ALD may be performed at relatively low temperatures, e.g., under about 200° C. or under about 100° C., which may prevent thermal damage to underlying thermally sensitive materials. For example, ALD may be used to prevent damage to the polymer material forming the block domains 162. In other embodiments, chemical vapor deposition is used to deposit the spacer material.

The thickness of the layer 170 is determined based upon the desired width of the spacers 175 (FIG. 12). For example, in some embodiments, the layer 170 is deposited to a thickness of about 10-80 nm or about 20-50 nm to form spacers of roughly similar widths. The step coverage is about 80% or greater and or about 90% or greater.

Figure 11:
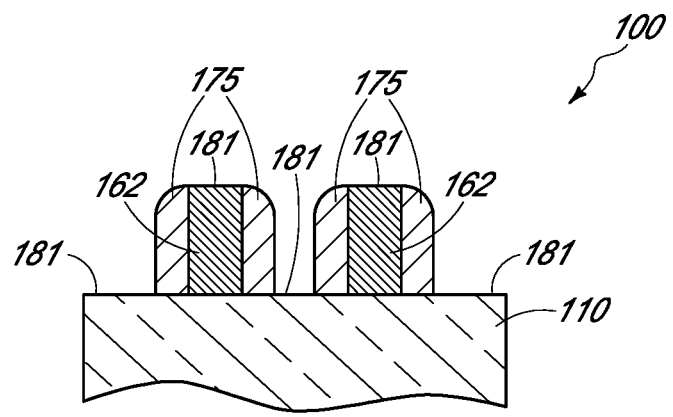
FIG. 11 is a schematic, cross-sectional side view of the structure of FIG. 10 after a spacer etch, in accordance with some embodiments of the invention.

With reference to FIGS. 11, the silicon oxide spacer layer 170 is then subjected to an anisotropic etch to remove spacer material from horizontal surfaces 181 of the partially formed integrated circuit 100. Such an etch, also known as a spacer etch, may be performed using a fluorocarbon plasma, e.g., a $CF_4$, $CHF_3$ and/or $NF_3$ containing plasma.

With reference to FIG. 12, the block domains 162 and any remaining guides 134 are removed to leave freestanding spacers 175. The block domains 162 and guides 134 may be removed by wet or dry etches that selectively remove those features relative to the spacers 175. The etches may also selectively remove the block domains 162 and guides 134 relative to the underlying substrate 110. Depending upon the material forming the block domains 162 and the guides 134, the same or different etch chemistries may be applied. Etch chemistries include, without limitation, a $O_2$-based carbon trip etch to remove the PS block domains 162 and a phosphoric acid based wet etch to remove the silicon nitride guides 134.

Thus, pitch-multiplied mask features have been formed. In the illustrated embodiment, the pitch of the spacers 175 is roughly half that of the block domains 162 (FIG. 9) formed by the block copolymers. For example, where the block domains 162 had a pitch of about 200 nm, spacers 175 having a pitch of about 100 nm or less may be formed and where the block domains 162 had a pitch of about 60 nm or less, spacers 175 having a pitch of about 30 nm or less may be formed. It will be appreciated that because the spacers 175 are formed on the sidewalls of the block domains 162, the spacers 175 generally follow the outline of the block domains 162 and, so, typically form a closed loop. The spacers 175 form a first pattern 177. It will be appreciated that higher orders of pitch multiplication can be achieved in some embodiments by using the spacers 175 as mandrels to form other spacers or mask features.

Figure 13:
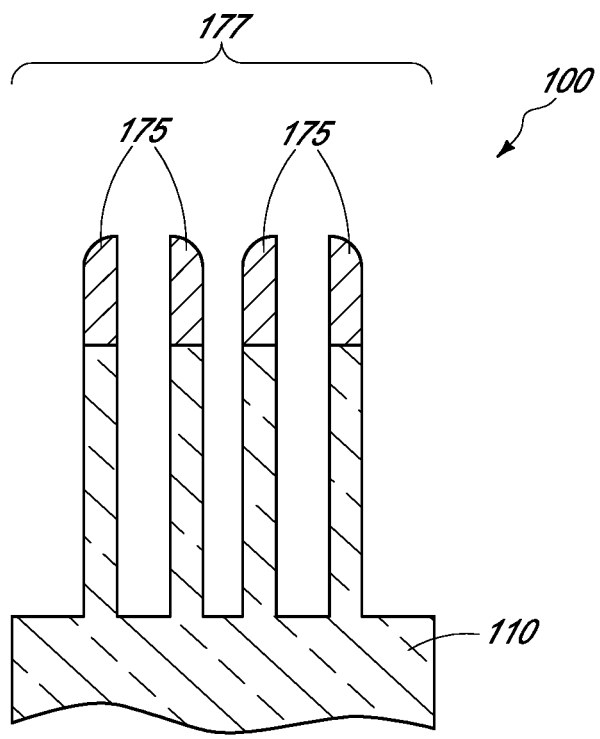
FIG. 13 is a schematic, cross-sectional side view of the structure of FIG. 12 after transferring a pattern formed by the freestanding spacers to an underlying substrate, in accordance with some embodiments of the invention.

With reference to FIG. 13, the pattern 177 is transferred to the substrate 110. The pattern transfer may be accomplished using etch chemistries appropriate for selectively etching the material or materials of the substrate 110 relative to the spacers 175. The skilled artisan can readily determine suitable etch chemistries for substrate materials. It will be appreciated that where the substrate 110 comprises layers of different materials, a succession of different chemistries, e.g., dry-etch chemistries, may be used to successively etch through these different layers, if a single chemistry is not sufficient to etch all the different materials. It will also be appreciated that, depending upon the chemistry or chemistries used, the spacers 175 may be etched. In the illustrated embodiment, the spacers 175 are sufficiently tall to complete the etch of the substrate 110 without being completely worn away.

Figure 14:
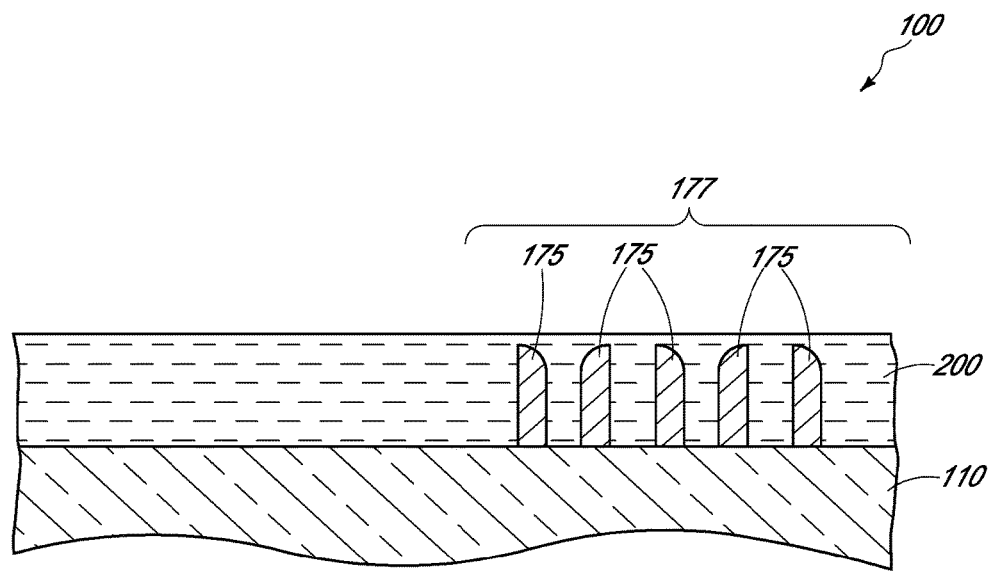
FIG. 14 is a schematic, cross-sectional side view of the structure of FIG. 12 after depositing a planarizing layer over the spacers, in accordance with some embodiments of the invention.
Figure 15:
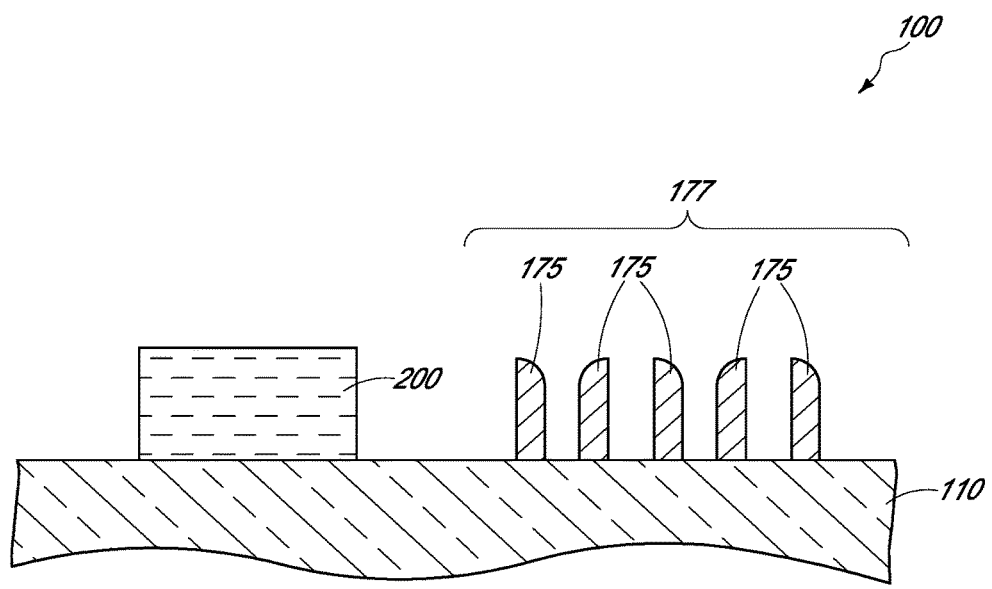
FIG. 15 is a schematic, cross-sectional side view of the structure of FIG. 14 after patterning the planarizing layer, in accordance with some embodiments of the invention.

With reference to FIG. 14, the mask overlying the substrate 110, including the domain 162 and the guides 134, are stripped, leaving the patterned substrate 110. After the pattern transfer, the partially fabricated integrated circuit 100 is subjected to subsequent processing steps, including forming ancillary electrical devices and electrical interconnects, to form a completed integrated circuit, e.g., a memory chip.

It will be appreciated that various modifications of the illustrated embodiments are possible. For example, while discussed in the context of diblock copolymers for ease of illustration and discussion, the copolymers may alternatively be formed of two or more block species. In addition, while the block species of the illustrated embodiment are each formed of a different monomer, the block species may share monomer(s). For example, the block species may be formed of different sets of monomers, some of which are the same, or may be formed of the same monomer, but in a different distribution in each block. The different sets of monomers form blocks having different properties which may drive the self-assembly of the copolymers.

Figure 16:
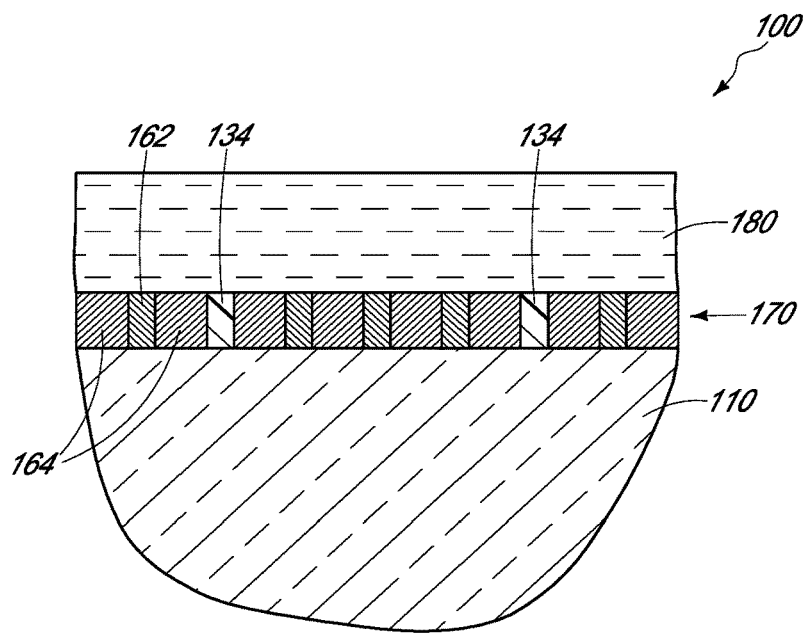
FIG. 16 is a schematic, cross-sectional side view of the partially formed integrated circuit of FIG. 7 after depositing an additional layer of block copolymer, in accordance with an alternative embodiment of the invention.

Referring to FIGS. 16-20, an alternative embodiment of processing (subsequent to the processing depicted in FIG. 7) is shown. Referring initially to FIG. 16, block domains 162, 164 and guides 134 can be utilized as a seed layer. A supplemental layer 180 of self-organizing material may be deposited over the block domains 162 and 164 and guides 134 f FIG. 7, to vertically extend the pattern defined by those block domains and the guides 134. The self-organizing material forming the supplement layer 180 may be a copolymer, such as a block copolymer. The material forming the supplemental layer 180 is chosen to interact with the block domains 162 and 164 and guides 134 such that the domains 162, 164 and the guides 134 are able to direct the organization of the self-organizing material. For example, where the block domains 162 and 164 and guides 134 include polar and non-polar block species, the layer 180 may also have polar and non-polar block species. In some embodiments, supplemental block copolymers forming the layer 180 are the same as the block copolymers of the film 160. A method for vertically extending a pattern formed of self-organizing material is disclosed in U.S. Pat. No. 7,723 009 (incorporated by reference).

The self-organizing material forming the supplement layer 180 is preferably a copolymer, more preferably a block copolymer. The material forming the supplemental layer 180 is chosen to interact with the seed layer 170 such that the domains 162, 164 and the guides 134 of the seed layer 170 are able to direct the organization of chemical species forming the material. For example, where the seed layer 170 includes polar and non-polar block species, the layer can also have polar and non-polar block species, In some embodiments, supplemental block copolymers forming the layer 180 are the same as the block copolymers of the film 160 (FIG. 6), although in other embodiments the block copolymers can be different but have chemical moieties that allow them to interact predictably with one another. Where the block species are the same, the supplemental copolymers can have the same length or different lengths from the copolymers of the film 160, although the lengths and the concentration or volume fraction of the supplemental copolymers in the supplemental layer 180 are preferably chosen to facilitate extending the pattern of the seed layer 170 into the supplemental layer 180. In addition, it will be appreciated that the supplemental layer 180 is preferably deposited to a height sufficient to form a copolymer mask with a desired height for etching underlying materials. The supplemental layer 180 can have a thickness greater than the intrinsic length scale of the copolymers forming it. Preferably, the supplemental layer 180 can have a height of about 10 nm to about 50 nm and, more preferably, about 10 nm to about 200 nm.

Figure 17:
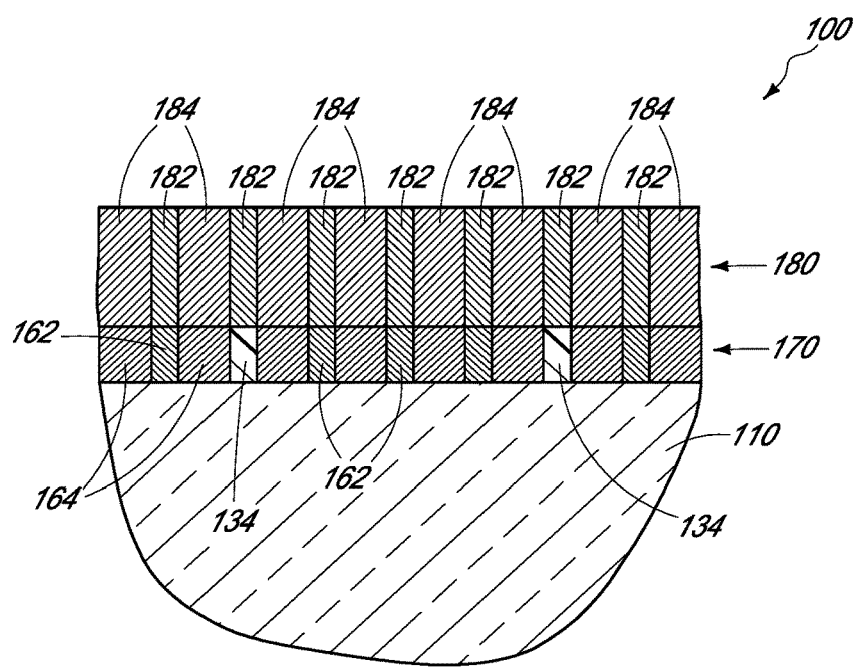
FIG. 17 is a schematic, cross-sectional side view of the partially formed integrated circuit of FIG. 16 after self-organization of the block copolymer in the additional layer of block copolymer, in accordance with the alternative embodiment of the invention.

With reference to FIG. 17, interactions between the supplemental copolymers of the supplemental layer 180 and the domains 162, 164 and the guides 134 cause the supplemental copolymers to organize into domains 182, 184. In some embodiments, this self-organization can be accelerated by subjecting the supplemental layer 180 to an anneal such as that discussed above for the film 160 (FIG. 6). The anneal can advantageously cause cross-linking of the copolymers, thereby helping to stabilize the copolymer blocks, especially during later selective block removal steps.

With continued reference to FIG. 17, the domains 182, 184 advantageously align to form the same pattern as the domains 162, 164, as viewed from a top down view. Thus, the pattern formed by the domains 162, 164 may be said to be transferred to the supplemental layer 180 and effectively vertically extending the domains 162,164. Preferably, the domains 162, 164 are organized in a substantially regular pattern and the domains 182, 184 are also organized in a substantially regular pattern.

Advantageously, the supplemental copolymers can repair defects in the pattern formed in the seed layer 170. For example, the seed layer 170 may include domains 162, 164 which define features, such as lines, which have very rough edges or non-uniformities in critical dimensions. Initially, certain chemical moieties or blocks of the supplemental copolymers will align themselves with particular block domains 162, 164 of the seed layer 170, which contain other chemical moieties which interact favorably with the blocks of the supplemental copolymers, e.g., to encourage wetting of particular domains with particular blocks in the supplemental copolymers. As the number of organized supplemental copolymers grows and the heights of the organized supplemental copolymer domains 182, 184 increase, however, the supplemental copolymers and process conditions may be selected such that interactions between the supplemental copolymers dominate. Advantageously, because the interactions between the blocks of the supplemental copolymers can be relatively homogeneous across the supplemental layer 180, the dominance of the interactions between the blocks can cause the blocks to self-segregate and form domains 182, 184 which are more regular and better defined than the domains 162, 164 in the copolymer template. Thus, the domains 182, 184 in the supplemental layer 180 can have greater uniformity in pitch and critical dimension than the domains 162, 164 of the seed layer 170.

In addition, the supplemental copolymers can also advantageously level out non-uniformities in thickness in the seed layer 170. For example, a relatively thick layer 180 of deposited supplemental copolymers may be less prone to form localized regions of different thicknesses than the seed layer 170, which can have thickness variations caused by interfacial interactions with an underlying surface, or by depletion of the copolymers in the copolymer template before all block domains are fully formed. As a result, because the supplemental copolymers can form domains up to a height proportional to the height of the supplemental copolymer layer, the final mask formed by the supplemental copolymers can advantageously have a more uniform thickness and, thus, greater uniformity in height.

Figure 18:
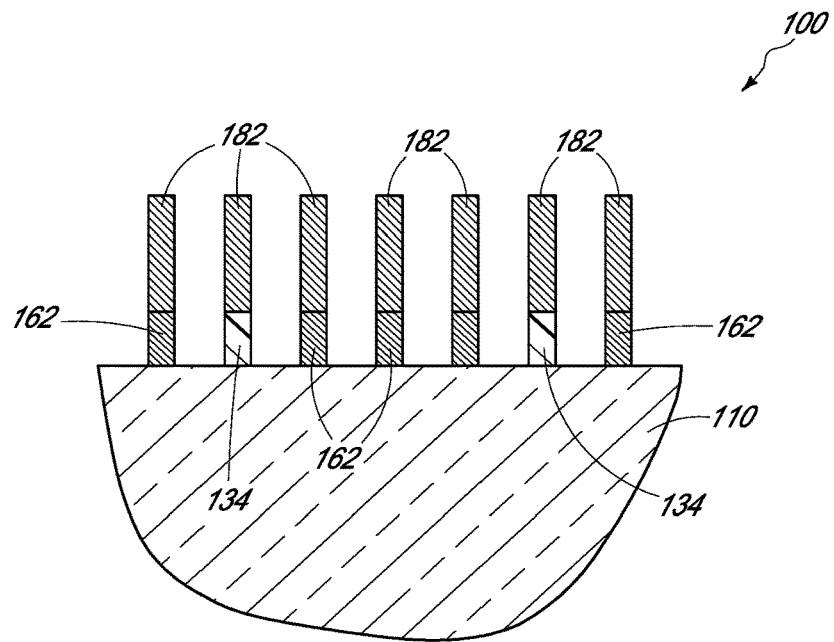
FIG. 18 is a schematic, cross-sectional side view of the partially formed integrated circuit of FIG. 17 after selectively removing a block copolymer species in the additional layer of block copolymer in accordance with the alternative embodiment of the invention.

With reference to FIG. 18, the domains 184, 164 are selectively removed, leaving behind the domains 182, 162 and the guides 134. It will be appreciated that the domains 184, 164 can be removed in a single step using a single etch chemistry or can be removed using multiple etches with different etch chemistries. For example, where the domains 184, 164 are both formed of PMMA and the domains 182, 162 are formed of PS, the domains 184, 164 can be removed by performing a selective wet etch, e.g., using acetic acid as an etchant. In other embodiments, a dry or anisotropic etch may be appropriate where one of the domains can be etched at a faster rate than the other. It will be appreciated that the dimensions of the resulting features can vary, depending on the size of the copolymer used and process conditions. In some embodiments, the resulting pattern can advantageously comprise PS domains having a critical dimension of about 50 nm to about 2 nm, more preferably, about 35 nm or less to about 3 nm, with a pitch of about 100 nm to about 4 nm and, more preferably, about 70 nm to about 6 nm. For example, the PS domains can have a critical dimension of about 35 nm, with a pitch of about 70 nm. It will be appreciated that in other embodiments, the domains 162 and/or the guides 134 can be removed instead, thereby leaving the domains 184, 164, with or without the guides 134.

Figure 19:
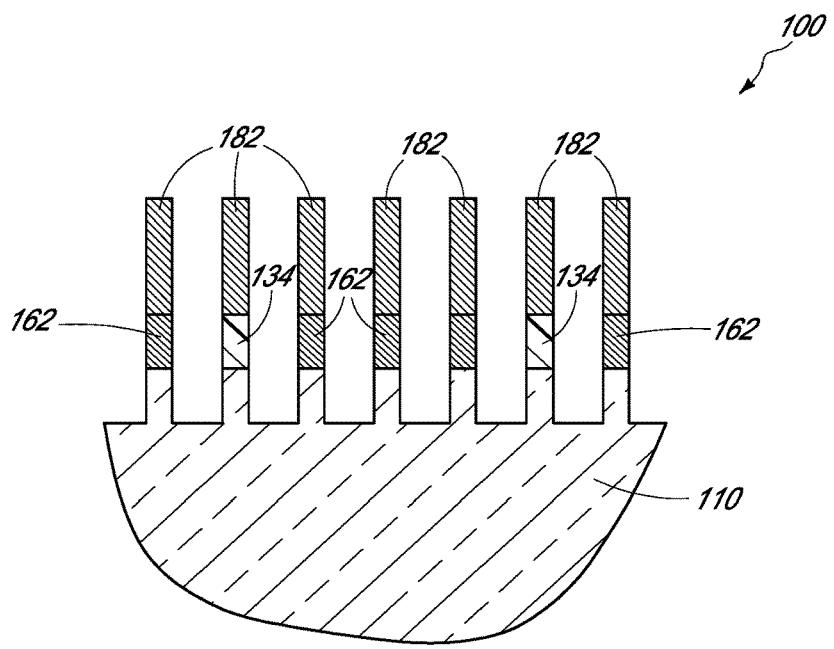
FIG. 19 is a schematic, cross-sectional side view of the partially formed integrated circuit of FIG. 18 after transferring the pattern defined by the block copolymer into the underlying substrate in accordance with the alternative embodiment of the invention.

With reference to FIG. 19, the domains 182, 162 and the guides 134 can be used as a mask for processing of the underlying substrate 110. For example, as illustrated, the substrate 110 can be etched through the mask using, e.g., an anisotropic etch that selectively etches the substrate relative to the domains 182 to transfer the pattern in the mask to the substrate 110. In one example, where the substrate 110 is formed of silicon, it can be selectively etched relative to the block domains 182 using a fluorine-based dry etch chemistry, e.g., such as that used to selectively remove silicon layers relative to photoresist. It will be appreciated that where the substrate 110 comprises layers of different materials, a succession of different chemistries, preferably dry-etch chemistries, can be used to successively etch through these different layers, if a single chemistry is not sufficient to etch all the different materials.

It will also be appreciated that, depending upon the chemistry or chemistries used, the domains 182, 162 and the guides 134 may be partially etched or worn during the transfer process. Advantageously, the domains 182 are sufficiently tall to allow etching or other processing of the substrate 110 to be completed before the domains 182 and/or 162 are completely etched away. Consequently, the tall domains 182 can facilitate etching of more difficult to etch substrates.

Figure 20:
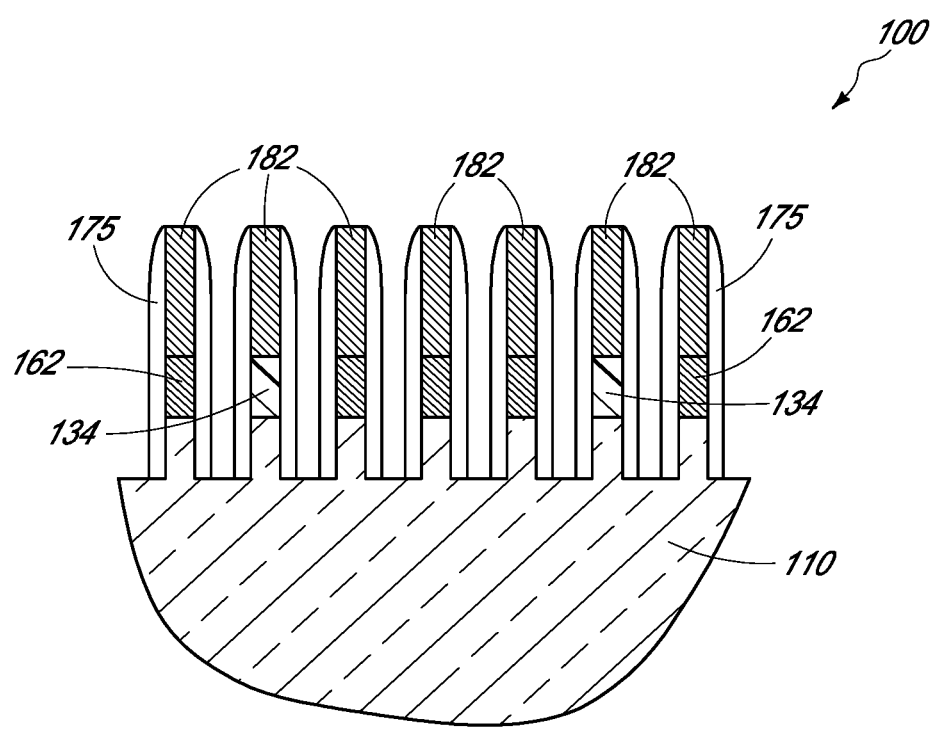
FIG. 20 is a schematic, cross-sectional side view of the partially formed integrated circuit of FIG. 19 after formation of spacers in accordance with the alternative embodiment of the invention.

Referring to FIG. 20, sidewall spacers 175 can be formed along the sidewall edges of the extended mandrels as discussed above with reference to FIGS. 9-11. Additional processing of substrate 110 of FIG. 20 can be performed in a manner analogous to methodology described above with reference to FIGS. 12-15.

It will be appreciated that, before or after transferring the mask pattern 177 to the substrate 110, additional mask patterns can be overlaid the mask pattern 177 (FIG. 11). For example, referring again to FIG. 14, a planarizing material 200 can be deposited between and over the spacers 175 and the planarizing material can be patterned to form an additional pattern. The additional pattern, forming a combined pattern with the mask pattern 177, can be transferred to the underlying substrate 110. Planarizing material 200 can be photoresist, such as negative or positive photoresist which can be patterned by exposure to radiation to form the additional pattern depicted in FIG. 15. Negative photoresist can be used in embodiments in which the features of the mask pattern 177 are very closely spaced, e.g., having a pitch of about 40 nm or less. It has been found that positive photoresist can be difficult to remove between spacers with such small pitches, due to difficulties in completely exposing the photoresist to light. On the other hand increasing the light intensity may undesirably cause polymerization of the photoresist, due to optical amplification by some transparent spacer materials, such as silicon oxide. Negative photoresist does not need to be exposed to light for removal, thereby facilitating the removal of photoresist between spacers and the formation of clean patterns in combination with the mask pattern 177.

In some embodiments, the hard mask layer 130 overlying the substrate may be omitted. For example, the photodefinable material may be formed of or replaced by a material which is compatible with the temperatures and other conditions for copolymer self-organization and/or the spacers 175 may be used as a mask for etching the substrate 110 where an etch having sufficient selectivity for the substrate 110 is available.

In some other embodiments, additional masking levels may be provided over the substrate 110. For example, additional hard mask layers can be provided between the spacers 175 and the substrate 110. The pattern 177 may be transferred to one or more additional hard mask layers before being transferred to the substrate 110. The additional hard mask layers may be selected to provide higher resistance to etches used for etching the substrate. For example, the pattern 177 may be transferred to an amorphous carbon layer before being transferred to the substrate 110. Amorphous carbon has been found to be suitable as a hard mask for etching a variety of silicon-containing materials.

Also, while "processing" through a mask layer may encompass etching an underlying layer, processing through the mask layers may involve subjecting layers underlying the mask layers to any semiconductor fabrication process. For example, processing may involve ion implantation, diffusion doping, depositing, oxidizing (particularly with use of a hard mask under the polymer mask), nitridizing, etc. through the mask layers and onto underlying layers. In addition, the mask layers may be used as a stop or barrier for chemical mechanical polishing (CMP) or CMP may be performed on any of the layers to allow for both planarization and etching of the underlying layers, as discussed in U.S. patent application Ser. No. 11/216,477, filed Aug. 31, 2005, the entire disclosure of which is incorporated by reference herein.

In addition, while the illustrated embodiments may be applied to fabricate integrated circuits, embodiments of the invention may be applied in various other applications where the formation of patterns with very small features is desired. For example, embodiments of the invention may be applied to form gratings, disk drives, storage media or templates or masks for other lithography techniques, including X-ray or imprint lithography. For example, phase shift photomasks may be formed by patterning a substrate that has a film stack having phase shifting material coatings.

Consequently, it will be appreciated from the description herein that the invention includes various embodiments. For example, according to some embodiments of the invention, a method for patterning a semiconductor substrate is provided. The method comprises providing a layer comprising block copolymers. One block of the block copolymers is selectively removed to leave laterally separated mandrels comprising an other block of the block copolymers. Spacer material is blanket depositing on the mandrels. The spacer material is etched to form spacers on sidewalls of the mandrels. A pattern defined by the spacers is transferred to the substrate.

According to other embodiments the invention, a method for forming a mask for patterning a substrate is provided. The method comprises providing a layer of a self-organizing material. Like chemical species of the self-organizing material are aggregated to form a repeating pattern having domains defined by the chemical species. One of the chemical species is preferentially removed to form spaced apart mandrels Spacers are formed on sidewalls of the mandrels.

According to yet other embodiments of the invention, a method for integrated circuit fabrication is provided. The method comprises exposing a block copolymer layer to a wet etch to define free-standing, regularly-spaced, spaced-apart placeholders in the block copolymer layer. Spacers are formed on sidewalls of the placeholders. A pattern derived from the spacers is transferred to an underlying substrate.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. A mask structure, comprising:
a first hardmask feature and a second hardmask feature extending lengthwise along a first direction over a surface of a substrate;
a first line between the first hardmask feature and the second hardmask feature, a second line disposed on a side of the first hardmask feature opposing the first line and a third line disposed on a side of the second hardmask feature opposing the first line, each of the first, second and third lines extending lengthwise along the first direction and comprising a first self-organized block copolymer material, each of the first line, the second line, the third line, the first hardmask feature and the second hardmask feature extending to equivalent elevations above the surface of the substrate;
extension material over the first hardmask feature, second hardmask feature and each of the first, second and third lines, the extension material comprising a second self-organized block copolymer material, the hardmask features and overlying extension material being patterned into first mandrels; the first, second and third lines and the overlying extension material being patterned into second mandrels;
etched sidewall spacers disposed on opposing sidewalls of each of the first and second mandrels, the etched sidewall spacers contacting the first self-organized block copolymer material and the extension material of the second mandrels and contacting the hardmask features and the extension material of the first mandrels; and
an open volume disposed between spacer material on opposing sidewalls of neighboring mandrels.

2. The mask structure of claim 1, wherein the first self-organized block copolymer material comprises polystyrene.

3. The mask structure of claim 1, wherein the first self-organized block copolymer material comprises polymethylmethacrylate.

4. The mask structure of claim 1, wherein the first self-organized block copolymer material comprises cross-linked monomers.

5. The mask structure of claim 1, wherein the substrate comprises a conductor.

6. The mask structure of claim 5, wherein the conductor is a metal.

7. The mask structure of claim 1, wherein an intermediate masking layer is disposed between the spacer material and the substrate.

8. The mask structure of claim 7 wherein the intermediate masking layer is an amorphous carbon layer.

9. The mask structure of claim 1, wherein the substrate is a partially-formed integrated circuit.

10. The mask structure of claim 1, wherein the substrate is a partially-formed grating structure.

11. The mask structure of claim 1, wherein the substrate is a partially-formed disk drive device.

12. The mask structure of claim 1, wherein the substrate is a partially-formed imprint reticle.

* * * * *